United States Patent
Lu et al.

(10) Patent No.: US 12,506,066 B2
(45) Date of Patent: Dec. 23, 2025

(54) FIELD EFFECT TRANSISTOR WITH SOURCE/DRAIN VIA AND METHOD

(71) Applicant: Taiwan Semiconductor Manufacturing Co., Ltd., Hsinchu (TW)

(72) Inventors: Min-Hsuan Lu, Hsinchu (TW); Lin-Yu Huang, Hsinchu (TW); Li-Zhen Yu, Hsinchu (TW); Sheng-Tsung Wang, Hsinchu (TW); Chung-Liang Cheng, Hsinchu (TW); Huan-Chieh Su, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 618 days.

(21) Appl. No.: 17/890,194

(22) Filed: Aug. 17, 2022

(65) Prior Publication Data

US 2023/0343699 A1    Oct. 26, 2023

Related U.S. Application Data

(60) Provisional application No. 63/335,147, filed on Apr. 26, 2022.

(51) Int. Cl.
*H01L 23/522* (2006.01)
*H01L 23/528* (2006.01)
(Continued)

(52) U.S. Cl.
CPC ...... *H01L 23/5226* (2013.01); *H01L 23/5283* (2013.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01);
(Continued)

(58) Field of Classification Search
CPC ............ H01L 23/5226; H01L 23/5283; H10D 30/014; H10D 30/43
See application file for complete search history.

(56) References Cited

U.S. PATENT DOCUMENTS 10,170,374 B2 *  1/2019  Chen ................... H10D 30/6728
11,056,401 B2 *  7/2021  Chen ................... H10D 30/6728
(Continued)

FOREIGN PATENT DOCUMENTS

CN  113540087 A  * 10/2021  ........... H10D 84/834
CN  114914201 A  *  8/2022  ......... H01L 23/5386
(Continued)

*Primary Examiner* — Laura M Menz
(74) *Attorney, Agent, or Firm* — Seed Intellectual Property Law Group LLP

(57) ABSTRACT

A device includes a substrate, a vertical stack of nanostructure channels over the substrate, a gate structure wrapping around the nanostructure channels, and a source/drain region on the substrate. The device further includes a source/drain contact in contact with the source/drain region. The source/drain contact includes a core layer of a first material. A source/drain via is over and in contact with the source/drain contact. The source/drain via is the first material. A gate via is over and in electrical connection with the gate structure. The gate via is the first material.

20 Claims, 95 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 64/01* (2025.01)
*H10D 64/23* (2025.01)
*H10D 84/01* (2025.01)
*H10D 84/03* (2025.01)
*H10D 84/85* (2025.01)

(52) U.S. Cl.
CPC ........... *H10D 64/01* (2025.01); *H10D 64/258* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(56) References Cited

U.S. PATENT DOCUMENTS

| | | | | |
|---|---|---|---|---|
| 11,088,025 | B2* | 8/2021 | Hsieh | H10D 30/6219 |
| 11,189,705 | B2* | 11/2021 | Wong | H10D 64/679 |
| 11,355,410 | B2* | 6/2022 | Huang | H10D 64/017 |
| 11,631,736 | B2* | 4/2023 | Chu | H10D 84/0149 257/288 |
| 11,682,625 | B2* | 6/2023 | Lin | H10D 30/024 438/653 |
| 11,777,009 | B2* | 10/2023 | Diaz | H10D 30/025 257/329 |
| 11,830,769 | B2* | 11/2023 | Chang | H10D 30/62 |
| 11,848,372 | B2* | 12/2023 | Su | H10D 30/6713 |
| 11,935,781 | B2* | 3/2024 | Chang | H10D 84/83 |
| 11,942,390 | B2* | 3/2024 | Huang | H10D 64/017 |
| 11,948,973 | B2* | 4/2024 | Chiang | H10D 64/665 |
| 11,961,893 | B2* | 4/2024 | Hsiung | H01L 21/76883 |
| 12,094,930 | B2* | 9/2024 | Tu | H10D 30/43 |
| 12,166,071 | B2* | 12/2024 | Liu | B82Y 10/00 |
| 12,300,723 | B2* | 5/2025 | Cheng | H10D 30/43 |
| 2018/0277448 | A1* | 9/2018 | Chen | H10D 30/6735 |
| 2020/0286781 | A1* | 9/2020 | Hsieh | H10D 30/62 |
| 2020/0411415 | A1* | 12/2020 | Wu | H01L 21/76832 |
| 2021/0036122 | A1* | 2/2021 | Wong | H01L 21/764 |
| 2021/0327814 | A1* | 10/2021 | Lin | H01L 21/76805 |
| 2021/0335690 | A1* | 10/2021 | Huang | H10D 84/0193 |
| 2021/0376071 | A1* | 12/2021 | Liu | H10D 30/6757 |
| 2021/0376081 | A1* | 12/2021 | Chiang | H10D 64/01 |
| 2021/0391421 | A1* | 12/2021 | Chu | H10D 84/0149 |
| 2022/0037497 | A1* | 2/2022 | Chung | H10D 84/0158 |
| 2022/0093758 | A1* | 3/2022 | Chen | H10D 84/0186 |
| 2022/0190137 | A1* | 6/2022 | Wang | H10D 64/018 |
| 2022/0302268 | A1* | 9/2022 | Chiang | H10D 30/6735 |
| 2022/0310445 | A1* | 9/2022 | Lee | H10D 64/258 |
| 2022/0310472 | A1* | 9/2022 | Huang | H10D 30/024 |
| 2022/0320180 | A1* | 10/2022 | Liu | H10D 64/62 |
| 2022/0320313 | A1* | 10/2022 | Liaw | H10D 30/0217 |
| 2022/0336583 | A1* | 10/2022 | Tu | H10D 30/6757 |
| 2022/0344496 | A1* | 10/2022 | Su | H10D 62/116 |
| 2022/0352338 | A1* | 11/2022 | Hsiung | H01L 23/485 |
| 2022/0359265 | A1* | 11/2022 | Chang | H01L 23/485 |
| 2022/0359679 | A1* | 11/2022 | Lu | H10D 64/01 |
| 2022/0367243 | A1* | 11/2022 | Chang | H10D 84/038 |
| 2022/0384570 | A1* | 12/2022 | Liu | B82Y 10/00 |
| 2023/0006051 | A1* | 1/2023 | Pan | H10D 84/0151 |
| 2023/0013764 | A1* | 1/2023 | Chou | H10D 84/0149 |
| 2023/0052295 | A1* | 2/2023 | Liao | H10D 62/115 |
| 2023/0253450 | A1* | 8/2023 | Chu | H10D 84/834 257/288 |
| 2023/0343699 | A1* | 10/2023 | Lu | H10D 84/017 |
| 2023/0369055 | A1* | 11/2023 | Chou | H01L 21/76895 |
| 2023/0386971 | A1* | 11/2023 | Yu | H01L 23/485 |
| 2023/0387266 | A1* | 11/2023 | Su | H10D 30/62 |
| 2023/0402522 | A1* | 12/2023 | Yu | H10D 62/121 |
| 2024/0153874 | A1* | 5/2024 | Chen | H10B 10/125 |
| 2024/0194559 | A1* | 6/2024 | Huang | H01L 23/5226 |
| 2024/0222431 | A1* | 7/2024 | Lin | H10D 84/013 |
| 2024/0250123 | A1* | 7/2024 | Chiang | H01L 21/31111 |
| 2024/0250143 | A1* | 7/2024 | Hsiung | H10D 30/43 |
| 2024/0355907 | A1* | 10/2024 | Chen | H10D 84/83 |
| 2024/0379744 | A1* | 11/2024 | Liu | H10D 62/822 |
| 2024/0379781 | A1* | 11/2024 | Lu | H10D 64/01 |
| 2024/0387630 | A1* | 11/2024 | Tu | H10D 84/0149 |
| 2024/0395888 | A1* | 11/2024 | Pan | H10D 64/514 |
| 2025/0040183 | A1* | 1/2025 | Chang | H10D 64/256 |
| 2025/0089325 | A1* | 3/2025 | Hsu | H10D 62/151 |

FOREIGN PATENT DOCUMENTS

| | | | | |
|---|---|---|---|---|
| CN | 114975254 A | * | 8/2022 | ....... H01L 21/76883 |
| CN | 114975264 A | * | 8/2022 | ....... H01L 21/76897 |
| CN | 115064492 A | * | 9/2022 | ......... H01L 21/0259 |
| CN | 115223936 A | * | 10/2022 | .......... H10D 64/514 |
| CN | 115312515 A | * | 11/2022 | ........ H01L 23/5283 |
| CN | 116631947 A | * | 8/2023 | ........... H10D 84/834 |
| CN | 116779680 A | * | 9/2023 | |
| CN | 118366960 A | * | 7/2024 | ....... H10D 30/6757 |
| CN | 119421429 A | * | 2/2025 | ....... H01L 21/28518 |
| CN | 111987090 B | * | 3/2025 | ........... H10D 89/921 |
| DE | 102024100155 A1 | * | 12/2024 | ........... H10D 84/851 |
| DE | 102021116508 B4 | * | 4/2025 | ............. H10D 64/01 |
| EP | 4394863 A1 | * | 7/2024 | ............. H10D 84/83 |
| KR | 20210148861 A | * | 12/2021 | ........ H01L 23/5226 |
| KR | 102502371 B1 | * | 2/2023 | ........ H10D 30/6757 |
| TW | 202205391 A | | 2/2022 | |
| TW | 202308055 A | * | 2/2023 | ....... H01L 21/76897 |
| TW | 202310403 A | * | 3/2023 | ......... H01L 21/0259 |
| WO | WO-2024205982 A1 | * | 10/2024 | ........ H10D 84/0186 |

* cited by examiner

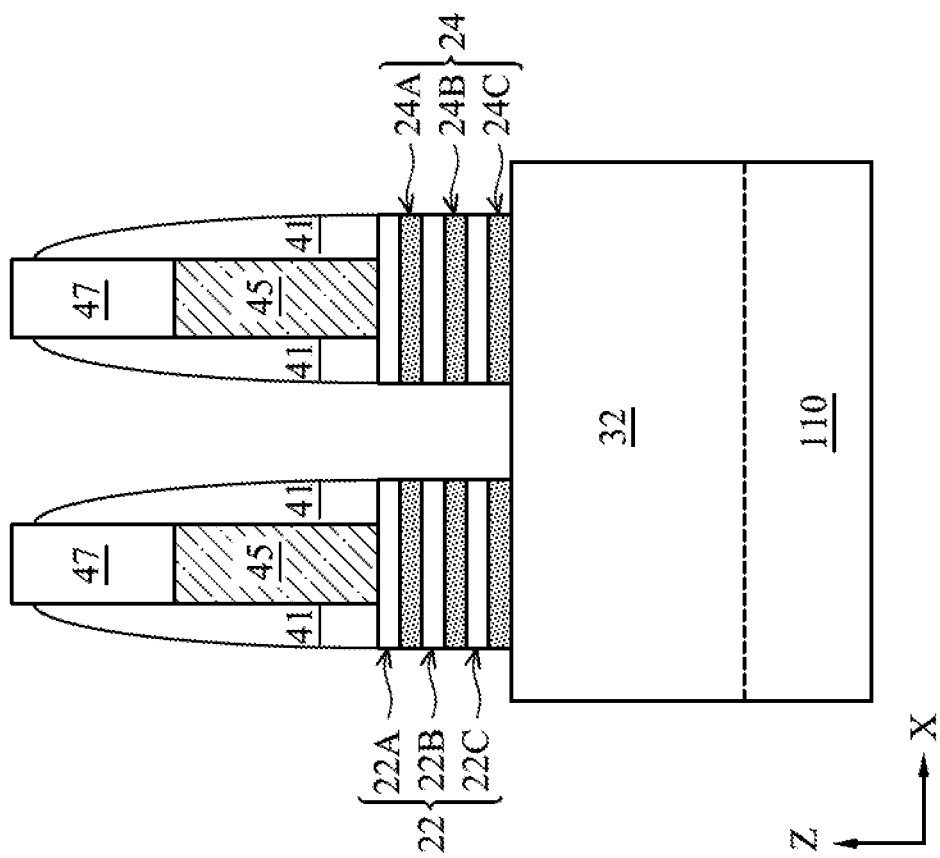
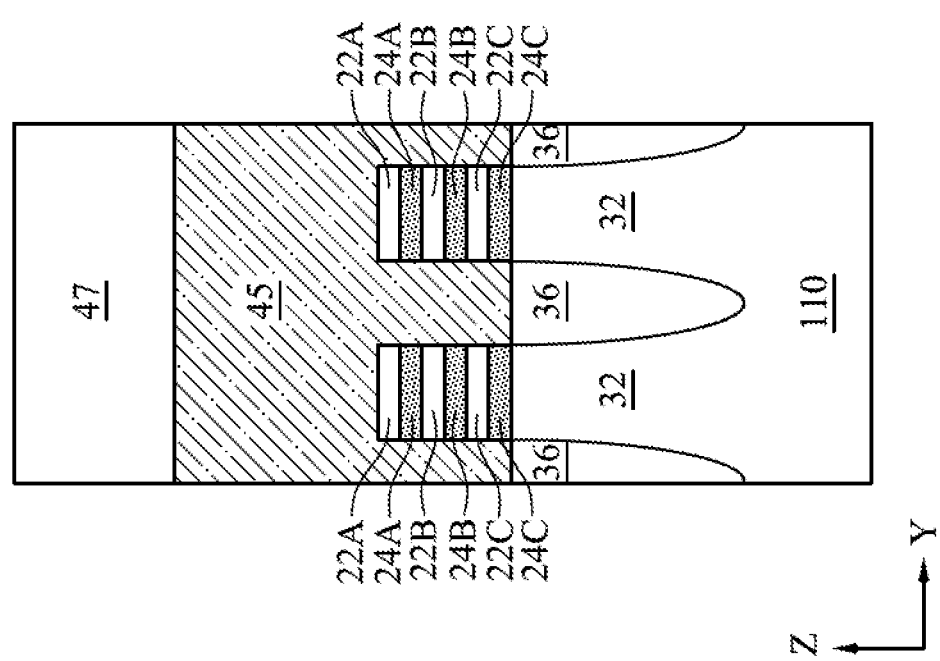

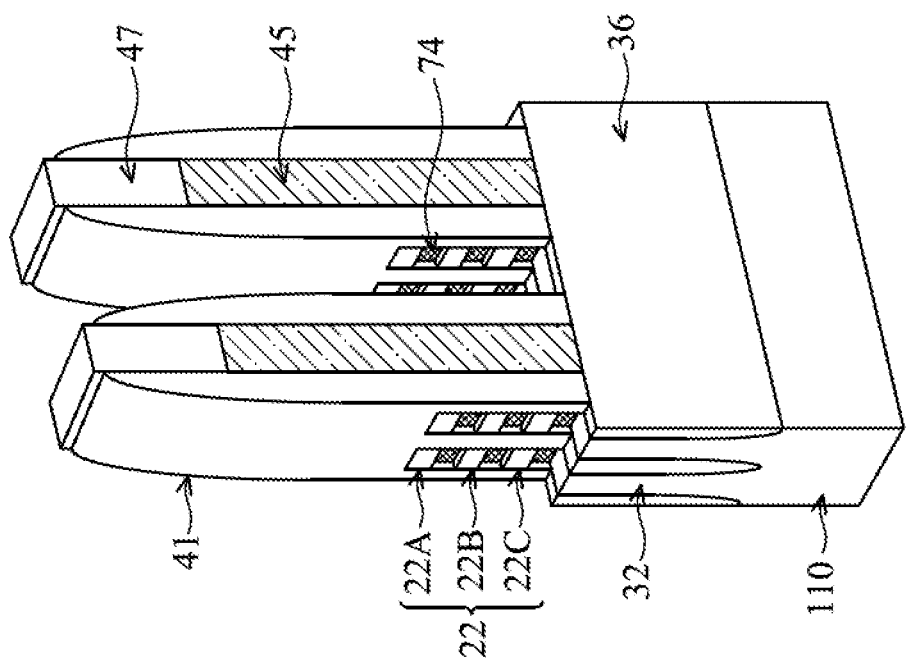
FIG. 7A
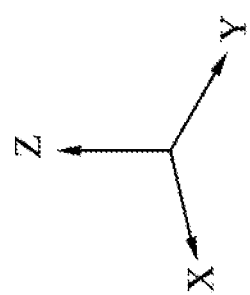

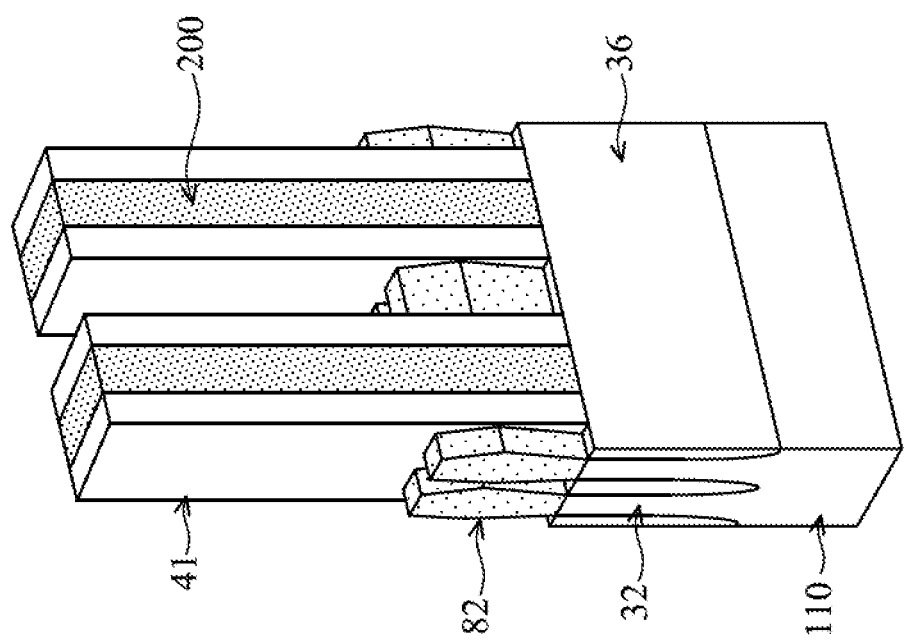
FIG. 10A
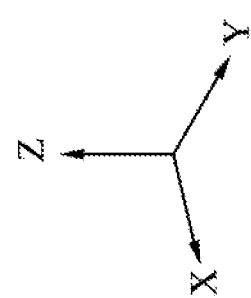

FIELD EFFECT TRANSISTOR WITH SOURCE/DRAIN VIA AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
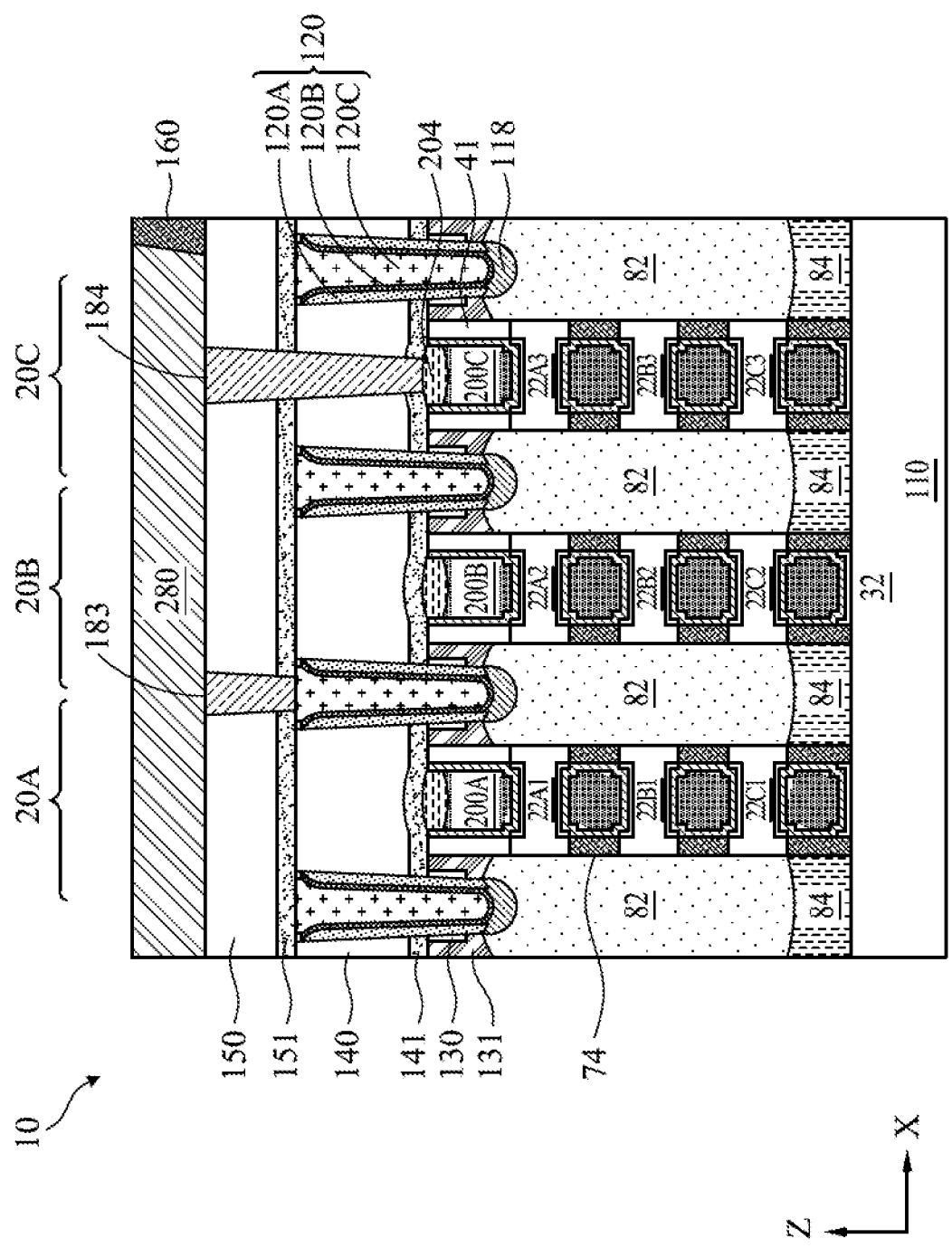
FIGS. 1A-1Q are diagrammatic cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. In advanced technology nodes, dimension scaling can lead to difficulties forming contacts and vias to the gate, source and drain electrodes of the FETs.

Different metals are frequently deposited at different process stages for forming contacts, vias and interconnects. However, use of many different tools and chambers may be beneficial to deposit different kinds of metal. Some bottom-up metal processes that deposit a single metal at the source/drain contact involves high cost and challenging processes to remove the sidewall metallic material. Interfaces of different metals invariably suffer greater resistance due to lattice constant mismatch, which causes additional grain boundary. The increased grain boundary causes electron scattering and induces greater contact resistance, reducing device performance.

For example, source/drain contacts may have relatively high aspect ratio, and therefore a bottom-up process may be beneficial to form the source/drain contacts, so that the formation of voids may be prevented. A metallic material (e.g., a silicide layer formed over a source/drain) may be formed at the bottom of the source/drain contact opening but not on sidewalls of the opening, so that the bottom-up material can be formed over the metallic material to fill the opening. As such, metallic material formed on sidewalls of the opening (e.g., the metal for forming the silicide layer) is removed before depositing the source/drain contact material, or the opening may be blocked by the source/drain contact material before the opening is completely filled. Removal of the metallic material on the sidewalls of the opening may be challenging, because incidental removal of the metallic material on the bottom surface of the opening degrades adhesion of the source/drain contact material at the bottom of the opening.

In embodiments of the disclosure, contact and via metals are selected to be the same, including one or more of source/drain contacts, gate vias, source/drain vias, bridge vias, common vias, and a first metal layer of an interconnect structure overlying the nanostructure devices. Challenging bottom-up or sidewall metallic material removal processes may be omitted, which simplifies processing. Center voids may be driven upwards to a free surface by grain growth after a post-deposition annealing process. It should be understood that, while embodiments of the disclosure generally describe formation of conductive features at the front end of line (FEOL), such as the source/drain contacts, source/drain vias and gate vias, the methods described and embodied herein may also be used to form middle-end-of-line (MEOL) conductive features, such as conductive vias for interconnecting metallization layers of an interconnect structure.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Figure 1B:
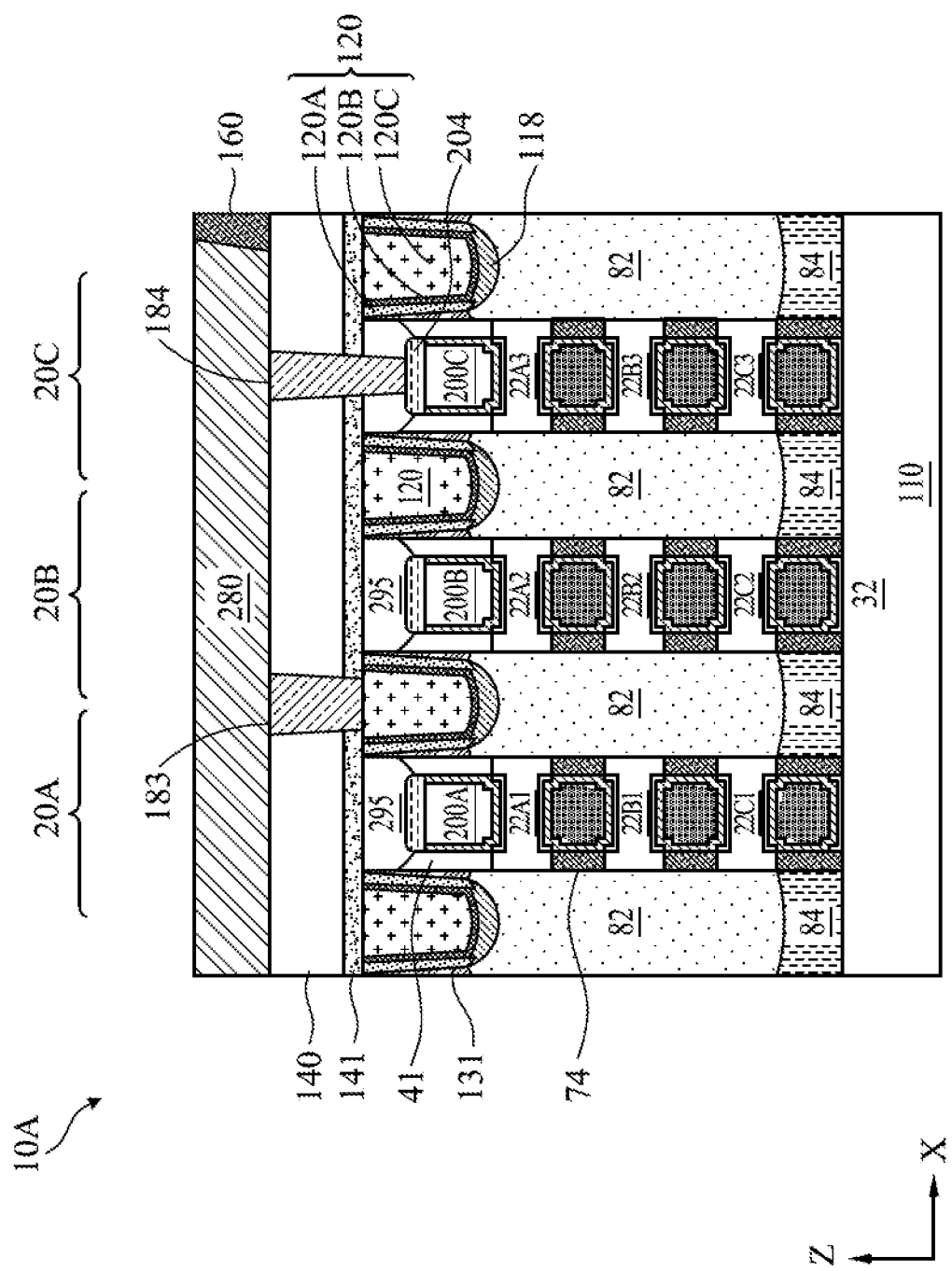
Figure 1C:
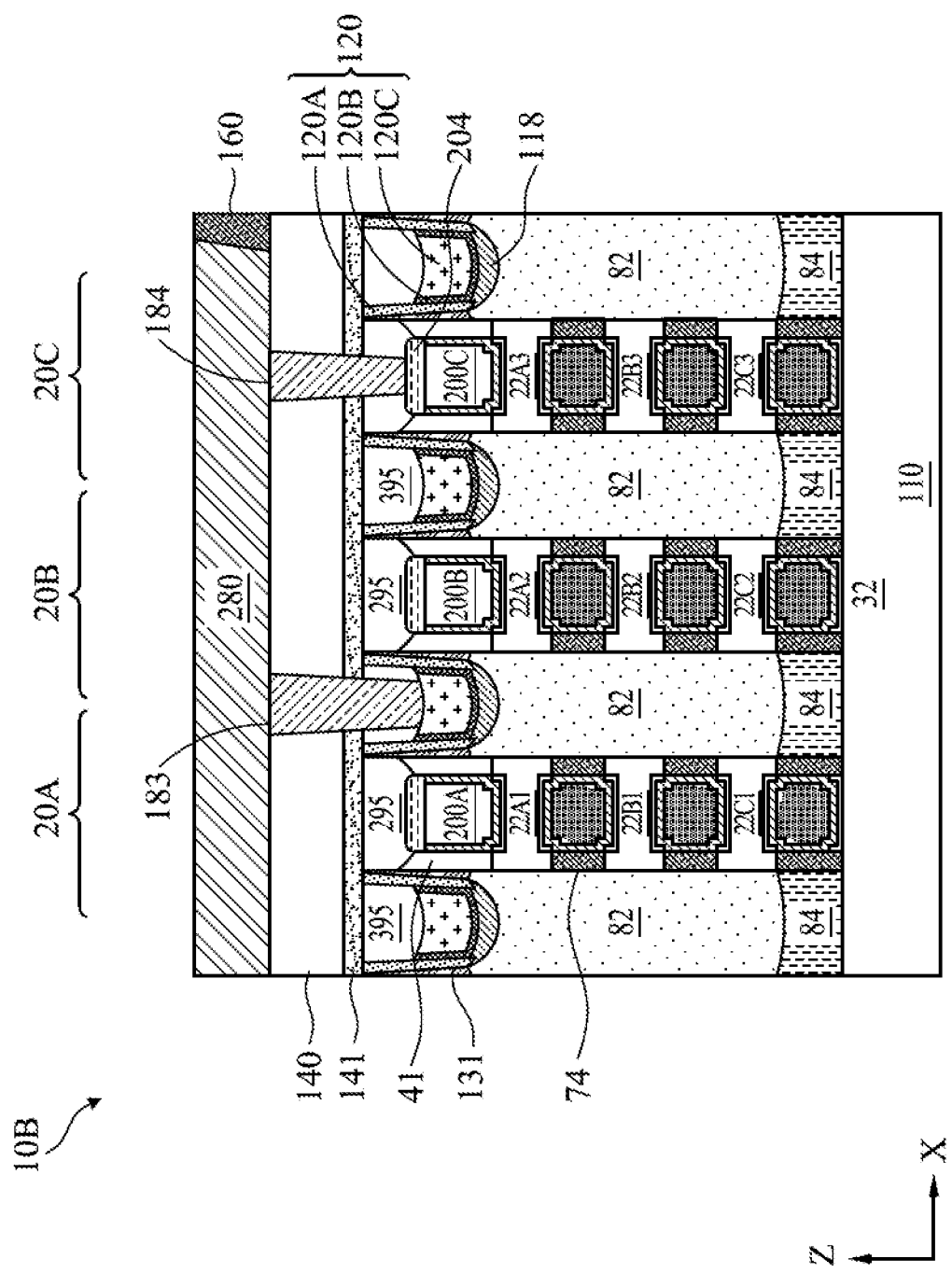
Figure 1D:
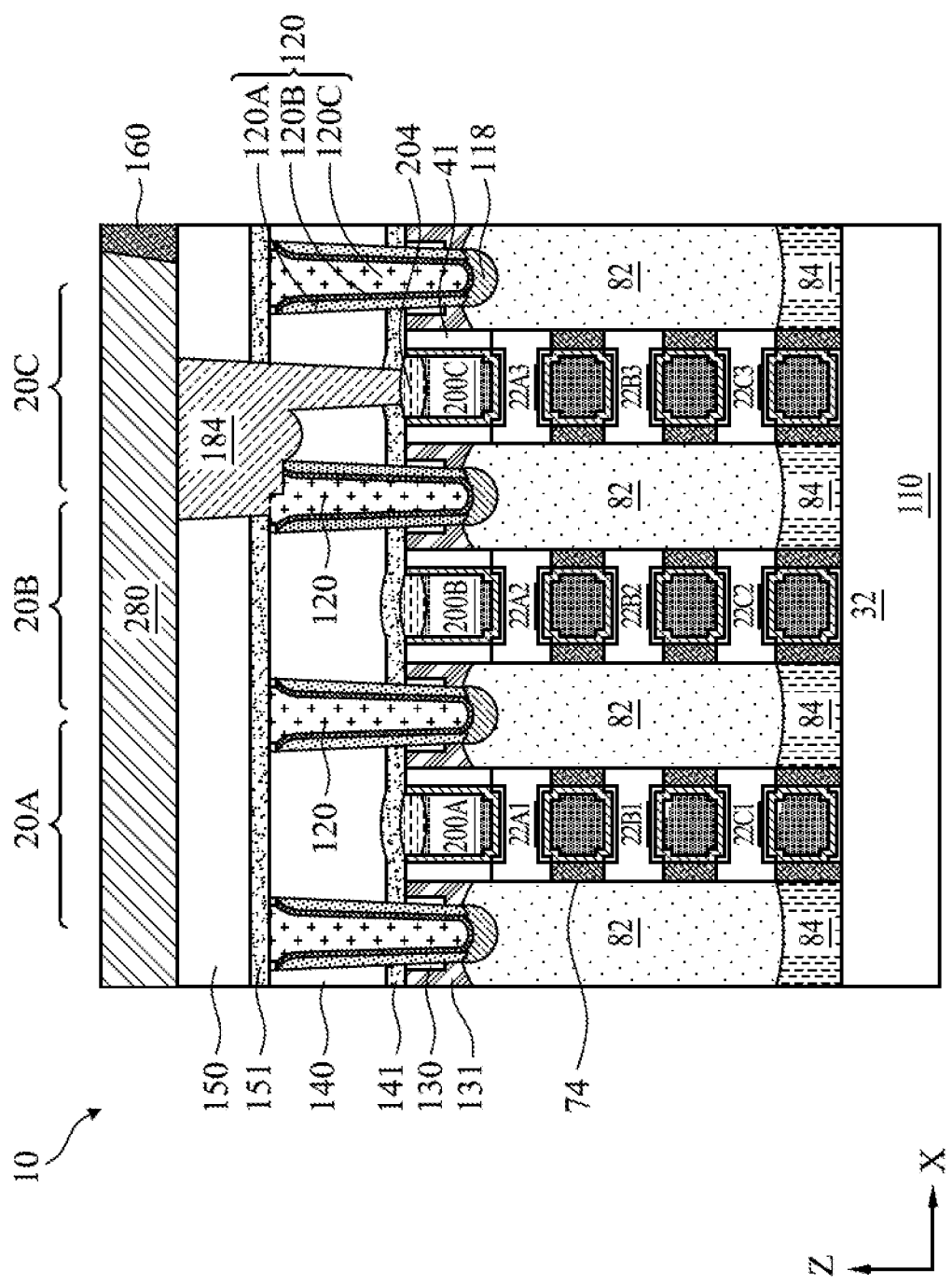
Figure 1E:
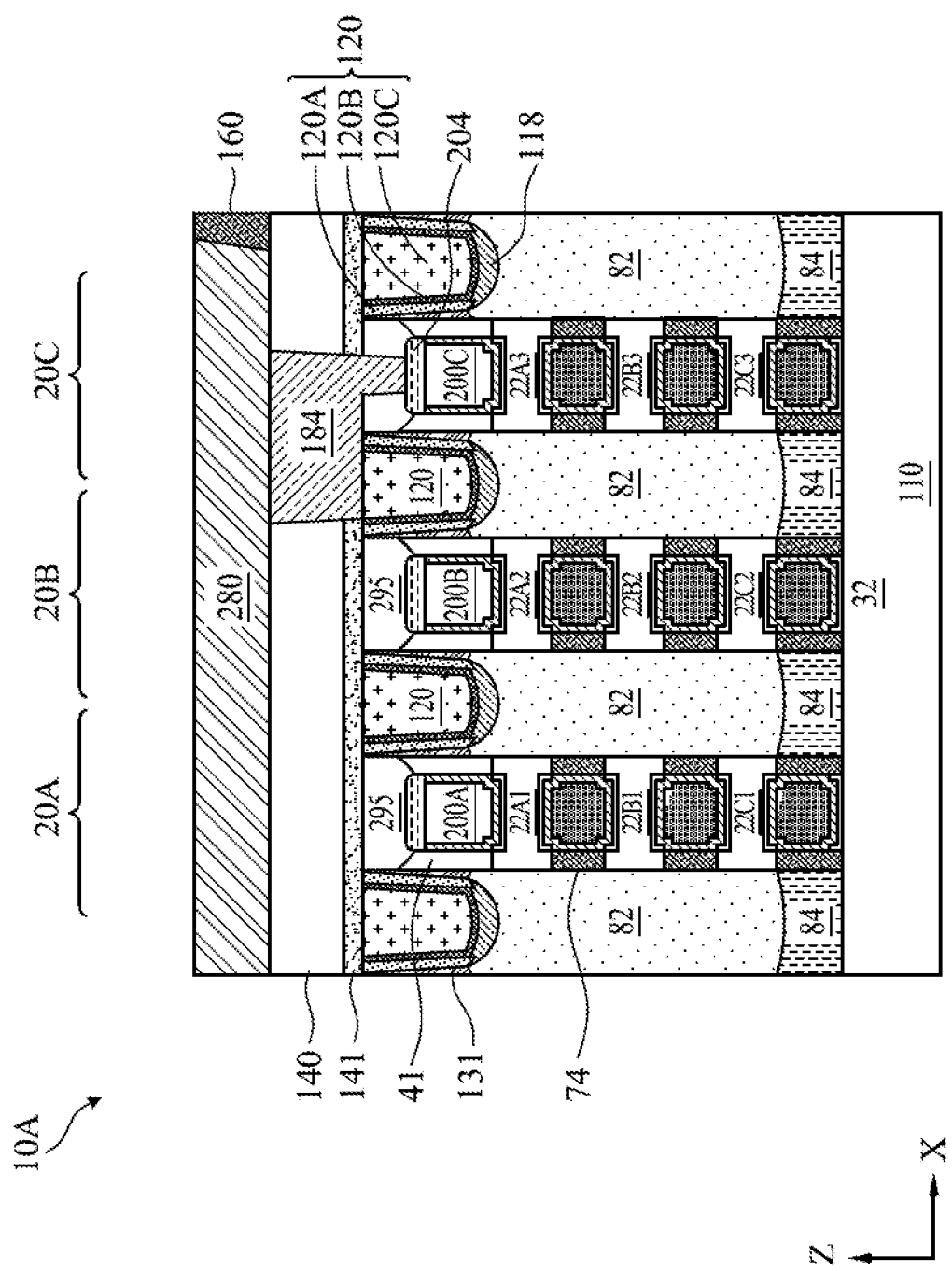
Figure 1F:
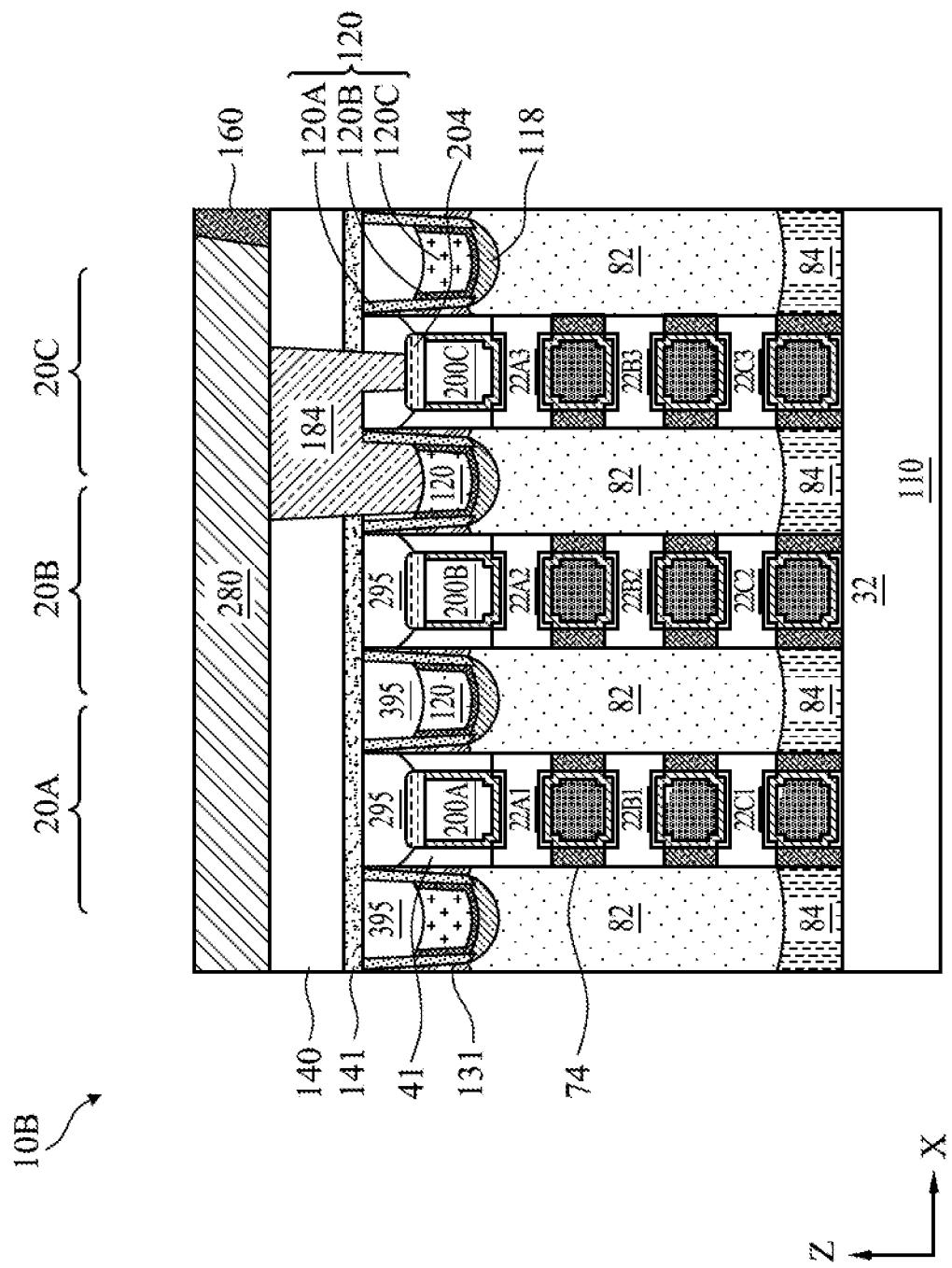
Figure 1G:
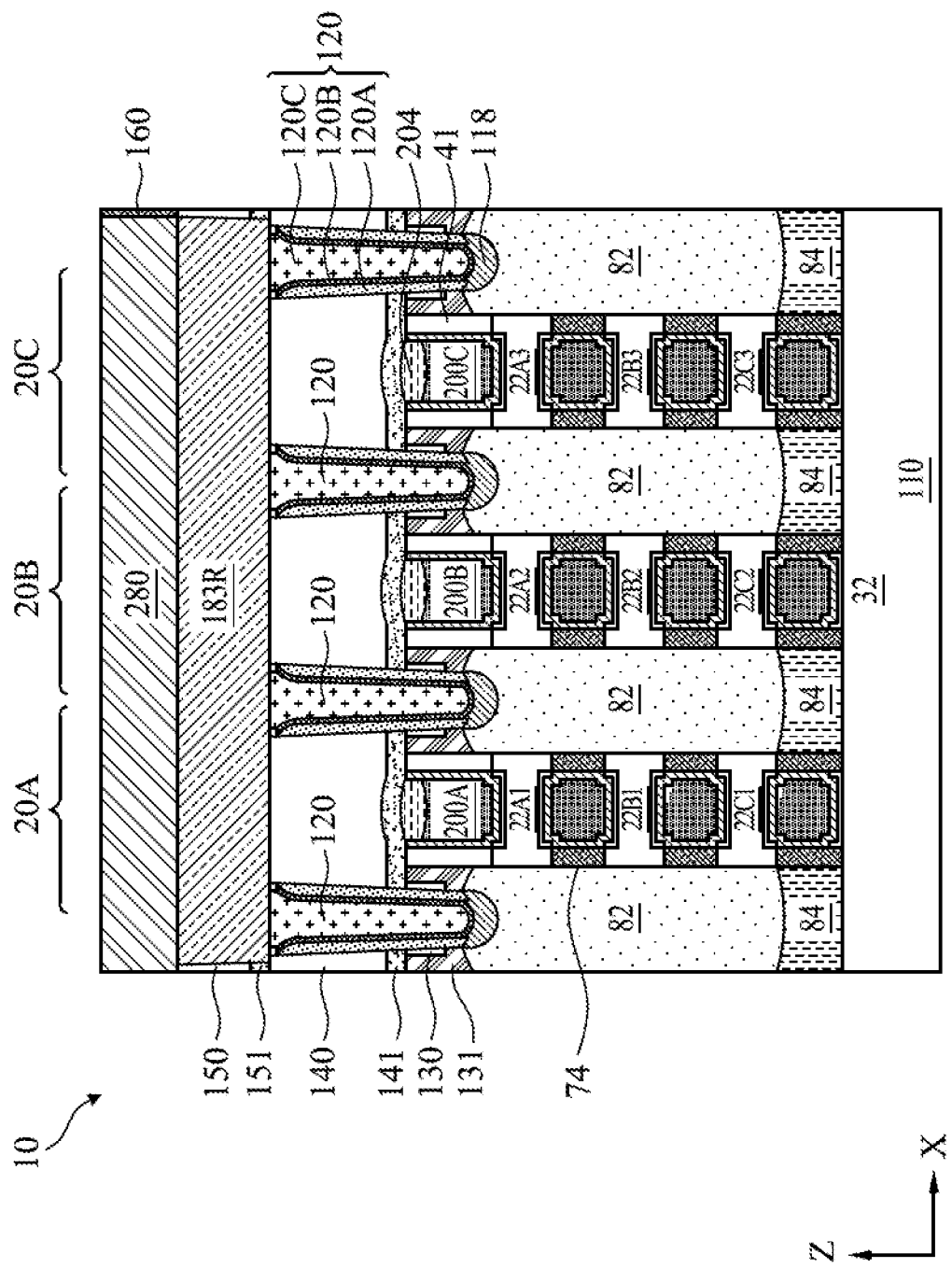
Figure 1H:
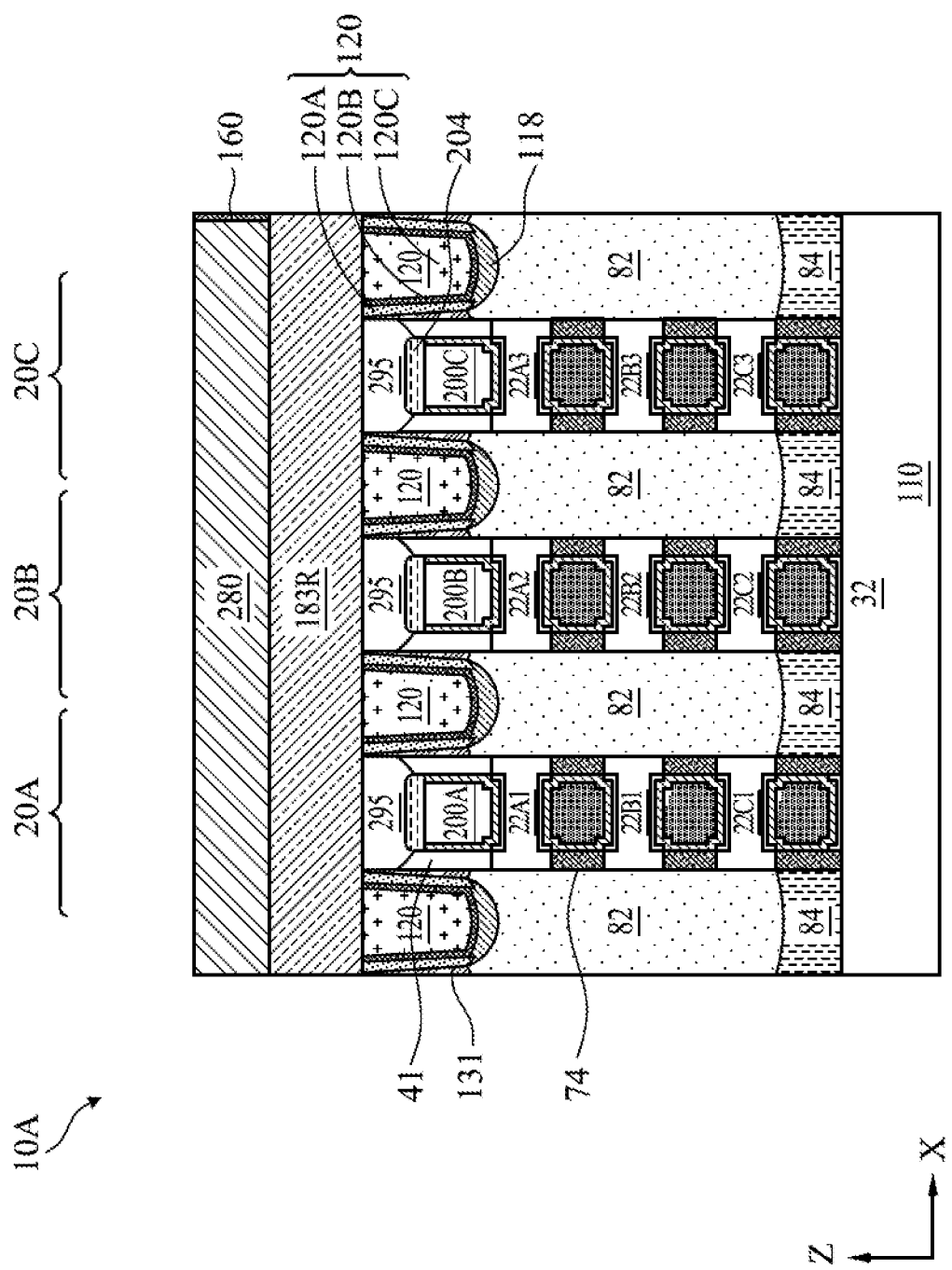
Figure 1I:
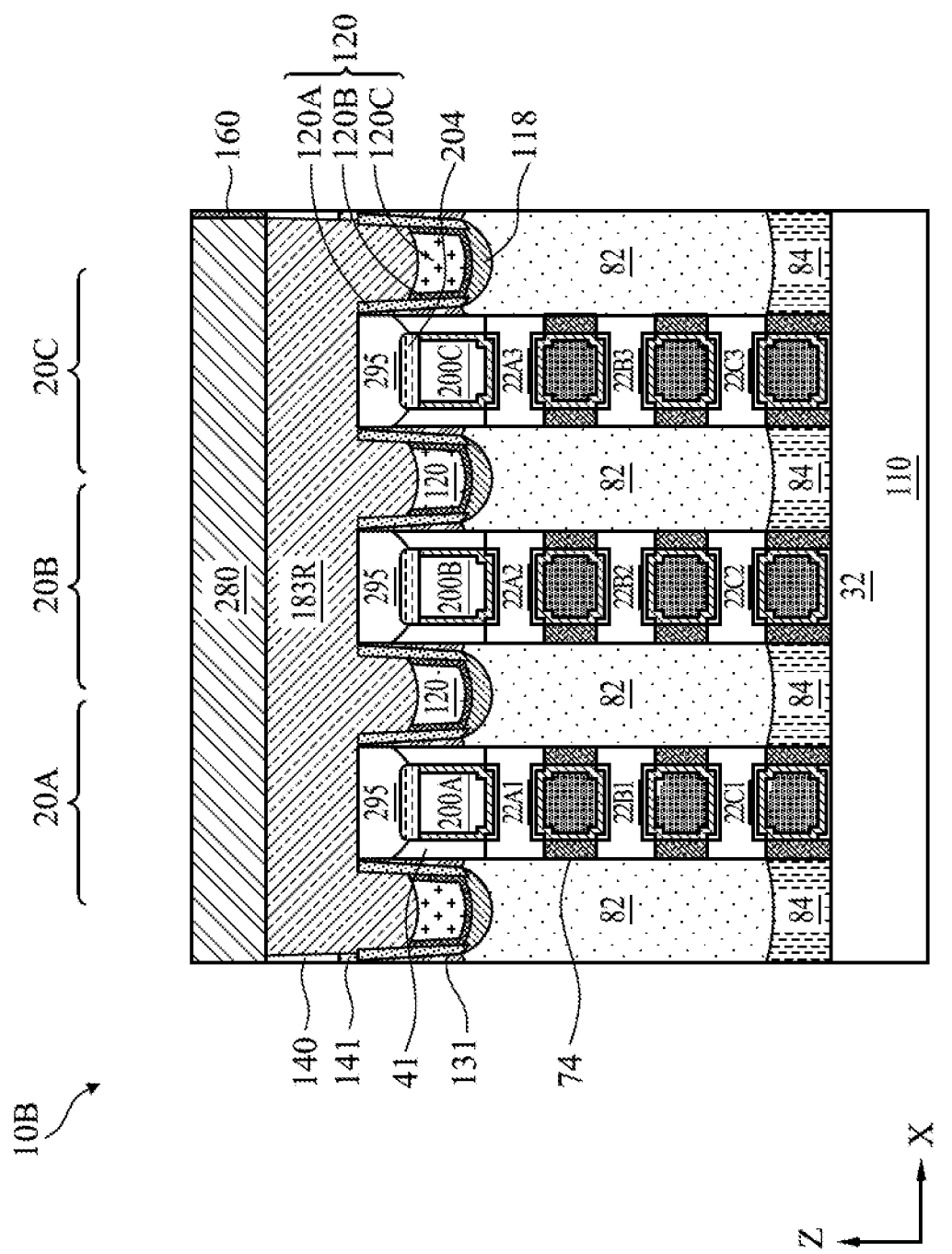
Figure 1L:
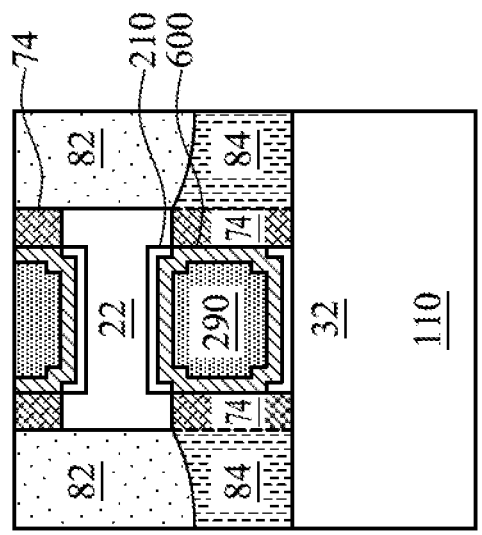
Figure 1K:
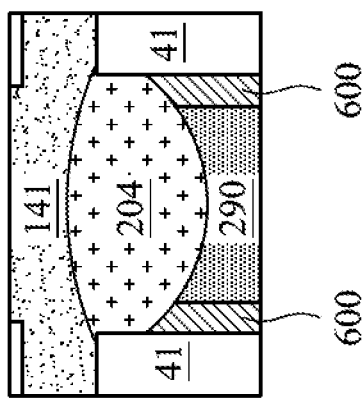
Figure 1J:
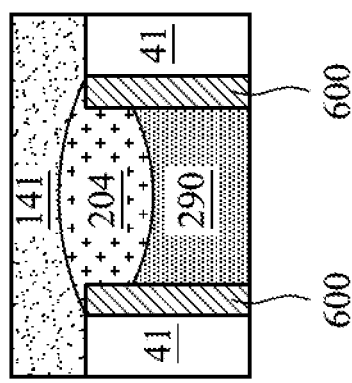
Figure 1M:
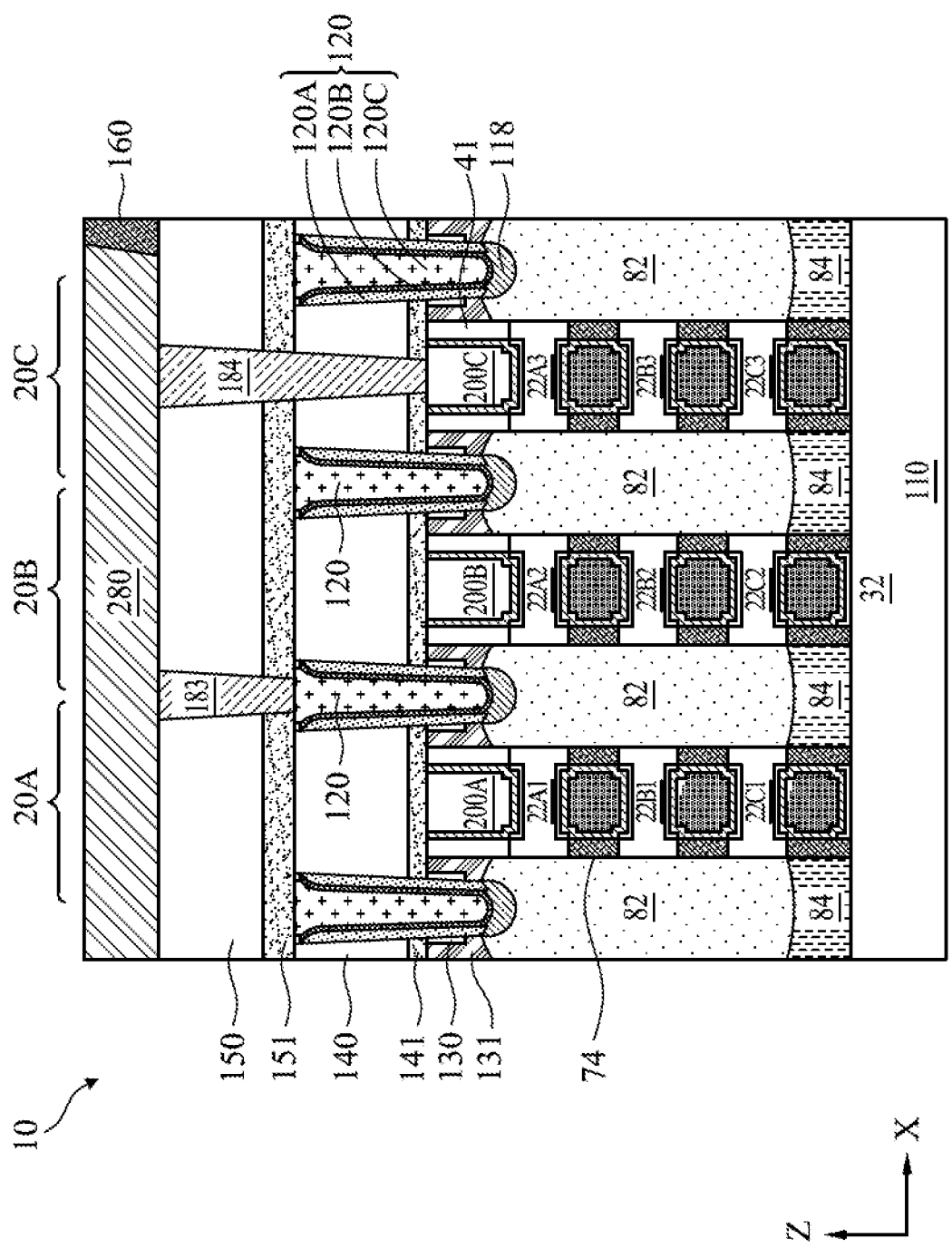
Figure 1N:
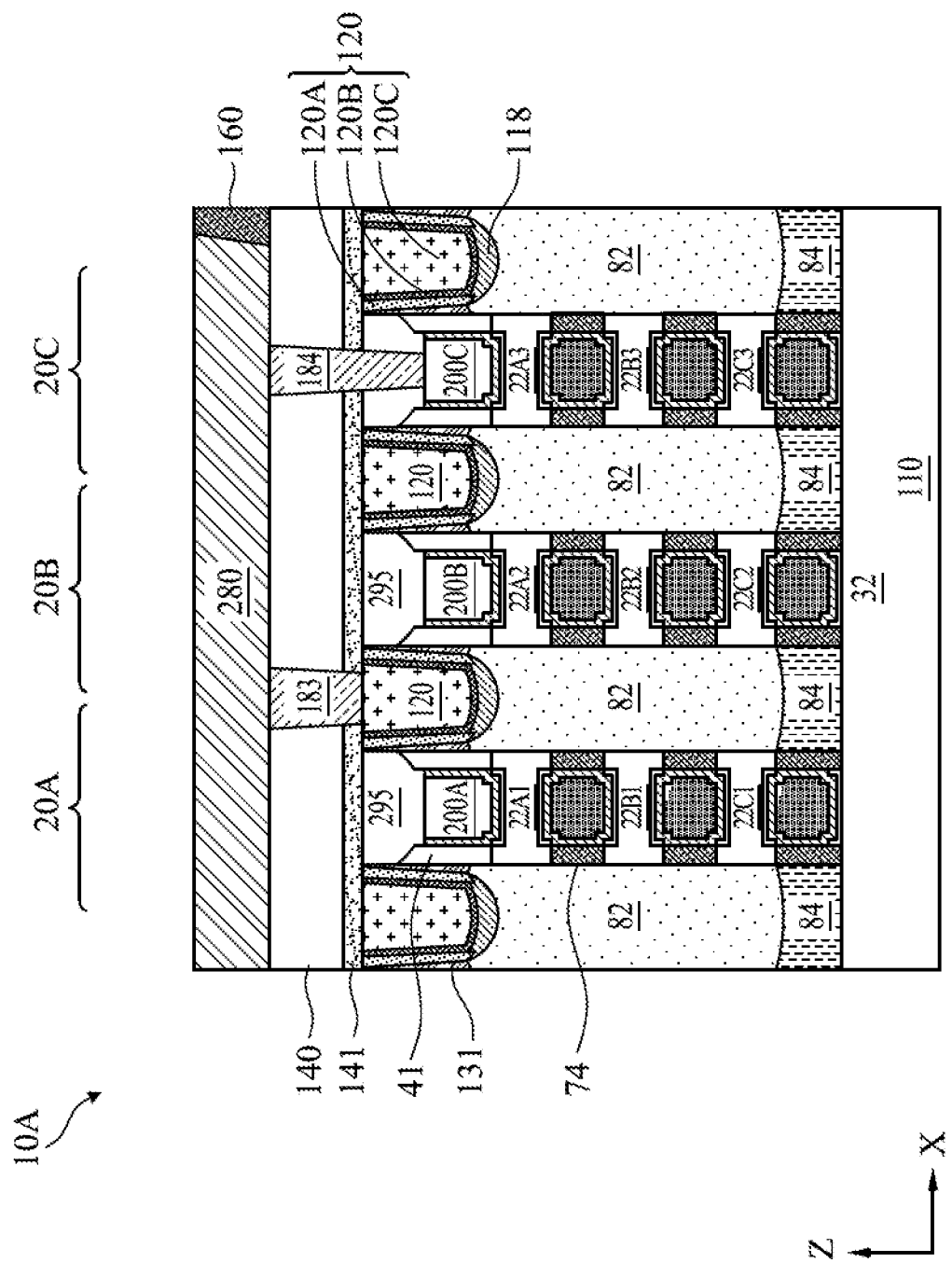
Figure 10:
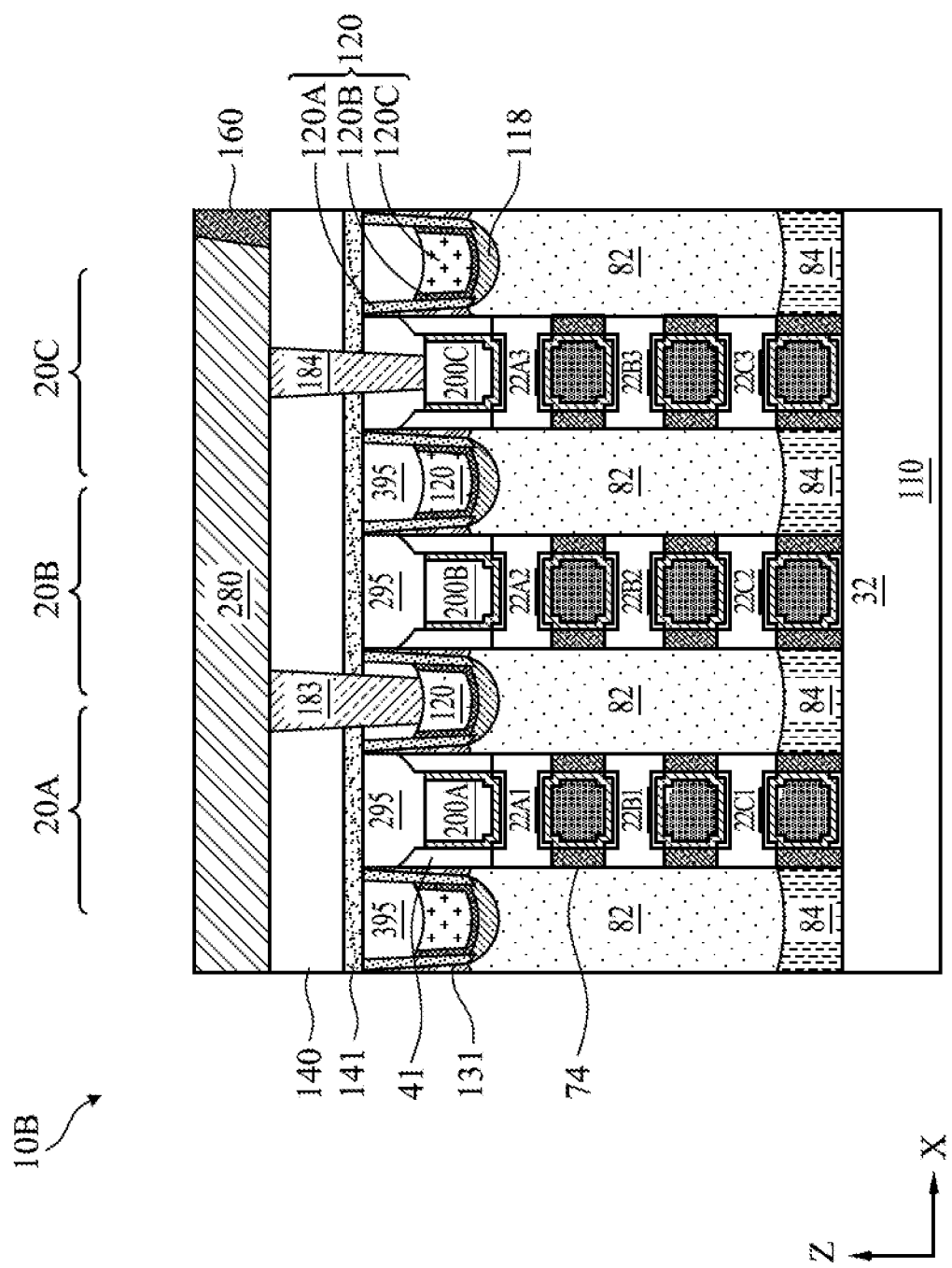
FIGS. 2A-11 are views of various embodiments of an IC device of at various stages of fabrication according to various aspects of the present disclosure.
Figure 1P:
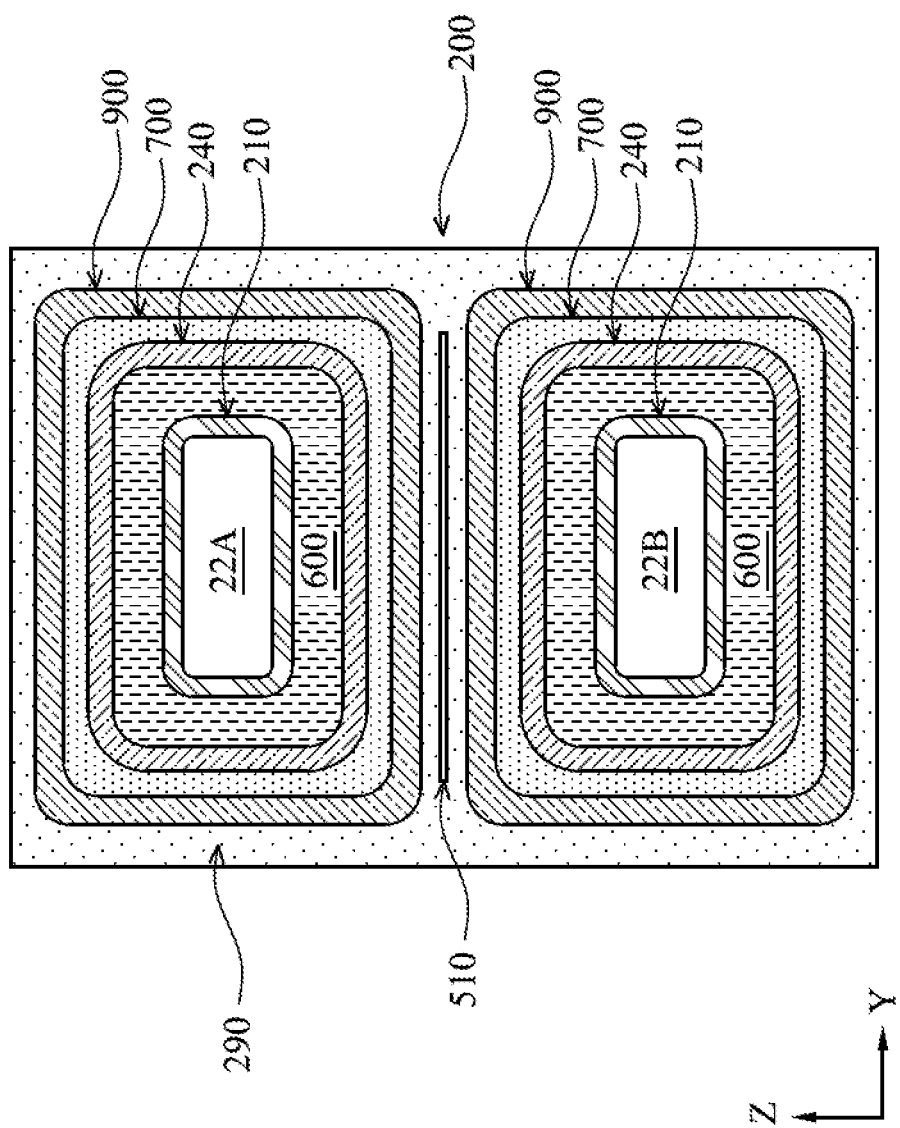
Figure 1Q:
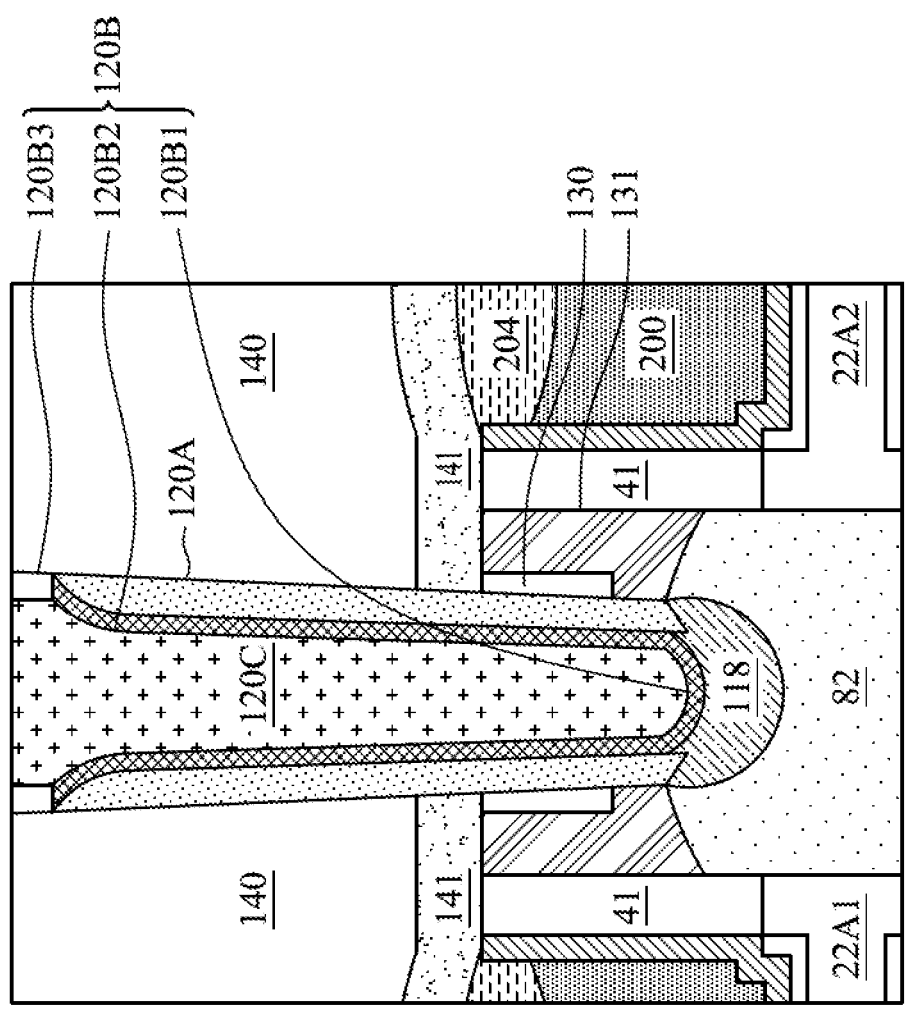

FIGS. 1A-1Q illustrate diagrammatic cross-sectional side views of a portion of IC devices 10, 10A, 10B fabricated according to embodiments of the present disclosure, where the IC devices 10, 10A, 10B include nanostructure devices 20A-20C. Certain features may be removed from view intentionally in the views of FIGS. 1A-1Q for simplicity of illustration.

FIG. 1A shows a portion of IC device 10 including nanostructure devices 20A, 20B, 20C. The nanostructure devices 20A-20C may include at least an N-type FET (NFET), a P-type FET (PFET), or both, in some embodiments. The IC device 10 may include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

Figure 3B:
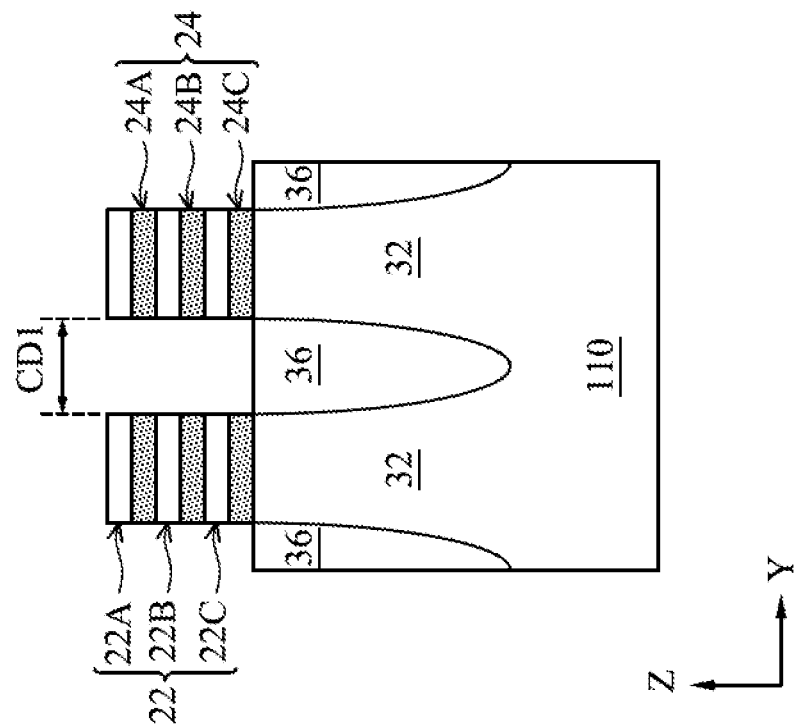

Referring to FIG. 1A, the nanostructure devices 20A-20C are formed over and/or in a substrate 110, and generally include gate structures 200A, 200B, 200C straddling and/or wrapping around semiconductor channels 22A1-22C3, alternately referred to as "nanostructures," located over semiconductor fin 32 protruding from, and separated by, isolation structures 36 (see FIG. 3B). The channels are labeled "22AX" to "22CX," where "X" is an integer from 1 to 3, corresponding to the three transistors 20A-20C, respectively. The channels 22A1-22C3 are abutted by respective source/drain regions 82. Each gate structure 200A-200C controls current flow between source/drain regions 82 through the channels 22A1-22C3. The channels 22A1-22C3 are optionally over a fin 32. In some embodiments, the fin 32 is not present, for example, when the fin 32 is removed in a process that forms a backside interconnect structure (e.g., including a backside power rail). Source/drain region(s) may refer to a source or a drain, individually or collectively dependent upon the context.

The channels 22A1-22C3 include a semiconductive material, for example silicon or a silicon compound, such as silicon germanium, or the like. In some embodiments, the fin structure 32 includes silicon. The channels 22A1-22C3 are nanostructures (e.g., having sizes that are in a range of a few nanometers) and may also each have an elongated shape and extend in the X-direction. In some embodiments, the channels 22A1-22C3 each have a nano-wire (NW) shape, a nano-sheet (NS) shape, a nano-tube (NT) shape, or other suitable nanoscale shape. The cross-sectional profile of the channels 22A1-22C3 may be rectangular, round, square, circular, elliptical, hexagonal, or combinations thereof.

In some embodiments, the lengths (e.g., measured in the X-direction) of the channels 22A1-22C3 may be different from each other, for example due to tapering during a fin etching process. In some embodiments, length of the channel 22A1 may be less than a length of the channel 22B1, which may be less than length of the channel 22C1. The channels 22A1-22C3 each may not have uniform thickness, for example due to a channel trimming process used to expand spacing (e.g., measured in the Z-direction) between the channels 22A1-22C3 to increase gate structure fabrication process window. For example, a middle portion of each of the channels 22A1-22C3 may be thinner than the two ends of each of the channels 22A1-22C3. Such shape may be collectively referred to as a "dog-bone" shape, and is shown in FIG. 1A.

In some embodiments, the spacing between the channels 22A1-22C3 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A1-22C3 is in a range between about 5 nm and about 8 nm. In some embodiments, a width (e.g., measured in the Y-direction, not shown in FIG. 1B, orthogonal to the X-Z plane) of each of the channels 22A1-22C3 is at least about 8 nm.

The gate structures 200A-200C are disposed over and between the channels 22A1-22C3, respectively. In some embodiments, the gate structures 200A-200C are disposed over and between the channels 22A1-22C3, which are silicon channels for N-type devices or silicon germanium channels for P-type devices. In some embodiments, the gate structures 200A-200C include an interfacial layer (IL) 210, one or more gate dielectric layers 600, one or more work function tuning layers 900, and a metal fill layer 290, which are shown and described in greater detail with reference to FIG. 1P.

The source/drain regions 82 may include SiB, SiGe, SiGeB, and may include dopants, such as Ge, Sb, B, or the like. In some embodiments, the source/drain regions 82 include silicon phosphorous (SiP). In some embodiments, the source/drain regions 82 have width (e.g., in the Y-axis direction) in a range of about 0.5 nm to about 100 nm. In some embodiments, height of the source/drain regions 82 (e.g., in the Z-axis direction) is in a range of about 0.1 nm to about 100 nm. The height of the source/drain regions 82 may be measured from an interface between a respective source/drain region 82 and the fin 32 on which it is disposed to a top of the source/drain region 82.

The nanostructure devices 20A-20C may include gate spacers 41 and inner spacers 74 that are disposed on sidewalls of the gate dielectric layer 600 and the IL 210. The inner spacers 74 are also disposed between the channels 22A1-22C3. The gate spacers 41 and the inner spacers 74 may include a dielectric material, for example a low-k material such as SiOCN, SiON, SiN, SiCN or SiOC. In some embodiments, one or more additional spacer layers are present abutting the gate spacers 41. In some embodiments, thickness of the inner spacers 74 (e.g., in the X-axis direction) is in a range of about 3 nm to about 10 nm. In some embodiments, thickness of the gate spacers 41 (e.g., in the X-axis direction) is in a range of about 3 nm to about 10 nm. The nanostructure devices 20A-20C may include bottom isolation structures 84 that are beneath the source/drain regions 82. In some embodiments, the bottom isolation structures 84 include a material such as SiOCN, SiON, SiN, SiCN or SiOC, and have thickness (e.g., in the Z-axis direction) of about 3 nm to about 10 nm. The bottom isolation structures 84 are optional, and are not present in some embodiments.

The nanostructure devices 20A-20C may include source/drain contacts 120 over one or more of the source/drain features 82. The source/drain contacts 120 may include a first liner layer 120A, a second liner layer 120B and a core layer 120C. The first liner layer 120A may be a dielectric layer, such as SiN, SiCN, SiOCN, SiOC, or the like. In some embodiments, thickness of the first liner layer 120A is in a range of about 3 nm to about 10 nm. The core layer 120C may include a conductive material such as tungsten, ruthenium, cobalt, copper, molybdenum, or the like. The second liner layer 120B is described in greater detail with reference to FIG. 1Q. In some embodiments, the source/drain contacts 120 have aspect ratio (e.g., height/width) in a range of about 1 to about 8. When the aspect ratio is over about 8, voids occurring when forming the source/drain contacts 120 may not be completely removed, and may be present in the source/drain contacts 120.

A silicide layer 118 may also be formed between the source/drain features 82 and the source/drain contacts 120, so as to reduce the source/drain contact resistance. In some embodiments, the silicide layer 118 is or includes one or more of nickel, cobalt, titanium, tantalum, platinum, tungsten, other noble metals, other refractory metals, rare earth metals or their alloys. For example, the silicide layer 118 may be TiSi, TiNiSi, NiSi, WSi, CoSi, MoSi, RuSi, or the like. In some embodiments, thickness of the silicide layer 118 (in the Z direction) is in a range of about 0.5 nm to about 10 nm, such as in a range of about 3 nm to about 10 nm. In some embodiments, height of the source/drain contacts 120 may be in a range of about 1 nm to about 100 nm, such as about 10 nm to about 100 nm.

Referring to FIG. 1Q, the second liner layer 120B may be a multi-material layer that includes one or more liner portions 120B1, 120B2, 120B3 having material different from other portions of the second liner layer 120B. For example, the second liner layer 120B may include a metal, such as Ti, Ni, W, Co, or the like. The liner portion 120B1 may be in contact with the silicide layer 118, and may include the same silicide material as the silicide layer 118, such as TiSi, TiNiSi, NiSi, WSi, CoSi, or the like. The liner portion 120B2 may be in contact with sidewalls of the first liner layer 120A, and may include, for example, a dielectric of the metal or a dielectric of the silicide material, such as TiN, TiNiN, NiN, WN, CoN, the like or TiSiN, TiNiSiN, NiSiN, WSiN, CoSiN, or the like. The dielectrics just described are nitrides of the metal or silicide material. In embodiments in which the first liner layer 120A includes carbon or oxygen, the dielectrics may also include carbon or oxygen. For example, the liner portion 120B2 may include TiSiON, TiCN, or the like. In some embodiments, thickness of the liner portion 120B2 may be in a range of about 3 nm to about 10 nm. The liner portion 120B3 may be in contact with a second interlayer dielectric (ILD) 140. In some embodiments, the second ILD 140 is an oxide layer, such as silicon oxide, and the liner portion 120B3 is an oxide of the metal or silicide material, such as TiO, TiSiO, or the like. The liner portions 120B1-120B3 may be different materials due to annealing of a metal precursor layer that reacts with materials of the underlying layers, such as the first liner layer 120A and the second ILD 140, so as to form the liner portions 120B1-120B3.

Again to FIG. 1A, the nanostructure devices 20A-20C include an interlayer dielectric (ILD) 130 and an etch stop layer 131. The ILD 130 provides electrical isolation between the various components of the nanostructure devices 20A-20C discussed above, for example between the gate structures 200A-200C and the source/drain contacts 120 therebetween. The etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, $HfO_2$, $ZrO_2$, $ZrAlO_x$, $HfAlO_x$, $HfSiO_x$, $Al_2O_3$, or other suitable material. In some embodiments, thickness of the etch stop layer 131 is in a range of about 1 nm to about 5 nm.

Overlying each of the gate structures 200A-200C are an optional gate capping conductive layer 204, a second ESL 141, the second ILD 140, a third ESL 151 and a third ILD 150. The gate capping conductive layer 204 may reduce contact resistance between a gate via 184 and the core layer 290 of the gate structures 200A-200C (e.g., the gate structure 200C in FIG. 1A). In some embodiments, the gate capping conductive layer 204 comprises a metal, such as tungsten, molybdenum, cobalt, ruthenium, or the like. The gate capping conductive layer 204 may include the same material as the core layer 120C of the source/drain contacts 120. The gate capping conductive layer 204 may include the same material as the gate via 184. In some embodiments, thickness of a thickest part of the gate capping conductive layer 204 may be in a range of about 1 nm to about 10 nm. In some embodiments, the gate capping conductive layer 204 is a part of the gate structures 200A-200C.

The second and third ESLs 141, 151 may be similar in many respects to the ESL 131. In some embodiments, the third ESL 151 is thicker than the ESL 131, the second ESL 141, or both.

The second and third ILDs 140, 150 may be similar in many respects to the ILD 130. In some embodiments, the second ILD 140 is thicker than the ILD 130, the third ILD 150, or both.

A conductive feature 280, which may be a metal wire or traces, is electrically connected to one or more of the gate structures 200A-200C by a respective gate via 184, and is electrically connected to one or more of the source/drain contacts 120 by a respective source/drain via 183. The conductive feature 280 may be embedded in a dielectric layer 160. The conductive feature 280 may be or include a material the same as or different from that of the source/drain contacts 120 (e.g., the core layer 120C), the source/drain via 183, the gate via 184, the gate capping conductive layer 204, or any combination thereof. Thickness of the conductive feature 280 may be in a range of about 5 nm to about 50 nm. The dielectric layer 160 may be or include SiCN, SiO, SiCON, SiN, SiC or other low-k dielectric material (e.g., k<3.9). Height of the source/drain via 183 may be in a range of about 3 nm to about 30 nm. Height of the gate via 184 may be in a range of about 10 nm to about 70 nm.

As shown in FIG. 1A, one or more source/drain vias 183 and one or more gate vias 184 may land on source/drain contacts 120 and gate structures 200A-200C, respectively. In the example shown in FIG. 1A, the source/drain via 183 lands on the source/drain contact 120 between the nanostructure devices 20A, 20B. A gate via 184 lands on the gate structure 200C (e.g., lands on the conductive layer 204 on the gate structure 200C). The source/drain via 183 may be or include the same material as the source/drain contacts 120. For example, the source/drain vias 183 and the source/drain contacts 120 may be or include one or more of W, Ru, Co, Cu, Ti, TiN, Ta, TaN, Mo, Ni, alloys thereof or the like. In the case of an alloy, the source/drain vias 183 and the source/drain contacts 120 may be or include alloys having the both substantially the same elemental components and substantially the same ratio of the elemental components. By using substantially the same material for the source/drain contacts 120 and the source/drain vias 183, contact resistance is reduced between the source/drain contacts 120 and the source/drain vias 183, which enhances circuit performance of devices (e.g., the device 10) using the described configuration. In some embodiments, width of upper surfaces of the source/drain vias 183 (e.g., in the X-direction) is in a range of about 5 nm to about 40 nm. Sidewalls of the source/drain vias 183 may be substantially vertical (e.g., perpendicular with the major surface of the substrate 110) or may be tapered, as shown in FIG. 1A.

The gate via 184 may include two or more of a glue layer, a metal liner layer and a metal core layer. The gate via 184 extends from an upper surface of the third ILD 150, through the third ILD 150, through the third etch stop layer 151 under the third ILD 150, through the second ILD and ESL 140, 141, to an upper surface of the conductive layer 204. Sidewalls of the gate via 184 are in contact with one or more of the second and third ESLs 141, 151 and the second and third ILDs 140, 150. The lower surface of the gate via 184 is in contact with the conductive layer 204.

In some embodiments, the glue layer is or includes one or more of TiN, TaN, Ru, or other suitable material. The glue layer may land on (e.g., be in direct physical contact with) the conductive layer 204 on the gate structure 200C. In some embodiments, thickness of the glue layer may be in a range of about 5 Angstroms to about 50 Angstroms. In some embodiments, the glue layer is not present.

In some embodiments, the metal liner layer is or includes one or more of W, Ru, Al, Mo, Ti, TiN, Cu, Co or other suitable material. In some embodiments, thickness of the metal liner layer may be in a range of about 2 nm to about 20 nm. In some embodiments, the metal liner layer is in direct contact with the conductive layer 204. In some embodiments in which the glue layer is present, the metal liner layer is in contact with the conductive layer 204 through an opening in the glue layer.

In some embodiments, the metal core layer has different composition than the metal liner layer, and is or includes one or more of W, Ru, Al, Mo, Ti, TiN, Cu, Co or other suitable material. In some embodiments, width of upper surfaces of the metal core layer (e.g., in the X-direction) is in a range of about 5 nm to about 40 nm. The metal core layer may be surrounded laterally and underneath by the metal liner layer. In some embodiments in which the glue layer, the metal liner layer, or both are present, the metal liner layer is in contact with the conductive layer 204 through an opening in the glue layer, an opening in the metal liner layer, or both.

FIG. 1B is a cross-sectional side view of an IC device 10A in accordance with various embodiments. The IC device 10A includes gate capping layers 295 over the gate structures 200A-200C.

The gate capping layers 295, also referred to as "self-aligned capping" (SAC) layers, may provide protection to the underlying gate structures 200A-200C, and may also act as a CMP stop layer when planarizing the source/drain contacts 120 following formation thereof. The gate capping layers 295 may be a dielectric layer including a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, or other suitable dielectric material. In some embodiments, an optional hard dielectric layer is between the capping layer 295 and the conductive layer 204. The hard dielectric layer may prevent current leakage following one or more etching operations, which may be performed to form gate vias 184, source/drain contacts 120, isolation structures (e.g., source/drain contact isolation structures), or the like. In some embodiments, the hard dielectric layer is or comprises a dielectric material that is harder than, for example, that of the gate capping layer 295, such as aluminum oxide, or other suitable dielectric material. The hard dielectric layer may also be between the gate capping layer 295 and the spacer layer 41.

As shown in FIG. 1B, the gate capping layer 295 may have an upper portion that is wider (in the X-axis direction) than a lower portion. The lower portion may be laterally between the gate spacers 41. In some embodiments, width (X direction) of the lower portion of the gate capping layer 295 is in a range of about 2 nm to about 50 nm. Width of the upper portion of the gate capping layer 295 in the same direction may be in a range of about 6 nm to about 150 nm. Thickness of a center portion of the gate capping layer 295 vertically aligned over the gate structures 200A-200C may be in a range of about 10 nm to about 50 nm. Thickness of a peripheral portion of the gate capping layer 295 vertically aligned over the gate spacers 41 may be in a range of about 7 nm to about 30 nm. As shown in FIG. 1B, presence of the conductive layer 204 may be such that the center portion has substantially the same thickness as, or is even thinner than, the peripheral portion.

FIG. 1C is a cross-sectional side view of an IC device 10B in accordance with various embodiments. The IC device 10B includes gate capping layers 295 over the gate structures 200A-200C, and source/drain capping layers 395 over the source/drain contacts 120.

The source/drain capping layers 395, also referred to as "self-aligned capping" (SAC) layers, may provide protection to the underlying source/drain contacts 120. The source/drain capping layers 395 may be a dielectric layer including a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, or other suitable dielectric material. In some embodiments, the dielectric material of the source/drain capping layers 395 is different from that of the gate capping layers 295. Thickness of a center portion of the source/drain capping layer 395 may be in a range of about 10 nm to about 50 nm. Thickness of a peripheral portion of the source/drain capping layer 395 may be in a range of about 7 nm to about 30 nm.

FIG. 1D illustrates the IC device 10 including the gate via 184, in which the gate via 184 extends to contact a source/drain contact 120 adjacent the gate structure 200C electrically connected to the gate via 184. The gate via 184 shown in FIG. 1D may be referred to as an expanded gate via or "MP" 184. In some embodiments, it is beneficial for a gate terminal and source or drain terminal of a nanostructure device to be electrically connected to each other. Instead of forming separate gate and source/drain vias connected by a metal trace in an upper layer, it can be beneficial to form the gate via 184 shown in FIG. 1D, which reduces resistance between the gate structure 200C and the source/drain contact 120. A dashed line is shown in FIG. 1D between the source/drain contact 120 and the gate via 184. In some embodiments, a visible interface is present corresponding to the dashed line. In some embodiments, no interface is present between the source/drain contact 120 and the gate via 184, due to, for example, a post-deposition anneal performed after formation of the gate via 184. The lack of an interface may also be due to the gate via 184 and the source/drain contact 120 being the same material.

FIG. 1E illustrates the IC device 10A including the gate via 184, in which the gate via 184 extends to contact the source/drain contact 120 adjacent the gate structure 200C. The gate via 184 is similar in many respects to the gate via 184 shown in FIG. 1D. In FIG. 1E, the gate via 184 may extend through, and along an upper surface of, the gate capping layer 295. As shown by a hashed line in FIG. 1E, a visible interface may be present between the gate via 184 and the source/drain contact 120. In some embodiments, no interface is present, due to, for example, the post-deposition anneal performed after forming the gate via 184 and/or due to the gate via 184 and the source/drain contact 120 being the same material.

FIG. 1F illustrates the IC device 10B including the gate via 184, in which the gate via 184 extends to contact the source/drain contact 120 adjacent the gate structure 200C. The gate via 184 is similar in many respects to the gate via 184 shown in FIG. 1E. In FIG. 1F, the gate via 184 may extend through the source/drain capping layer 395 overlying the source/drain contact 120. As shown by a hashed line in FIG. 1F, a visible interface may be present between the gate via 184 and the source/drain contact 120. In some embodiments, no interface is present, due to, for example, the post-deposition anneal performed after forming the gate via 184 and/or due to the gate via 184 and the source/drain contact 120 being the same material.

FIG. 1G illustrates the IC device 10 including a source/drain common via ("VDR") 183R that couples two or more of the source/drain contacts 120 to each other. As shown in FIG. 1G, the source/drain common via 183R is embedded in the third ILD and ESL 150, 151, and is in contact with the source/drain contacts 120. In some embodiments, the source/drain common via 183R includes the same material as the source/drain contacts 120 (e.g., the core layer 120C). As shown by a hashed line in FIG. 1G, visible interfaces may be present between the common source/drain via 183R and the respective source/drain contacts 120. In some embodiments, no interface is present, due to, for example, the post-deposition anneal performed after forming the common source/drain via 183R.

FIG. 1H illustrates the IC device 10A including the source/drain common via 183R that couples two or more of the source/drain contacts 120 to each other. The source/drain common via 183R is similar in many respects to that shown in FIG. 1G. In the IC device 10A including the gate capping layers 295, the source/drain common via 183R may have a bottom surface in contact with upper surfaces of the gate capping layers 295 and the source/drain contacts 120. As shown by a hashed line in FIG. 1H, visible interfaces may be present between the common source/drain via 183R and the respective source/drain contacts 120. In some embodiments, no interface is present, due to, for example, the post-deposition anneal performed after forming the common source/drain via 183R.

FIG. 1I illustrates the IC device 10B including the source/drain common via 183R that couples two or more of the source/drain contacts 120 to each other. The source/drain common via 183R is similar in many respects to that shown in FIG. 1H. In the IC device 10B including the gate capping layers 295 and the source/drain capping layers 395, the source/drain common via 183R may have a bottom surface in contact with upper surfaces of the gate capping layers 295 and the source/drain contacts 120. In the IC device 10B, the source/drain capping layers 395 may be removed prior to deposition of the source/drain common via 183R. As such, the bottom surface of the source/drain common via 183R may include extension portions that adopt the shape of the source/drain capping layers 395. As shown by hashed lines in FIG. 1I, visible interfaces may be present between the common source/drain via 183R and the respective source/drain contacts 120. In some embodiments, no interface is present, due to, for example, the post-deposition anneal performed after forming the common source/drain via 183R.

FIGS. 1J and 1K illustrate the conductive layer 204 in accordance with various embodiments. In FIG. 1J, the conductive layer 204 has an upper surface in contact with the second ESL 141, a lower surface in contact with the core layer 290, and sidewalls in contact with the gate dielectric layer 600. In some embodiments, an upper portion of the conductive layer 204 extends onto upper surfaces of the gate dielectric layer 600.

In FIG. 1K, upper portions of the gate dielectric layer 600 are recessed, and the conductive layer 204 has sidewalls in contact with the gate spacers 41. The lower surface of the conductive layer 204 may be in contact with the core layer 290 and the gate dielectric layer 600.

FIG. 1L illustrates the bottom isolation structures or bottom isolation layer 84. The bottom isolation structures 84 reduce or prevent current leakage through the substrate 110. As shown in FIG. 1L, the bottom isolation structures 84 are positioned beneath the source/drain regions 82, and abut the inner spacers 74. In some embodiments, the bottom isolation structures 84 are on the fin 32, when the fin 32 is present. In some embodiments, the substrate 110 and fin 32 are removed, and the lower surfaces of the bottom isolation structures 84 are in contact with, for example, a bottom dielectric layer that replaces the substrate 110 and fin 32. The bottom isolation structures 84 may be the same material as the inner spacers 74, or may be a different material than the inner spacers 74. For example, the bottom isolation structures 84 may be formed in the same process as the inner spacers 74, and may remain in a trench in which the source/drain regions 82 are to be formed after an anisotropic etch that removes excess material of the inner spacers 74. In such embodiments, because the bottom isolation structures 84 are formed in a same deposition process as the inner spacers 74, no visible interface may be present between the bottom isolation structures 84 and the inner spacers 74. In some embodiments, the material of the inner spacers 74 at the bottom of the trench is removed, and the bottom isolation structures 84 are formed by depositing a material different than that of the inner spacers 74 in the trench prior to growing the source/drain regions 82. In such embodiments, a visible interface may be present between the bottom isolation structures 84 and the inner spacers 74.

FIGS. 1M, 1N, 1O illustrate the IC devices 10, 10A, 10B in which the conductive layer 204 is not present. In some embodiments, the gate via 184 is formed in a chemical vapor deposition (CVD) process instead of using a bottom-up formation process. As such, the conductive layer 204 may be omitted in some embodiments, which reduces process complexity and cost. In the IC devices 10, 10A, 10B, the gate vias 184 may be in contact with the core layer 290 of the gate structures 200 (e.g., the gate structure 200C) instead of being in contact with the conductive layer 204.

FIG. 1P is a detailed cross-sectional side view of the gate structure 200 in accordance with various embodiments. The gate structure 200 shown in FIG. 1P includes an interfacial layer 210, the gate dielectric layer 600, a second interfacial layer 240, a work function barrier layer 700, a work function tuning layer 900 and the core layer 290.

The interfacial layer 210, which may be an oxide of the material of the channels 22A1-22C3, is formed on exposed areas of the channels 22A1-22C3 and the top surface of fins 32 when present. The interfacial layer 210 promotes adhesion of the gate dielectric layers 600 to the channels 22A1-22C3. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

The gate dielectric layer 600 is positioned on the interfacial layer 210. In some embodiments, the gate dielectric layer 600 includes at least one high-k gate dielectric material, which may refer to dielectric materials having a high dielectric constant that is greater than a dielectric constant of silicon oxide ($k \approx 3.9$). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A. In some embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A-20C.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

The second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

The work function barrier layer 700 is optionally included in the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET devices, and decreases the threshold voltage (magnitude) for PFET devices.

The work function metal layer 900, which may include one or more of an N-type work function metal layer, an in-situ capping layer, and an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

The metal fill layer 290 is positioned on the work function metal layer 900. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. Between the channels 22A1-22C3, the metal fill layer 290 is circumferentially surrounded (in the cross-sectional view) by the one or more work function metal layers 900, which are then circumferentially surrounded by the gate dielectric layers 600.

In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

Figure 30A:
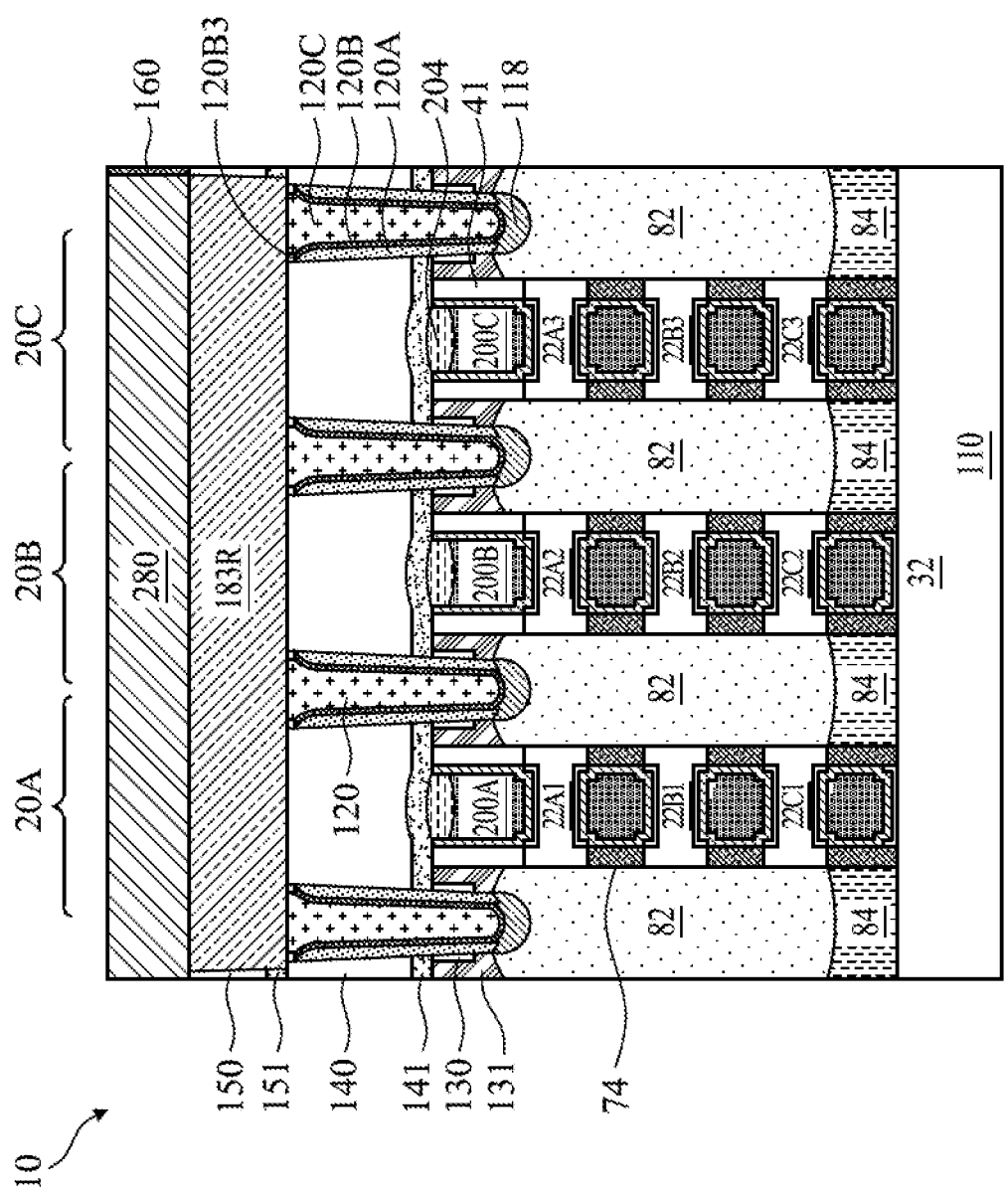
Figure 30B:
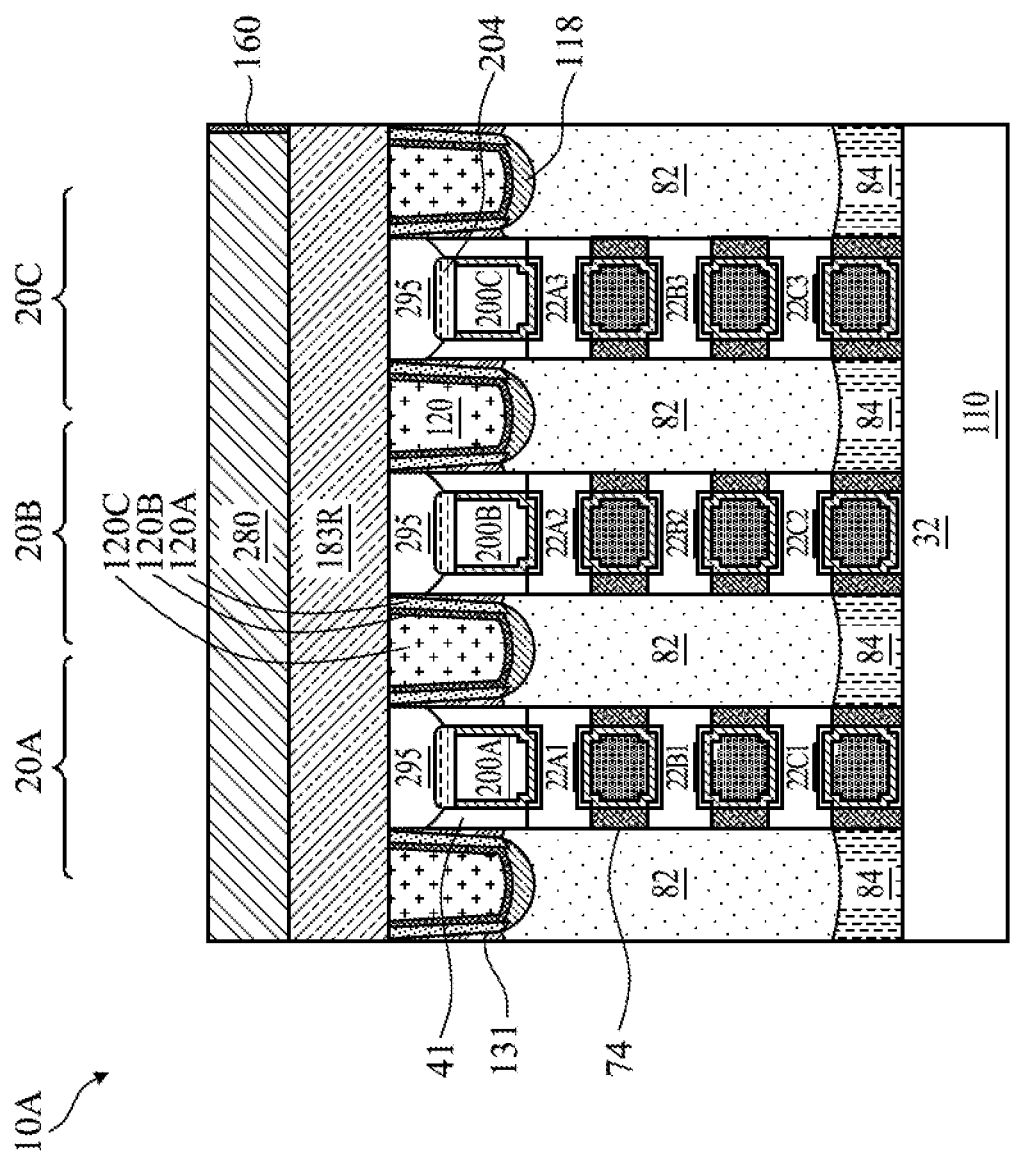
Figure 30C:
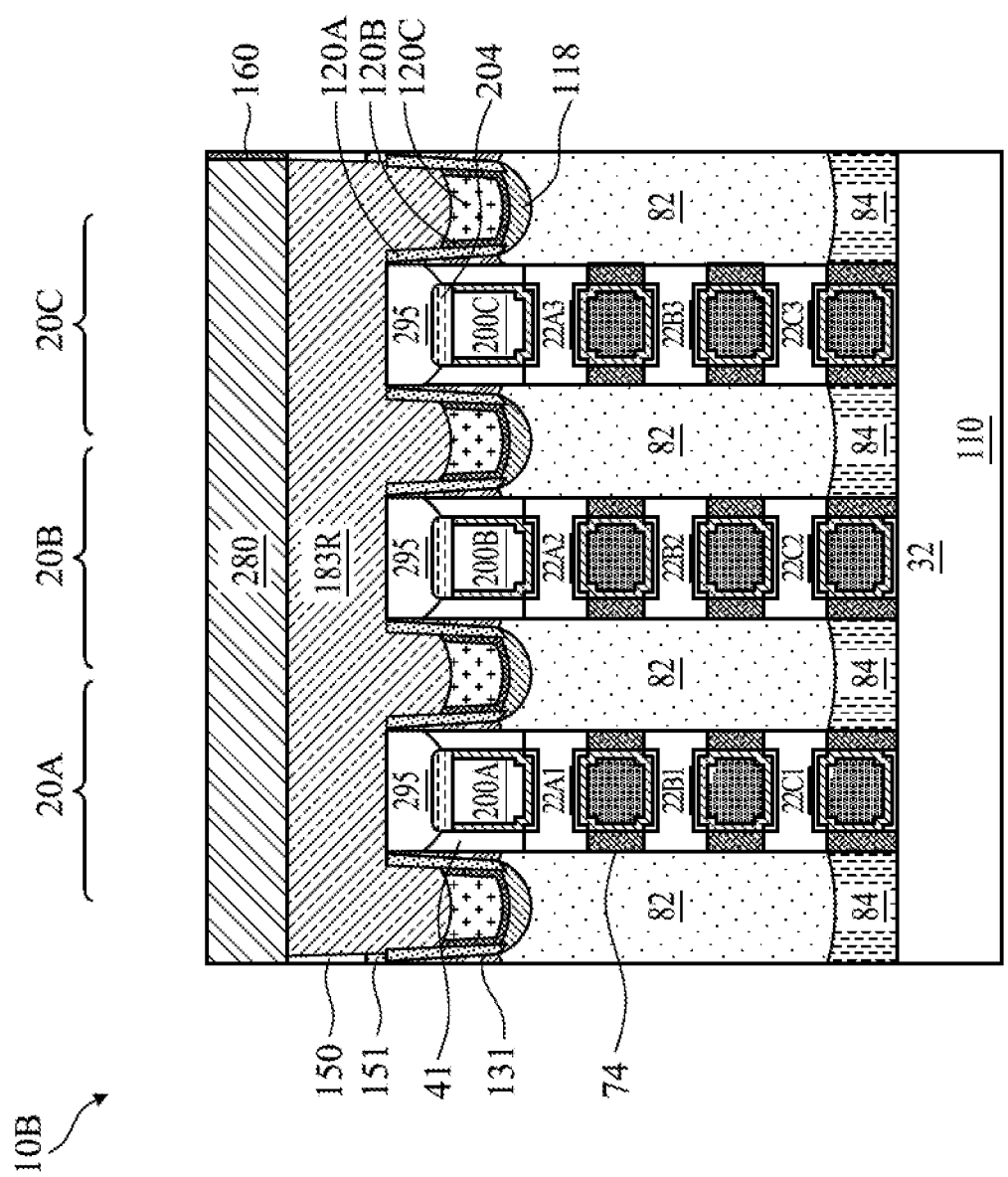
Figure 31:
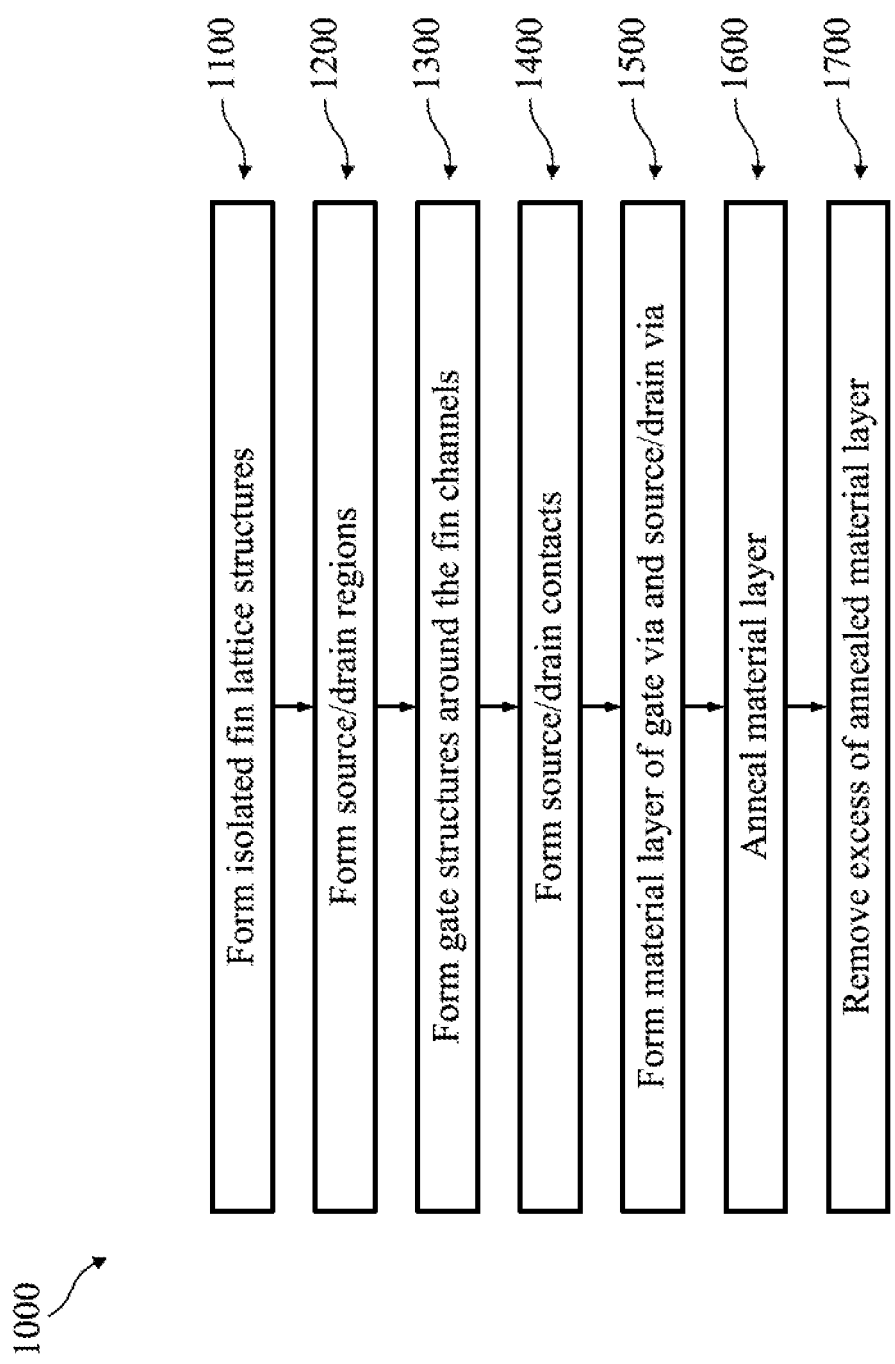
FIGS. 31-33 are flowcharts illustrating methods of fabricating a semiconductor device according to various aspects of the present disclosure.
Figure 32:
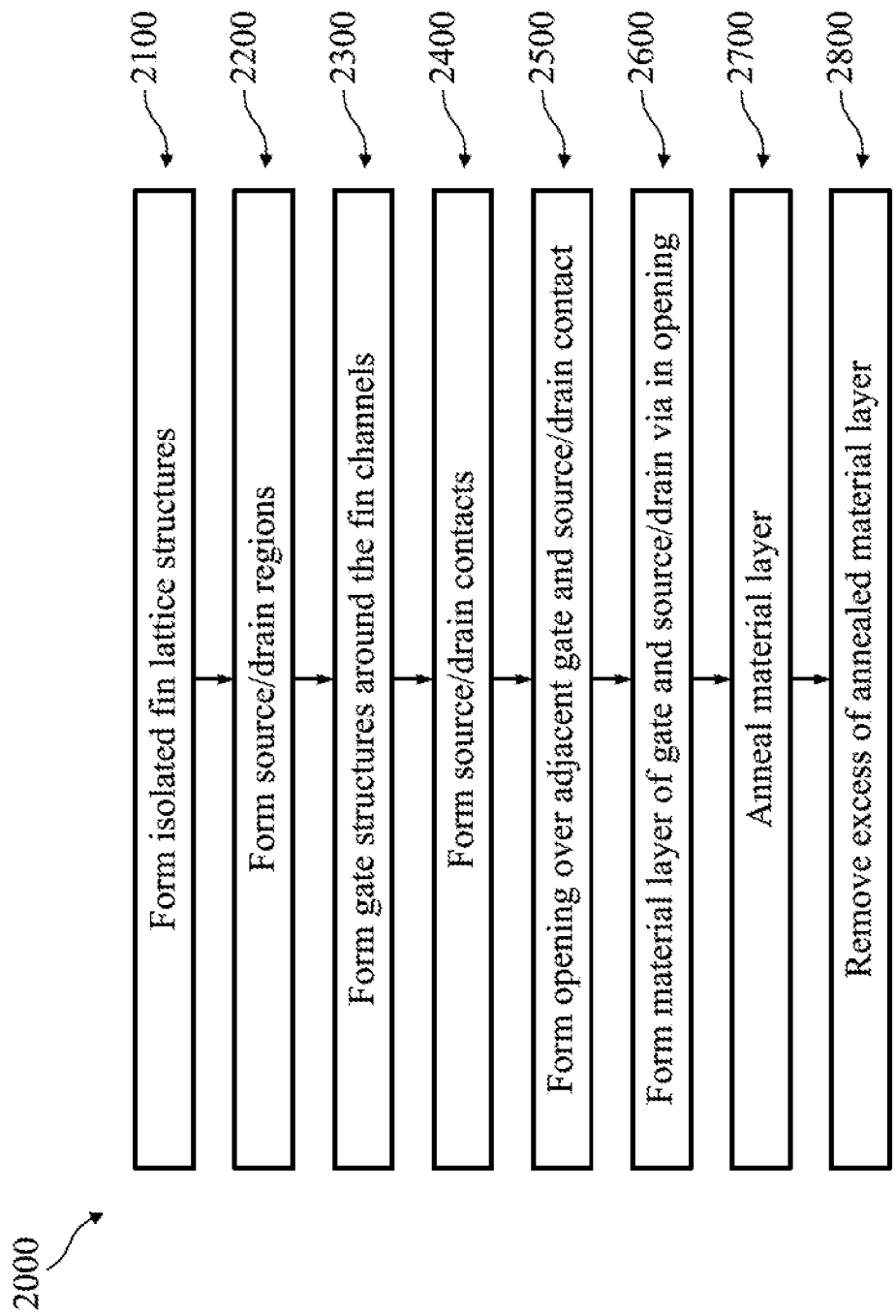
Figure 33:
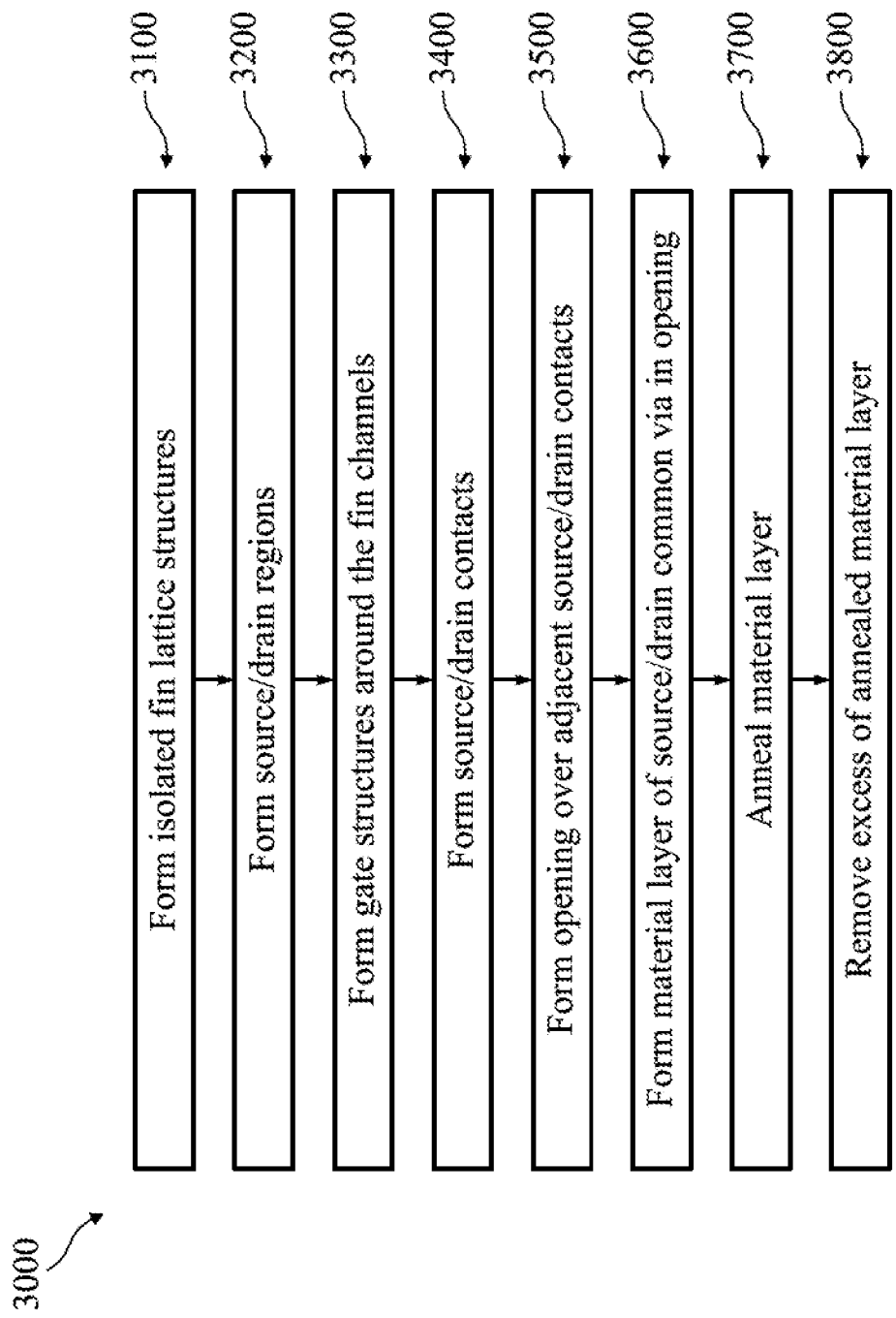

FIGS. 31, 32, 33 illustrate flowcharts of methods 1000, 2000, 3000 for forming an IC device or a portion thereof from a workpiece, according to one or more aspects of the present disclosure. Methods 1000, 2000, 3000 are merely examples and are not intended to limit the present disclosure to what is explicitly illustrated in methods 1000, 2000, 3000. Additional acts can be provided before, during and after the methods 1000, 2000, 3000 and some acts described can be replaced, eliminated, or moved around for additional embodiments of the methods. Not all acts are described herein in detail for reasons of simplicity. Methods 1000, 2000, 3000 are described below in conjunction with fragmentary perspective and/or cross-sectional views of a workpiece, shown in FIGS. 2A-30C, at different stages of fabrication according to embodiments of methods 1000, 2000, 3000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 11 are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, 10C and 11 illustrate reference cross-section C-C' (channel/fin cut) illustrated in FIG. 4A.

Figure 2B:
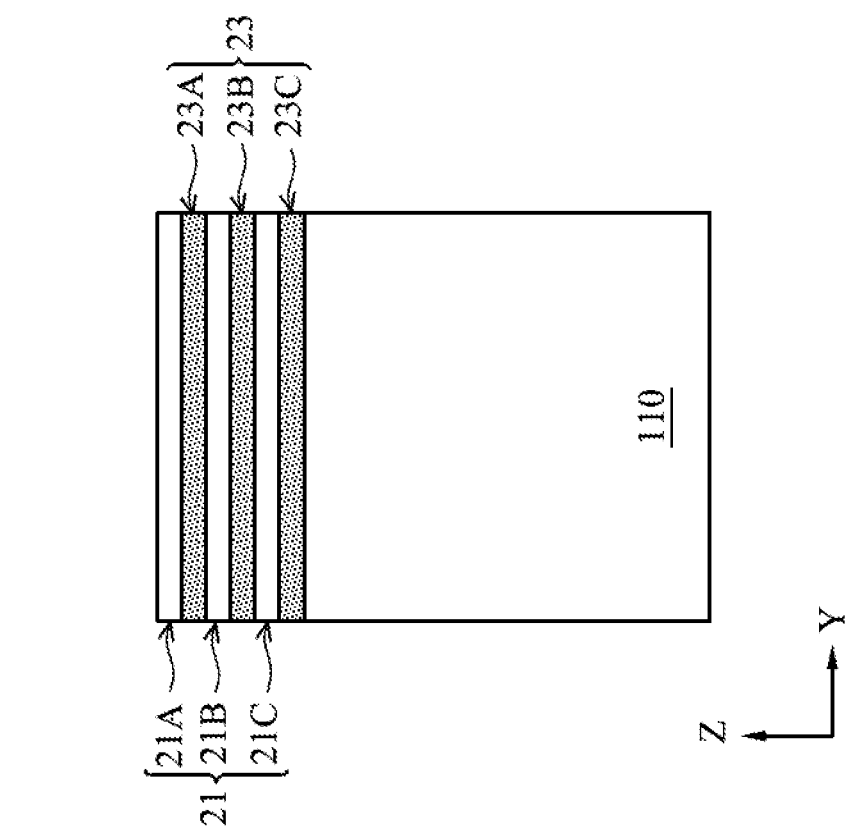
Figure 2A:
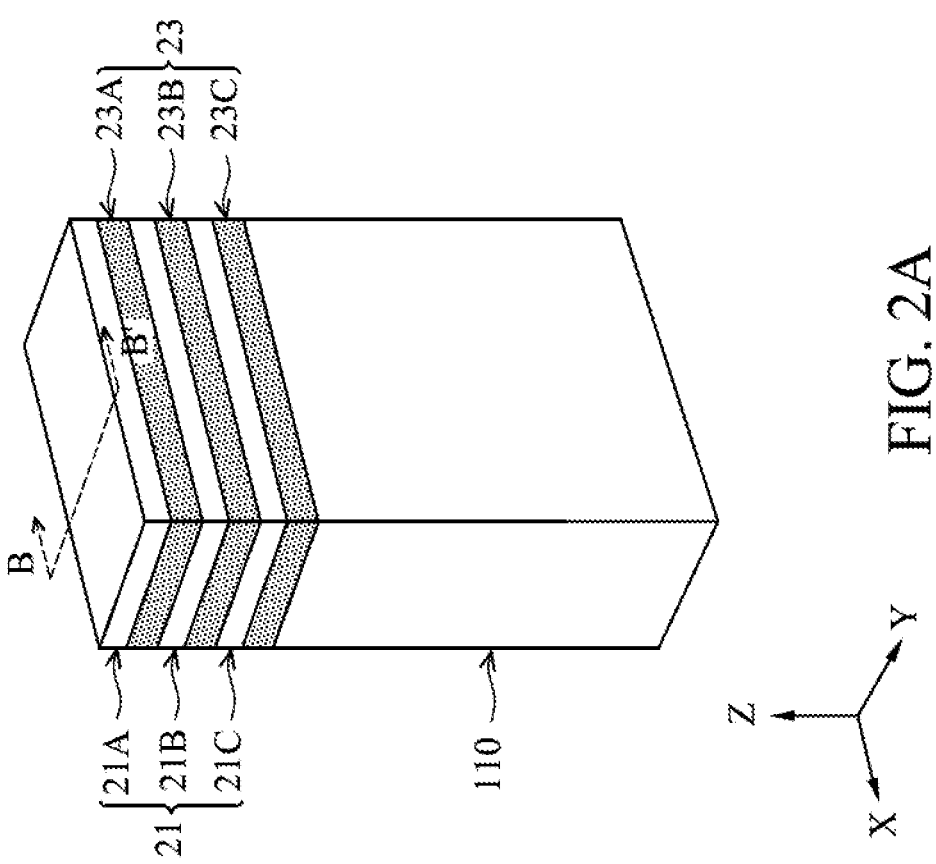

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four, five or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3A:
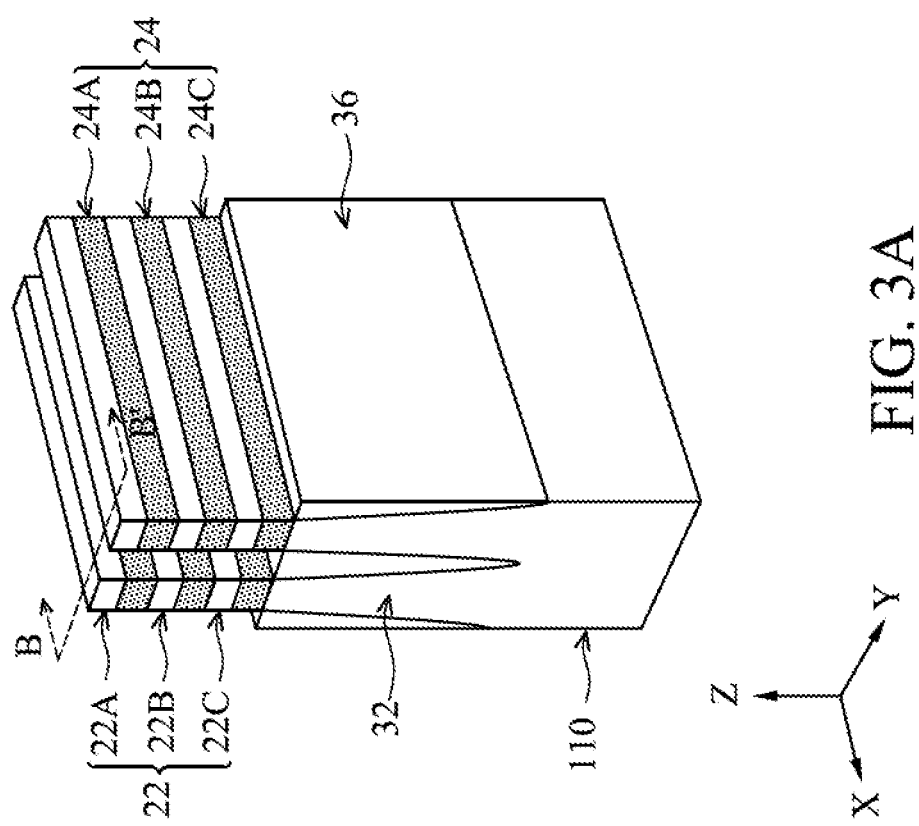

In FIG. 3A and FIG. 3B, fins 32 are formed in the substrate 110 and nanostructures 22, 24 are formed in the multi-layer stack 25 corresponding to acts 1100, 2100, 3100 of FIGS. 31-33. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm. A portion of the device 10 is illustrated in FIGS. 3A and 3B including two fins 32 for simplicity of illustration. The processes 1000, 2000, 3000 illustrated in FIGS. 2A-11 may be extended to any number of fins, and is not limited to the two fins 32 shown in FIGS. 3A-11.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete. In some embodiments, one or more hard mask layers is present over the nanostructures 22, 24 to protect the nanostructures 22, 24 during the removal process that removes the excess insulation material over the nanostructures 22, 24. The hard mask layers may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

Figure 4A:
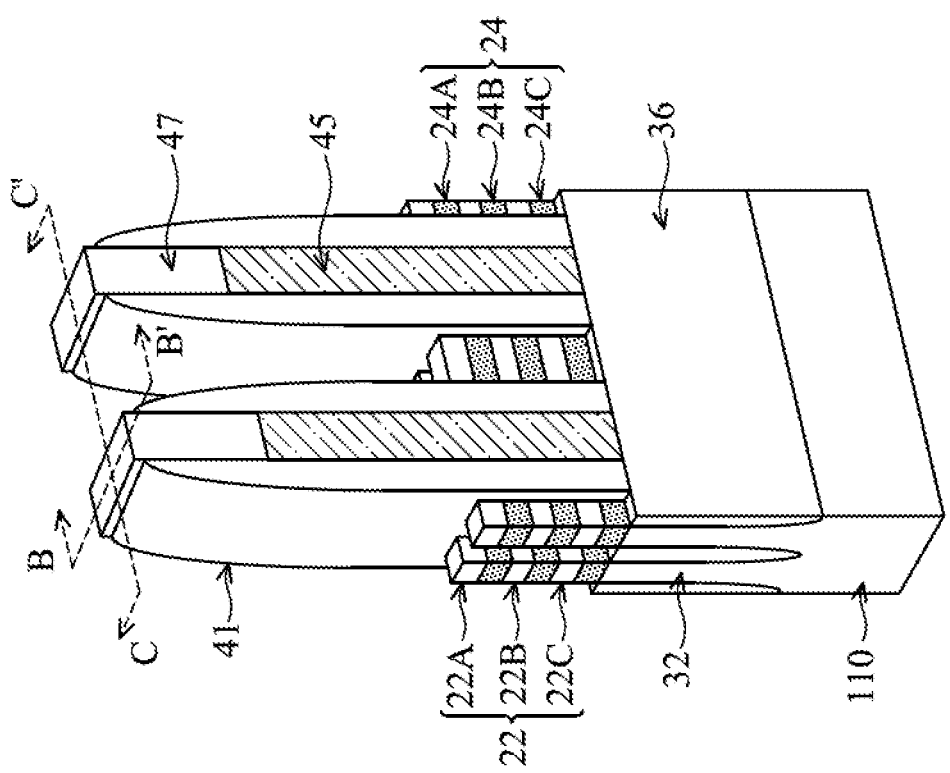
Figure 4A:
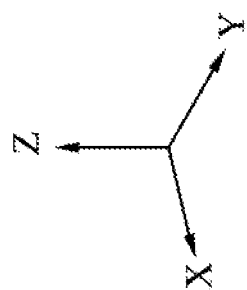
Figure 4C:
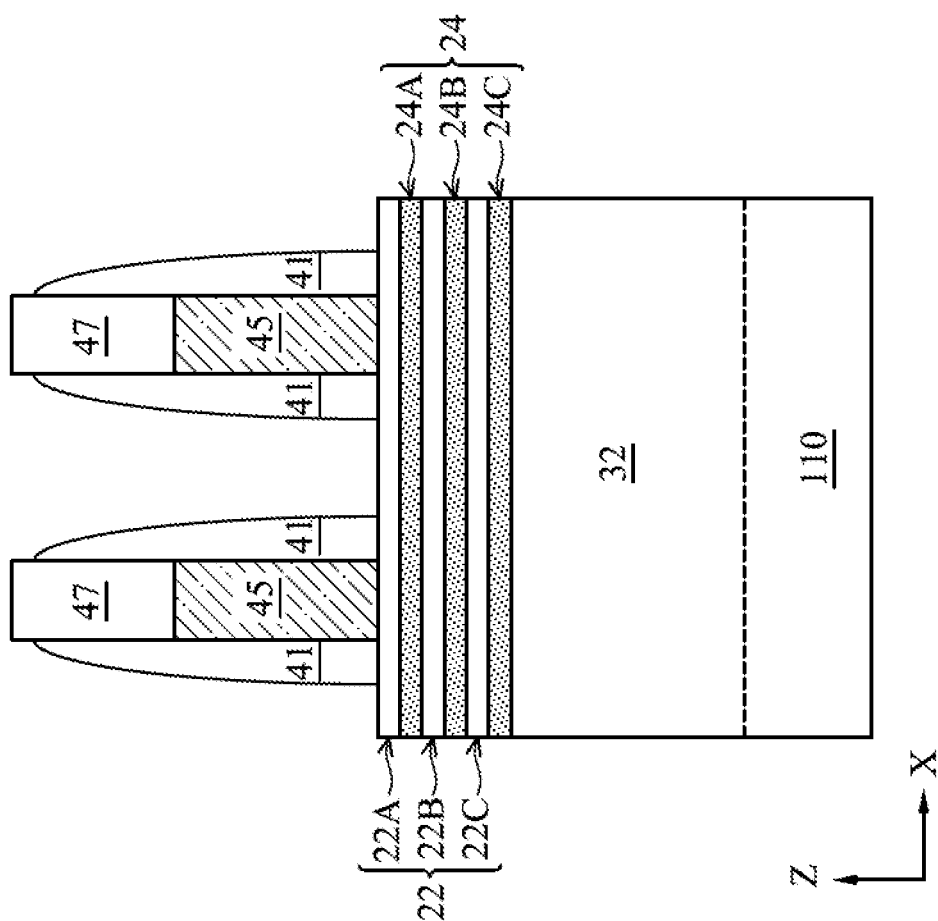
Figure 4B:
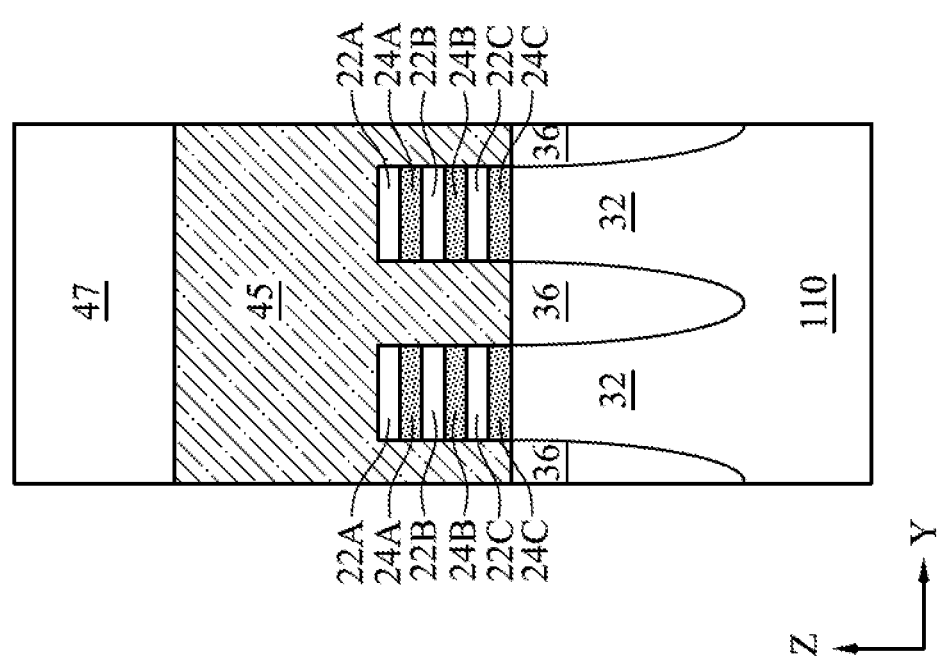

In FIGS. 4A-4C, dummy (or "sacrificial") gate structures 40 are formed over the fins 32 and/or the nanostructures 22, 24. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as any of the gate structures 200A-200C.

Figure 5A:
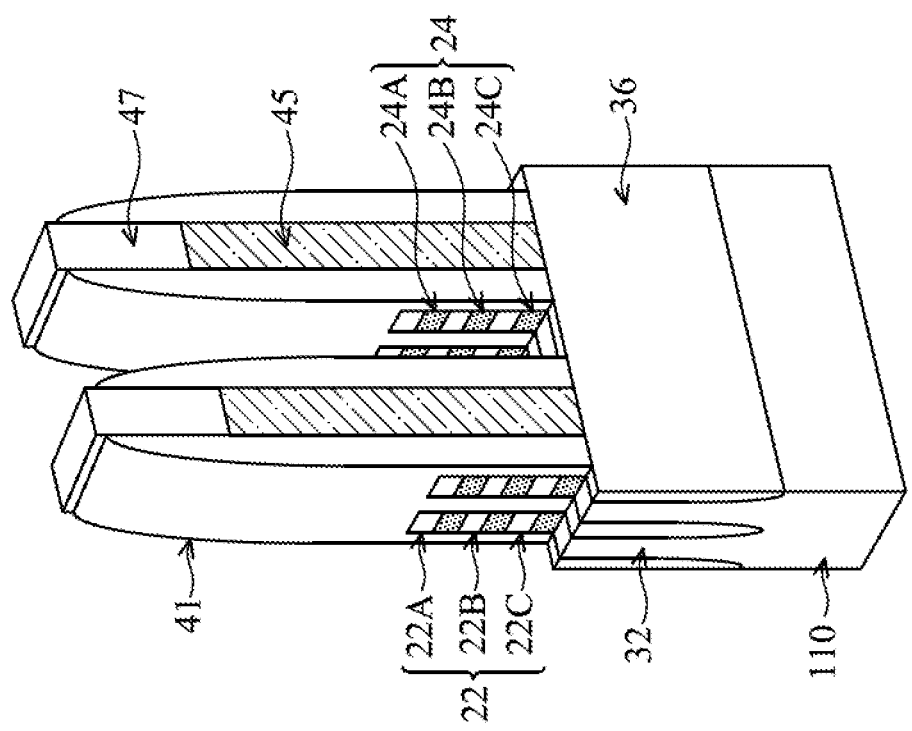

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows two vertical stacks of nanostructures 22, 24 following the etching process for simplicity. In general, the etching process may be used to form any number of vertical stacks of nanostructures 22, 24 over the fins 32.

Figure 6A:
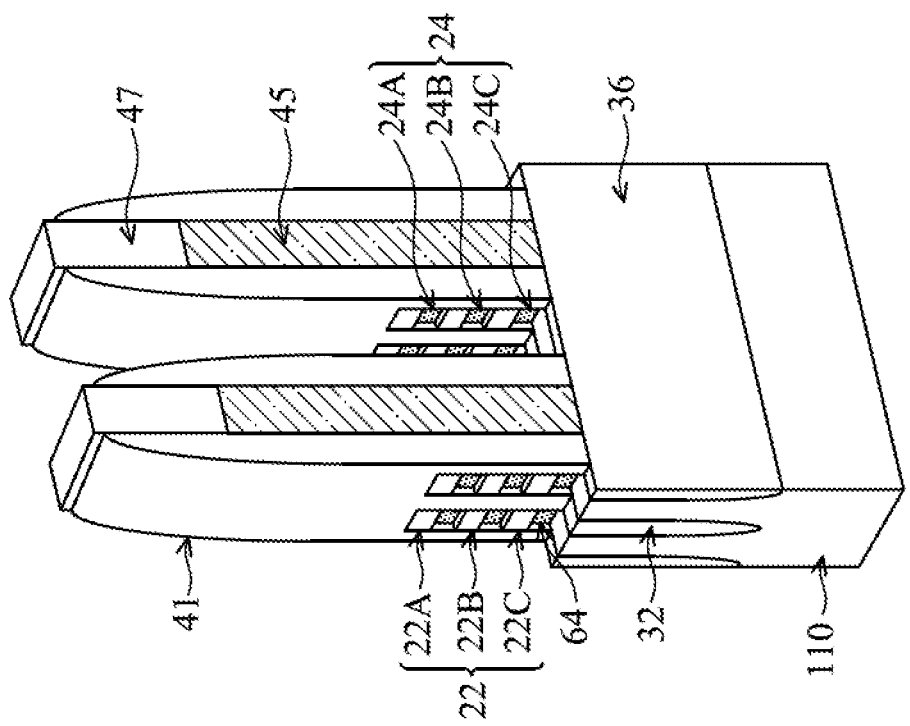
Figure 6C:
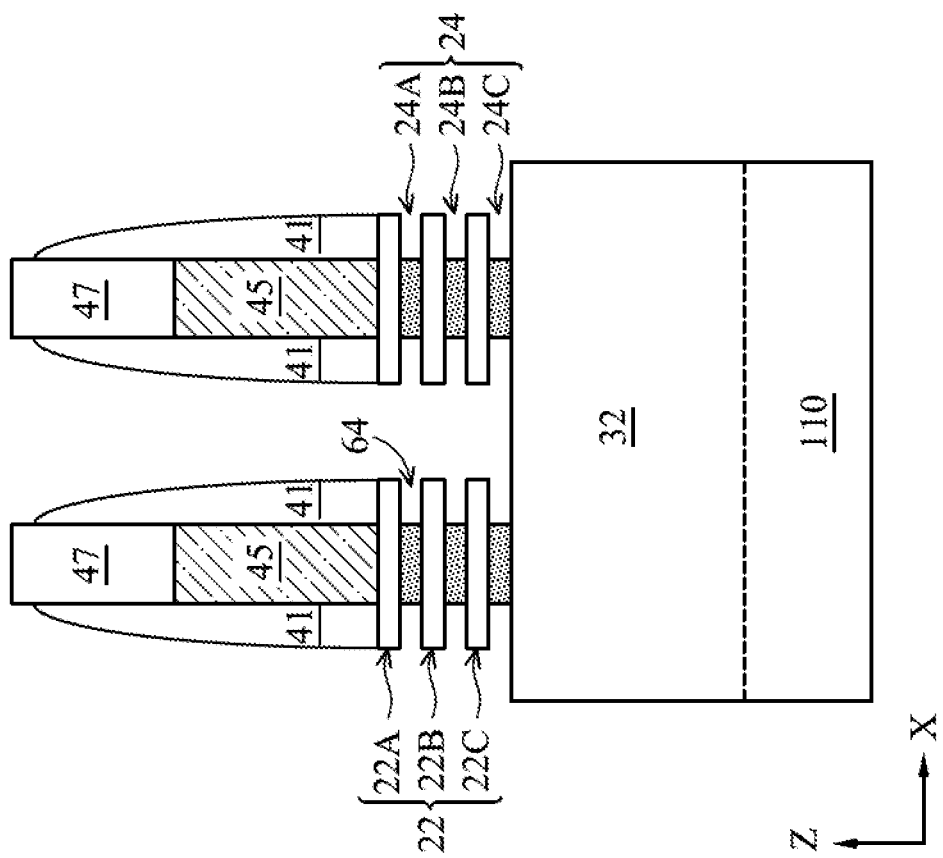
Figure 6B:
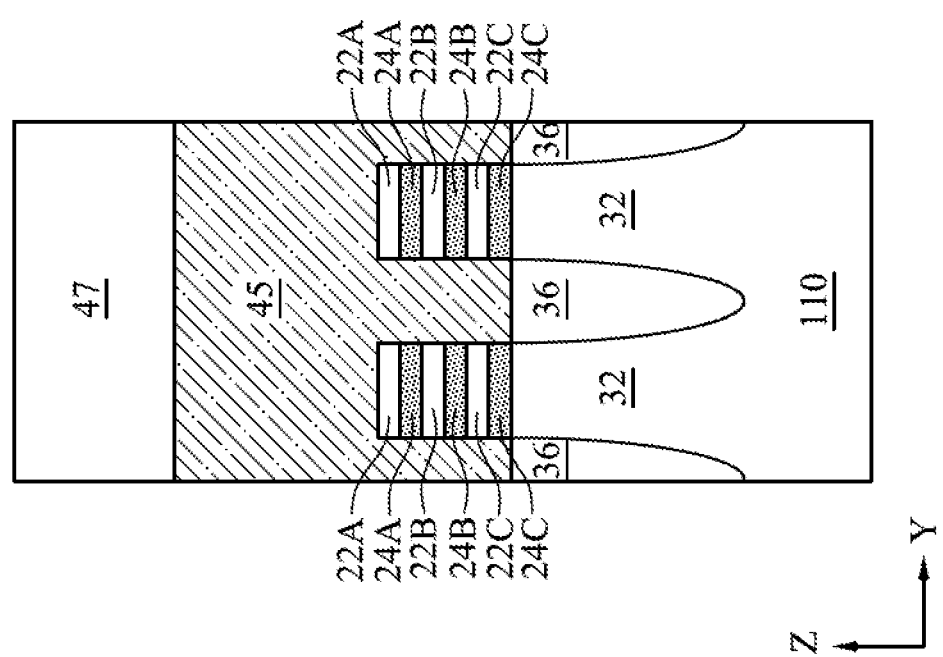

FIGS. 6A-6C and 7A-7C illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Figure 7C:
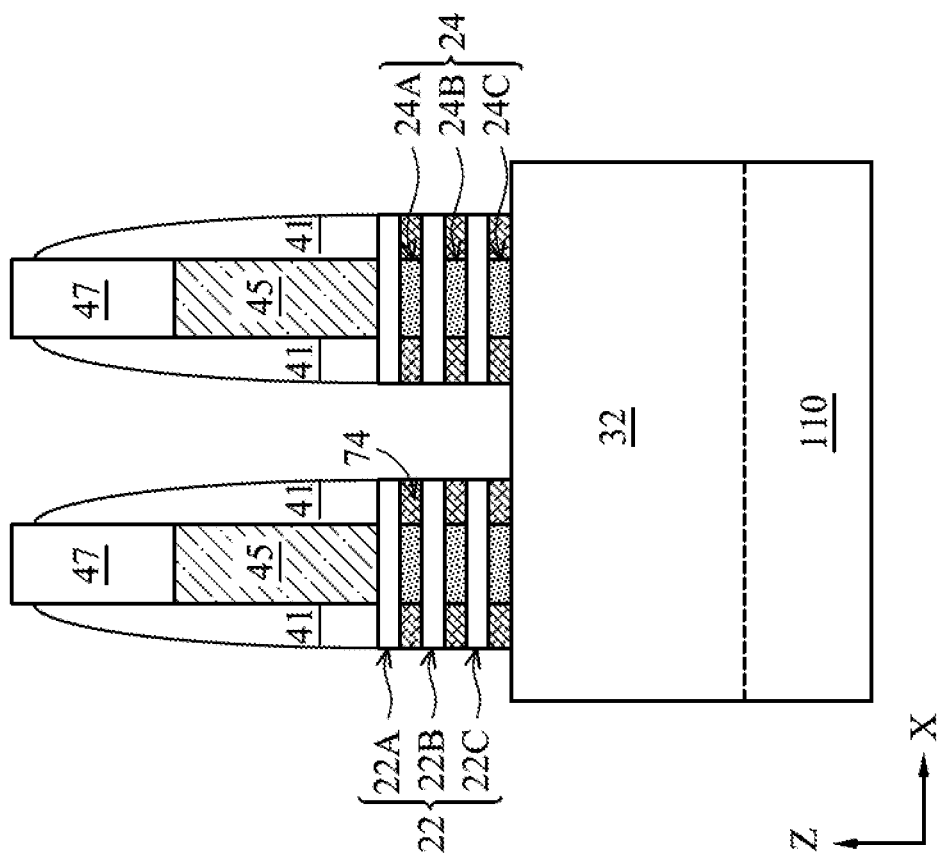
Figure 7B:
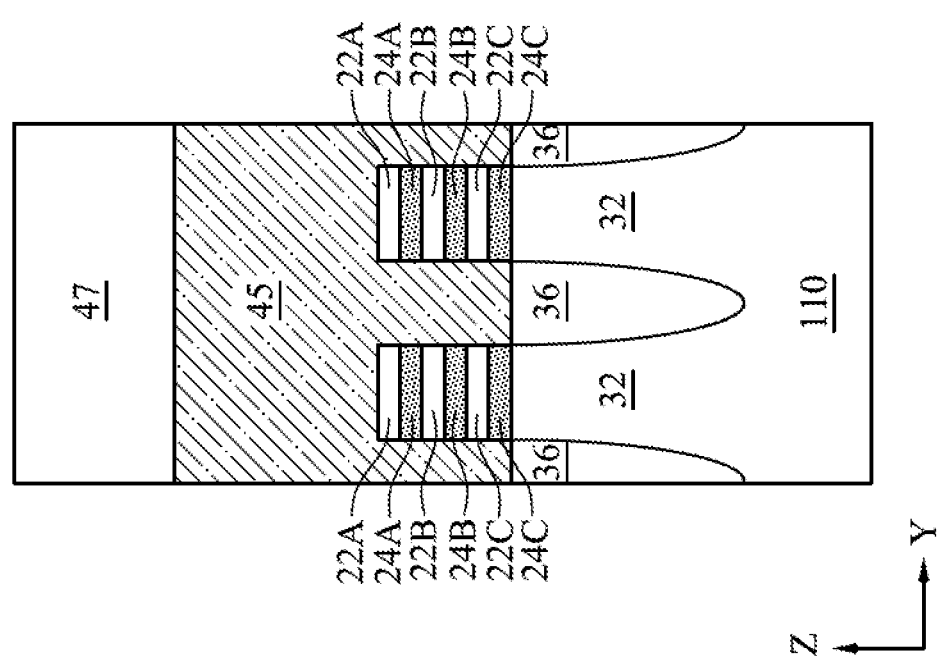
Figure 12A:
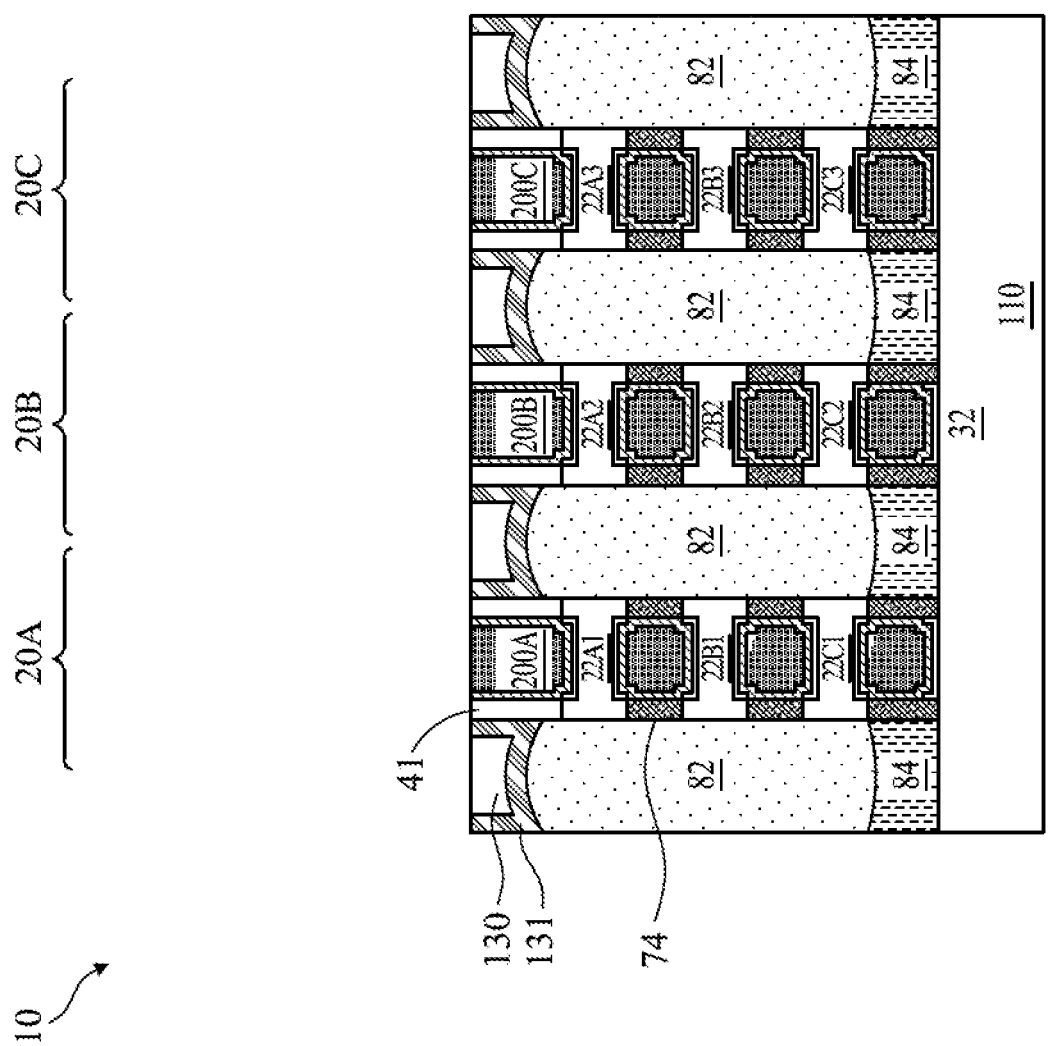
FIGS. 12A-25C are views of various embodiments of an IC device of at various stages of fabrication according to various aspects of the present disclosure.
Figure 12B:
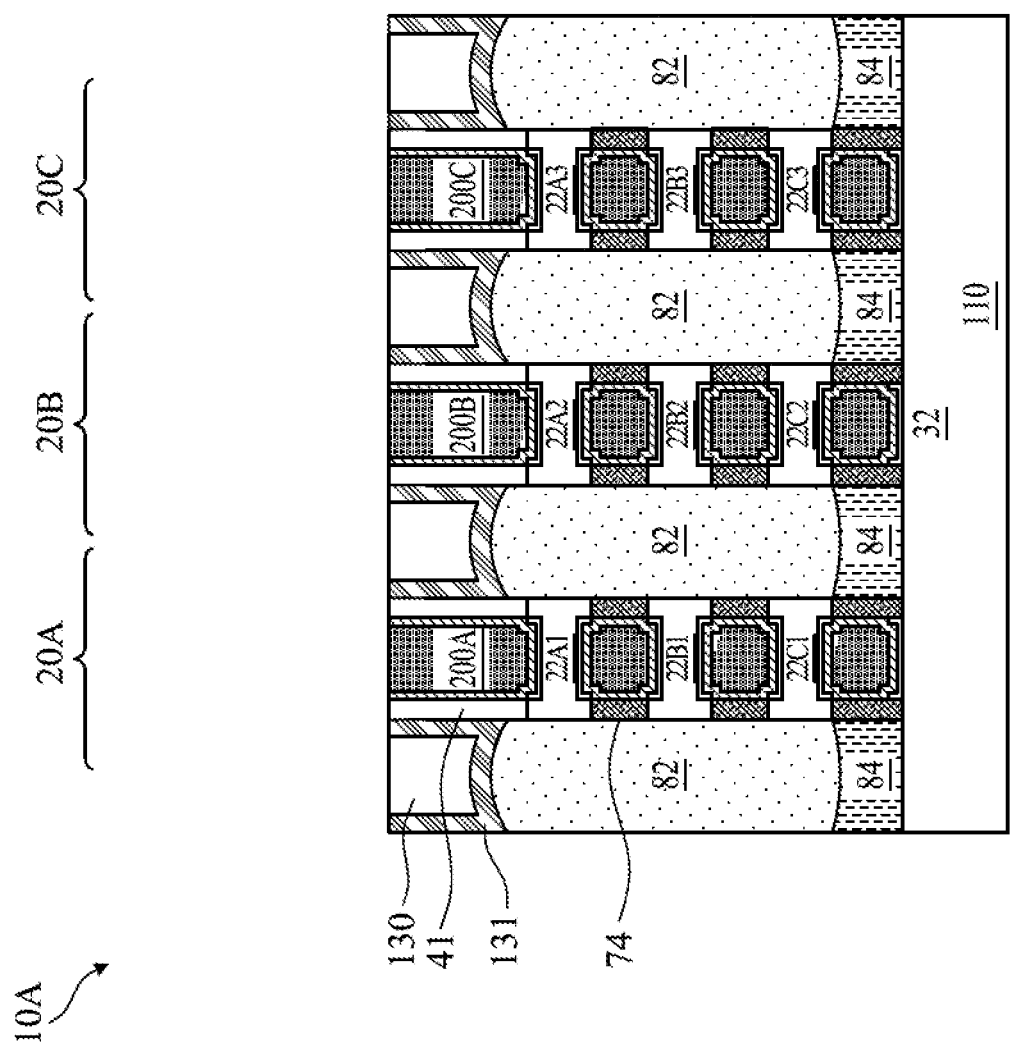
Figure 12C:
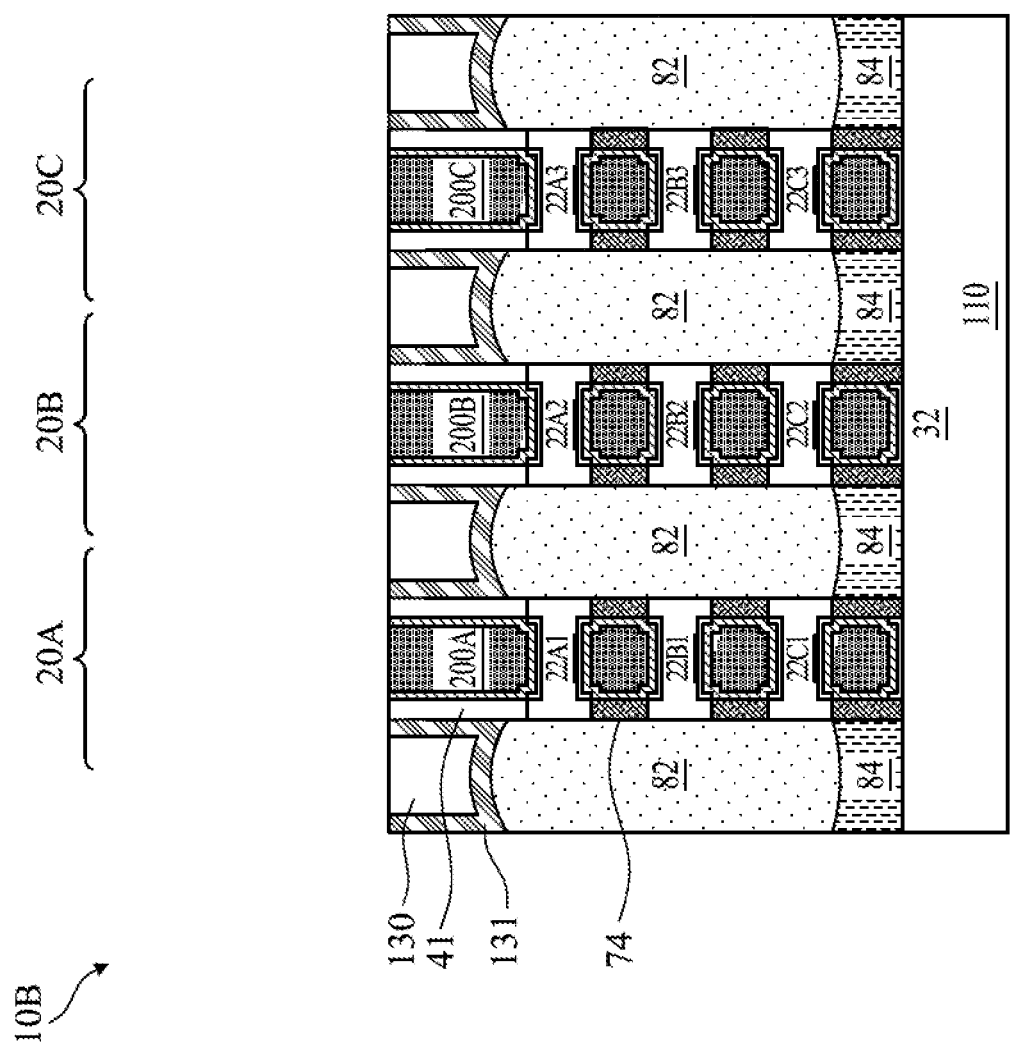

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C. The inner spacers 74 may have the same or different width in the X-axis direction from each other. For example, as shown in FIGS. 12A-12C, the inner spacers 74 all have the same width. In some embodiments, due to tapering of the channels 22 following etching in FIGS. 5A-5C, the inner spacers 74 have substantially the same width, and the remaining portions of the nanostructures 24 have increasing width toward the substrate 110.

In FIGS. 7A-7C, material of the inner spacer layer may be deposited in a region overlying the fin 32 between the stacks of nanostructures 22, 24 illustrated by a dashed line. In some embodiments, the material in the region illustrated by the dashed line in FIG. 7C is removed, as shown. In some embodiments, the material in the region is not removed, such that the bottom isolation structures 84 are formed between the stacks over the fin 32.

Figure 8A:
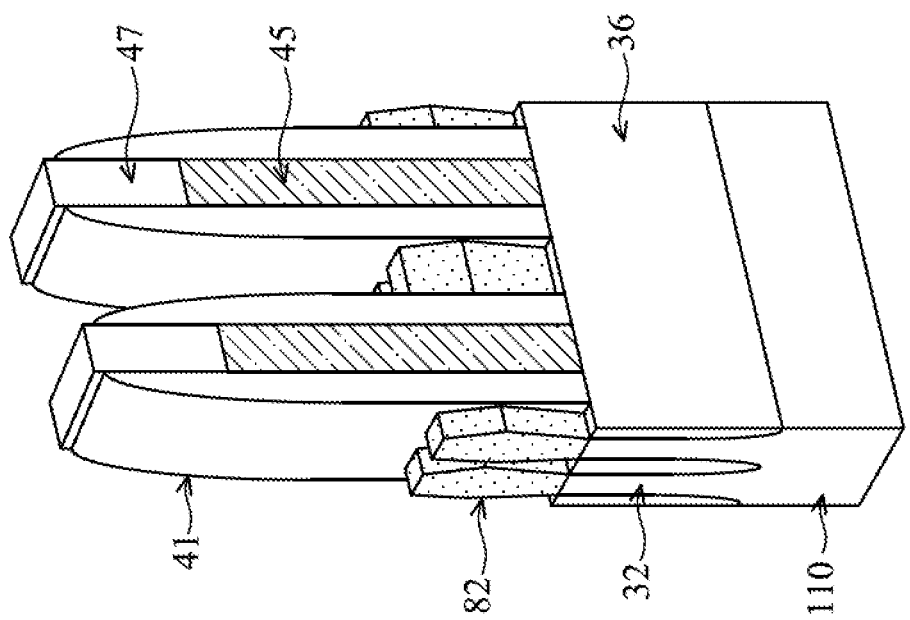
Figure 8A:
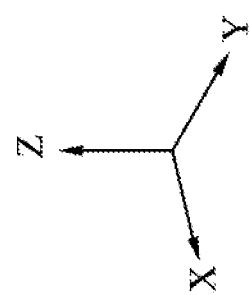
Figure 8C:
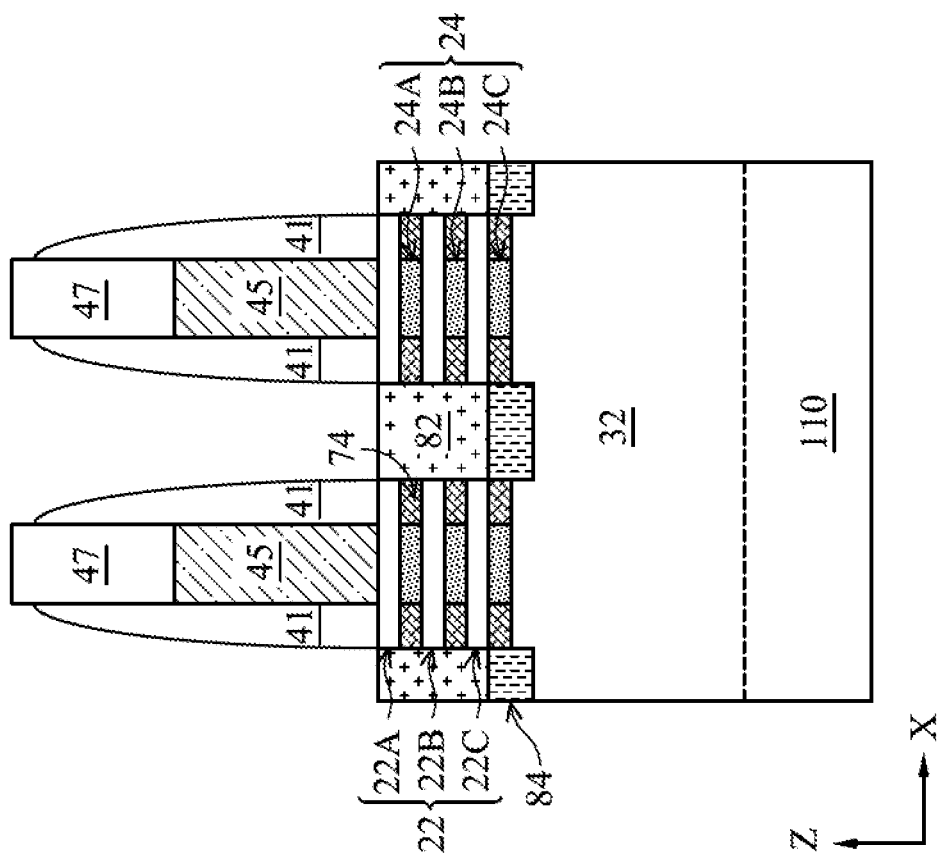
Figure 8B:
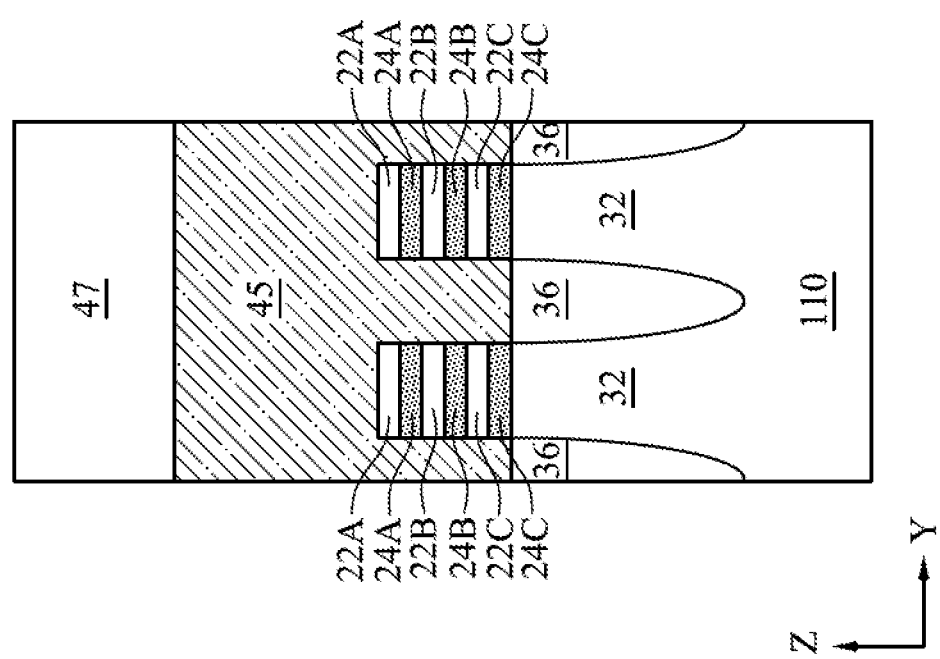

FIGS. 8A-8C illustrate formation of source/drain regions 82 corresponding to acts 1200, 2200, 3200 of FIGS. 31-33. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) 131 and interlayer dielectric (ILD) 130, shown in FIG. 11, may then be formed covering the dummy gate structures 40 and the source/drain regions 82. The CESL 131 and ILD 130 are omitted from FIGS. 8A-10C for simplicity of illustration.

FIG. 8C shows the bottom isolation structures 84. In some embodiments, the bottom isolation structures 84 are formed during formation of the inner spacers 74, as described above with reference to FIG. 7C. In some embodiments, the bottom isolation structures 84 are deposited after formation of the inner spacers 74. The source/drain regions 82 may be epitaxially grown following deposition of the bottom isolation structures 84.

Figure 9A:
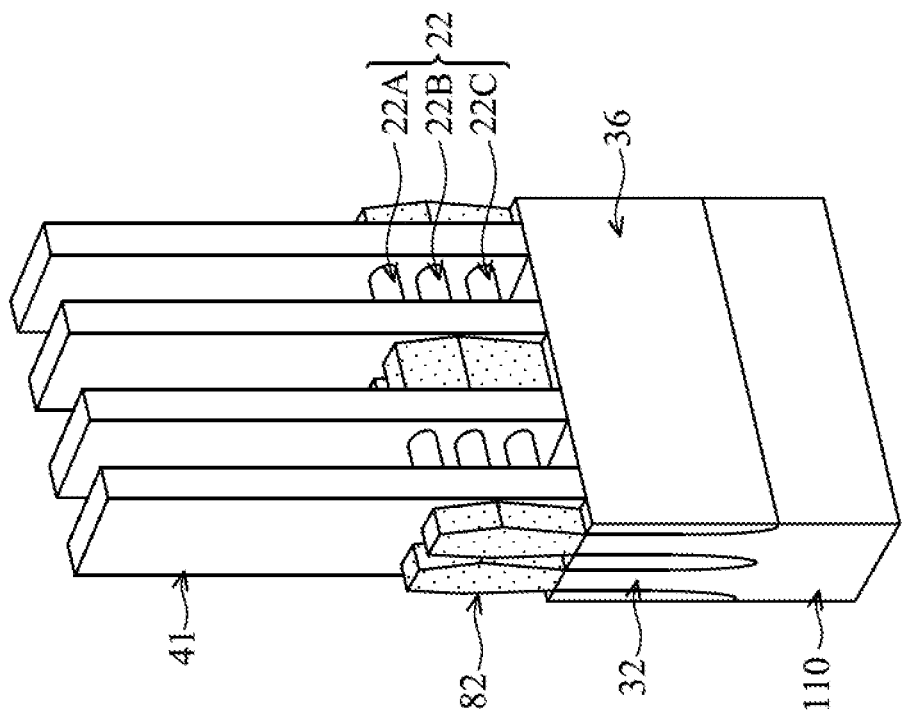
Figure 9C:
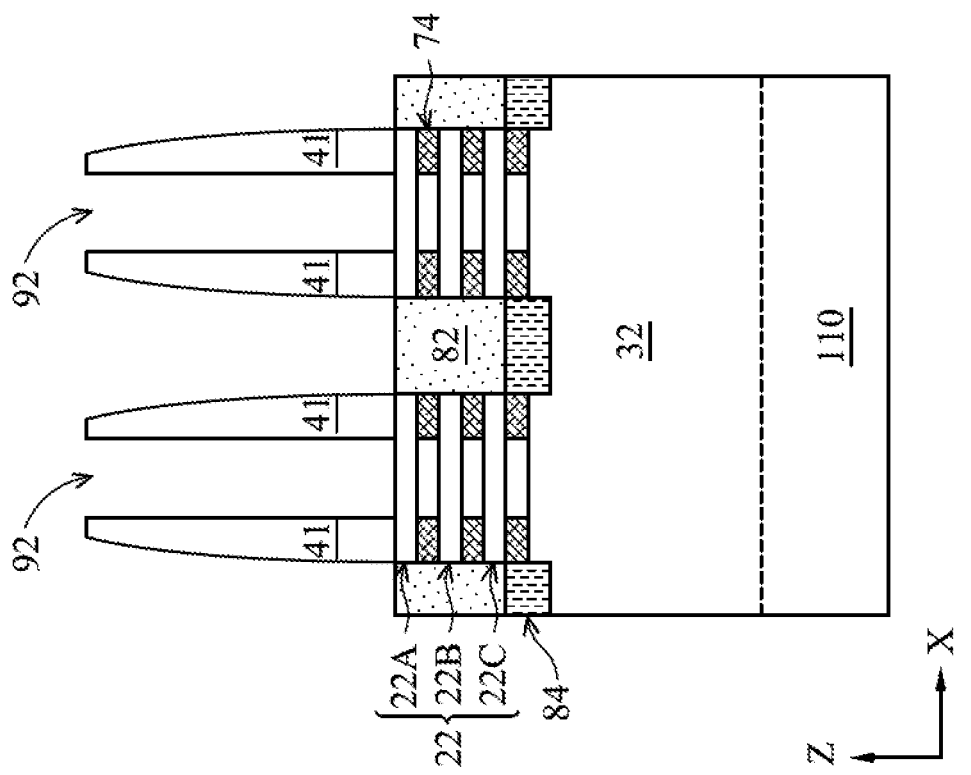
Figure 9B:
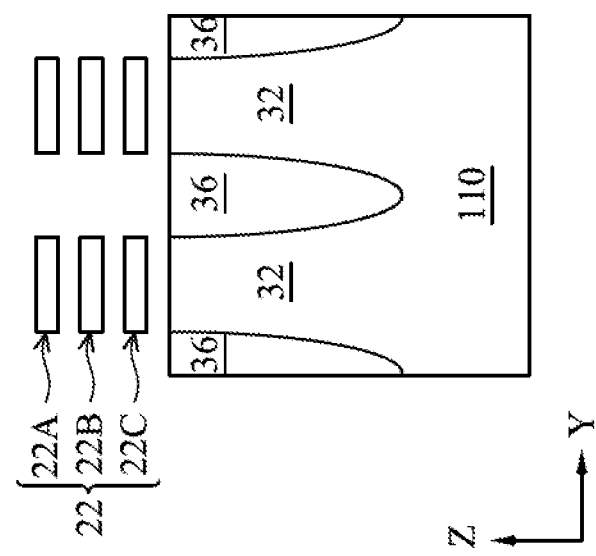

FIG. 9A, FIG. 9B, and FIG. 9C illustrate release of fin channels 22A-22C by removal of the nanostructures 24A-24C, the mask layer 47, and the dummy gate layer 45. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the nanostructure devices 20A-20C formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10C:
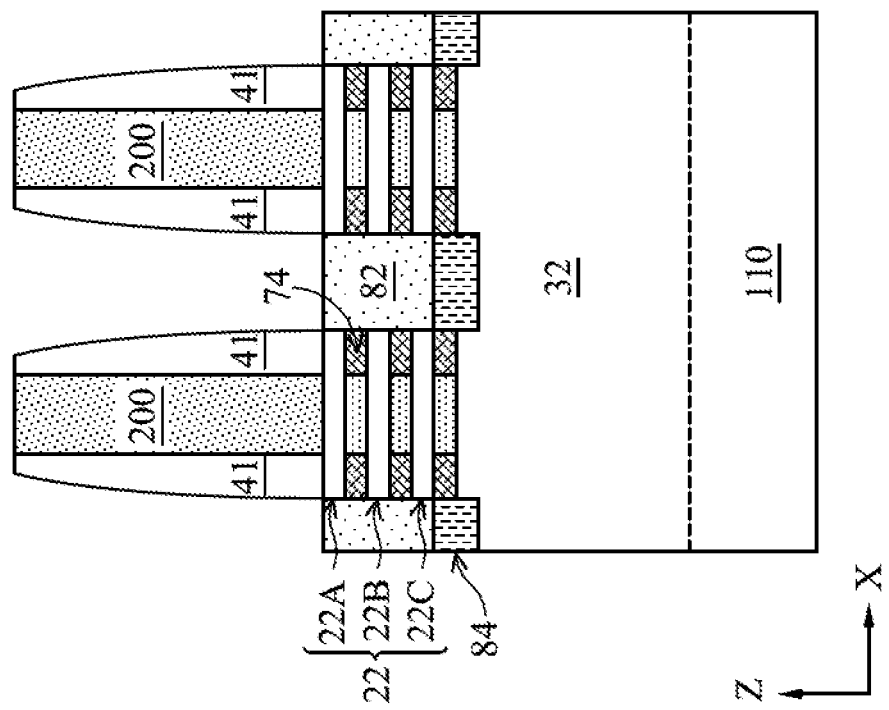
Figure 10B:
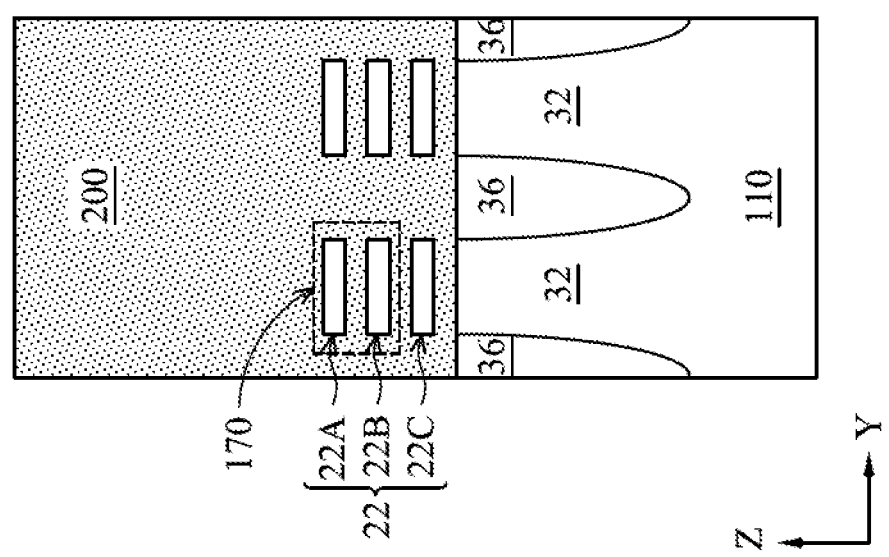

In FIGS. 10A-10C, replacement gates 200 are formed, corresponding to acts 1300, 2300, 3300 of FIGS. 31-33. The gate structure 200 generally includes the interfacial layer (IL, or "first IL") 210, at least one gate dielectric layer 600, the work function metal layer 900, and the gate fill layer 290. In some embodiments, each replacement gate 200 further includes at least one of a second interfacial layer 240 or a second work function layer 700. Detailed structure and formation of the gate structure 200 are described with reference to FIG. 1P.

Figure 11:
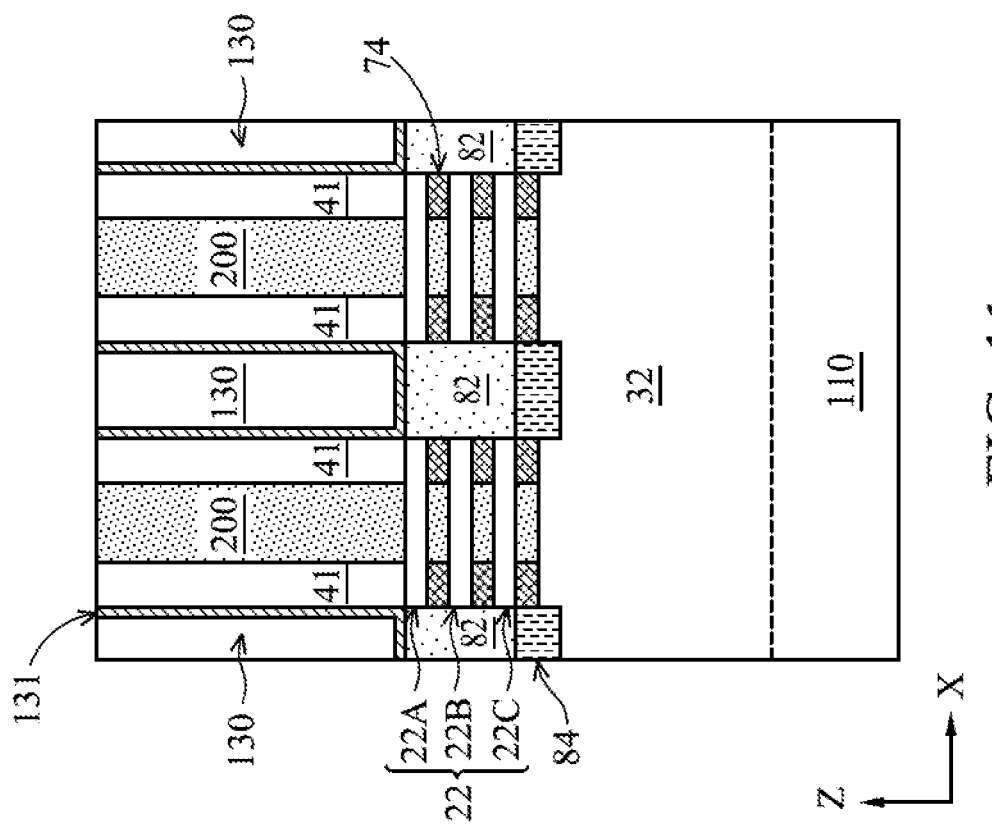

FIG. 11 shows the structure of FIG. 10C including the ILD 130 and the ESL 131. In some embodiments, the ESL 131 is formed following formation of the source/drain regions 82, and prior to removal of the sacrificial gate layer 45. The ILD 130 is formed on the ESL 131.

FIGS. 12A-25C illustrate formation of the source/drain contacts 120, the source/drain vias 183 and the gate via 184 in accordance with various embodiments.

FIGS. 12A, 13A, 14A, 15A, 16A, 17A, 18A, 19A, 20A, 21A, 22A, 23A, 24A and 25A illustrate formation of a portion of an IC device (e.g., the IC device 10) in which the gate capping layer 295 and source/drain capping layer 395 are not present. FIGS. 12B, 13B, 14B, 15B, 16B, 17B, 18B, 19B, 20B, 21B, 22B, 23B, 24B and 25B illustrate formation of a portion of an IC device (e.g., the IC device 10A) in which the gate capping layer 295 is present, and the source/drain capping layer 395 is not present. FIGS. 12C, 13C, 14C, 15C, 16C, 17C, 18C, 19C, 20C, 21C, 22C, 23C, 24C and 25C illustrate formation of a portion of an IC device (e.g., the IC device 10B) in which the gate capping layer 295 and the source/drain capping layer 395 are present. FIG. 18D illustrates formation of the second liner layer 120B of the source/drain contacts 120 in accordance with various embodiments. FIGS. 20D and 20E illustrate formation of the source/drain capping layers 395 in accordance with various embodiments.

FIGS. 12A-12C illustrate the portions of the IC devices 10, 10A, 10B following formation of the nanostructure devices 20A-20C, which may be formed in a manner similar in many respects to that described with reference to FIGS. 2A-11.

Figure 13A:
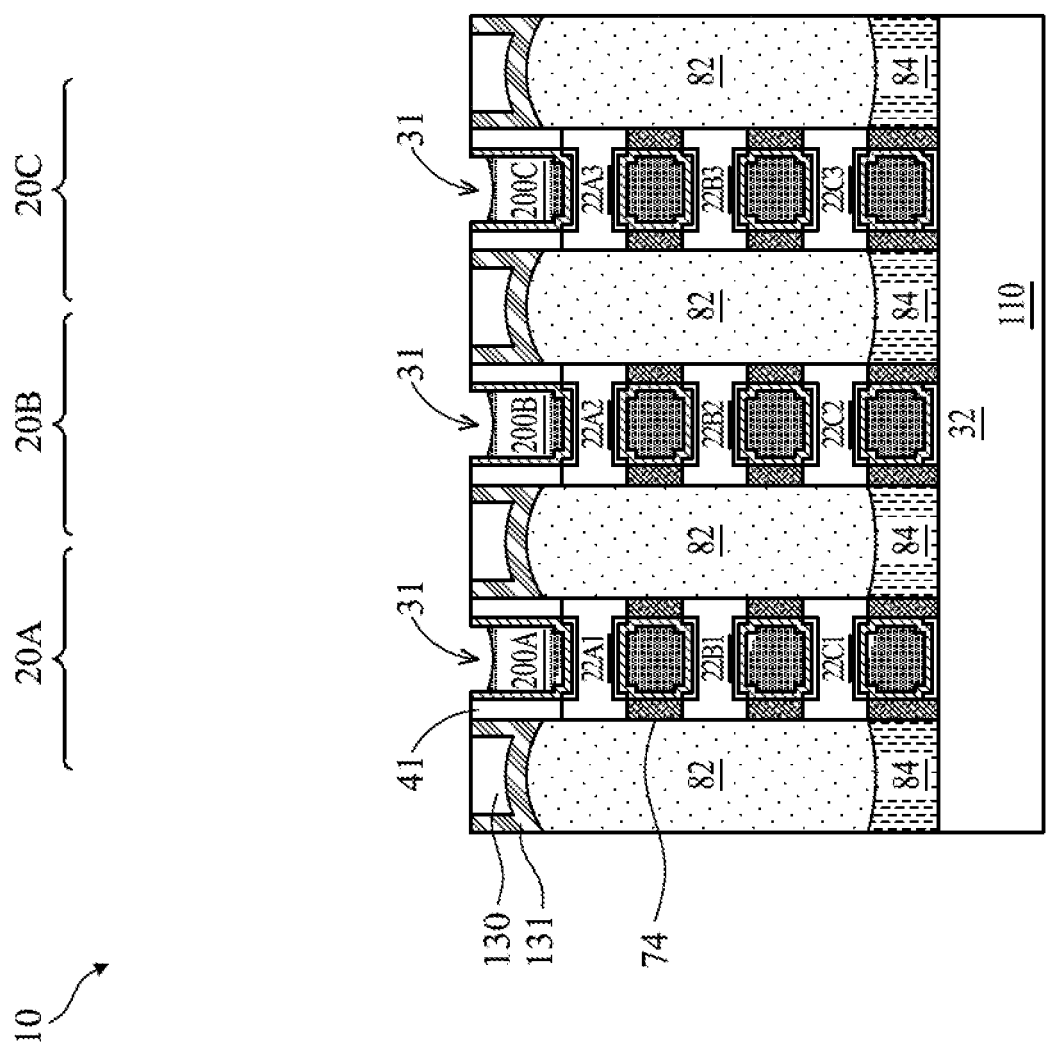
Figure 13B:
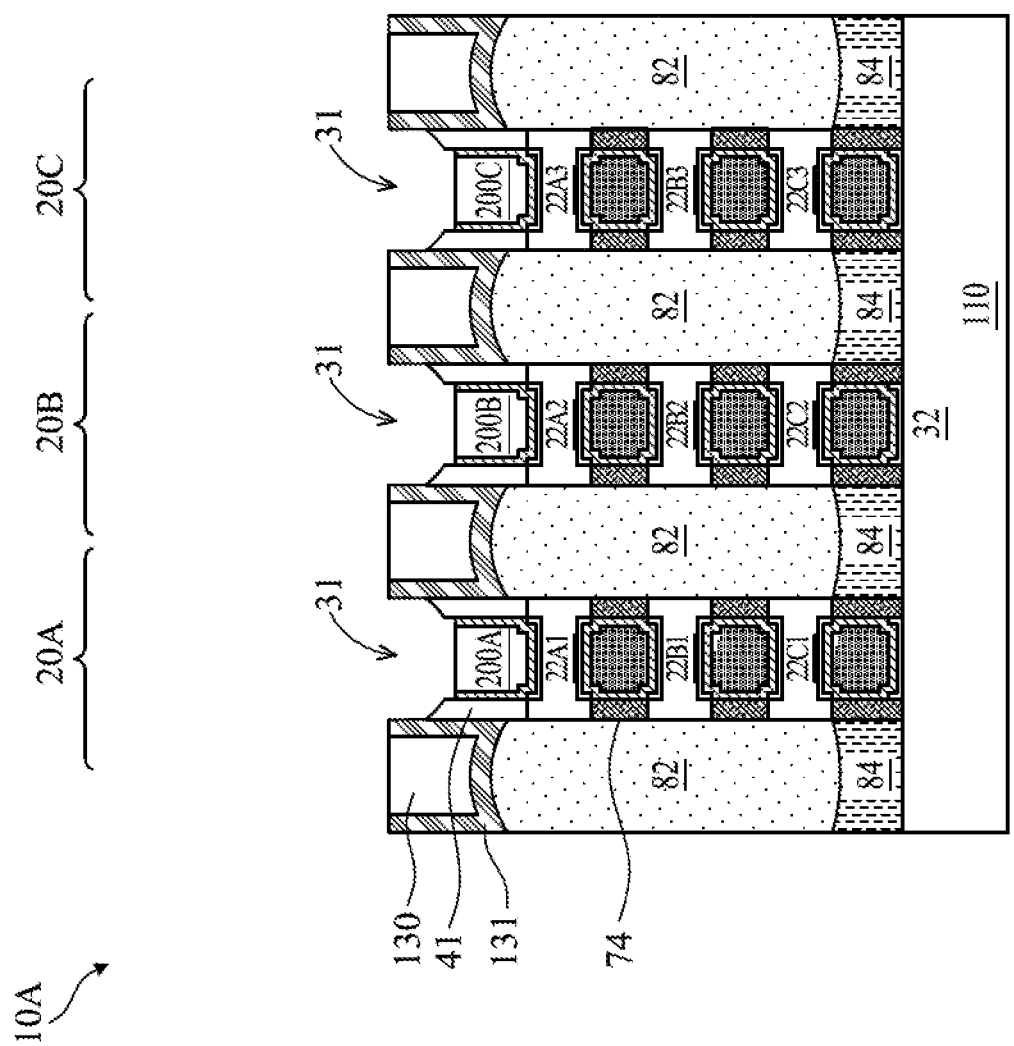
Figure 13C:
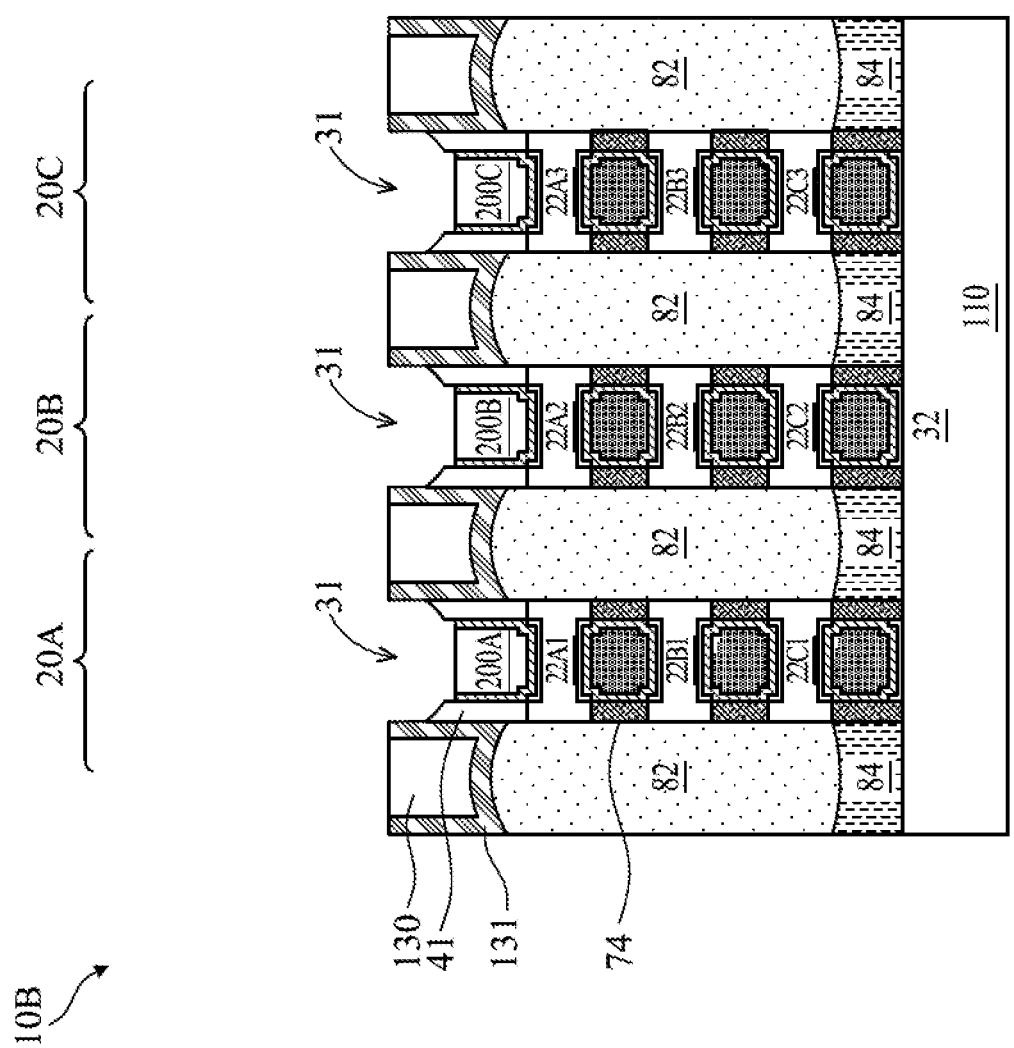

In FIGS. 13A-13C, the gate structures 200A-200C are recessed to form first openings 31 in preparation for forming the conductive layers 204. The gate structures 200A-200C may be recessed by removing material of the core layer 290 in a removal process (e.g., an etch) that is selective to material of the core layer 290.

Figure 14A:
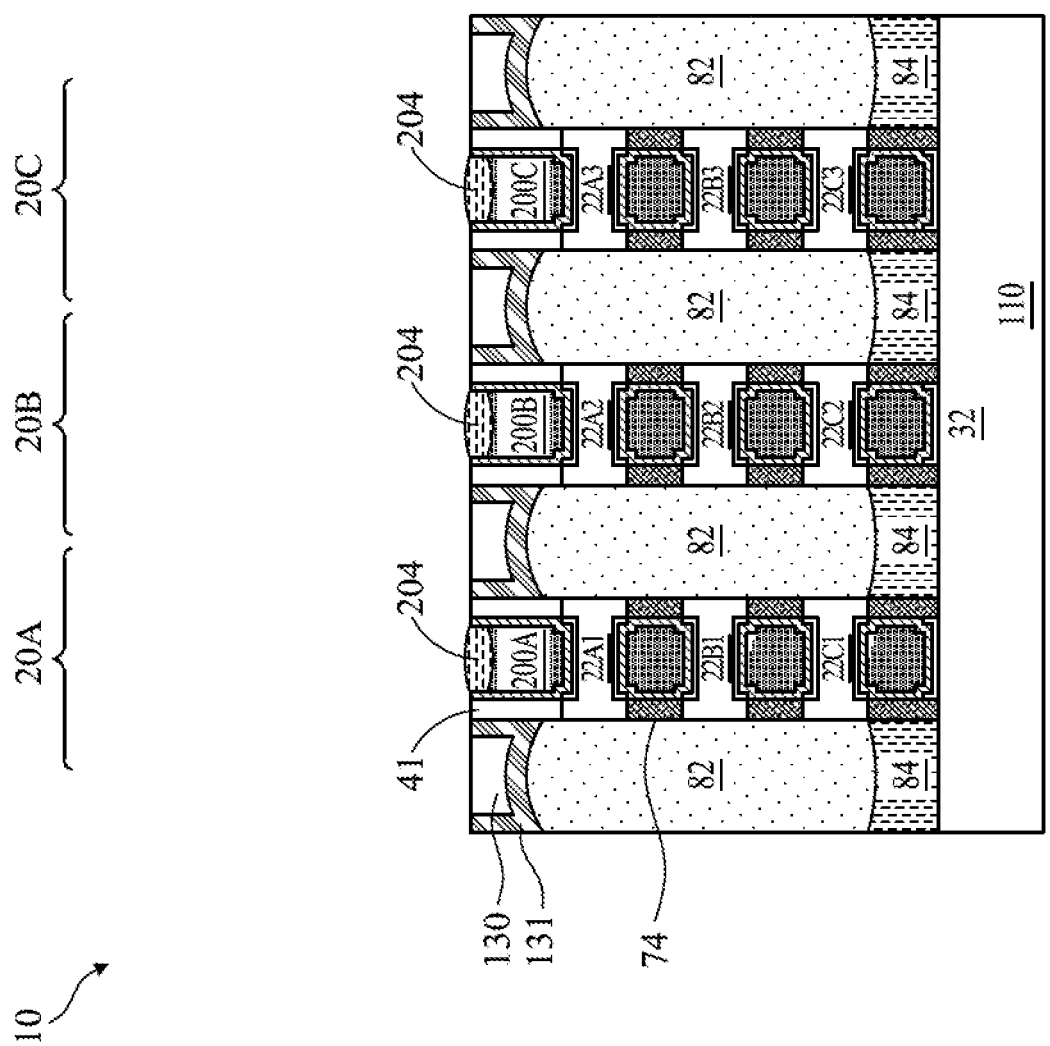
Figure 14B:
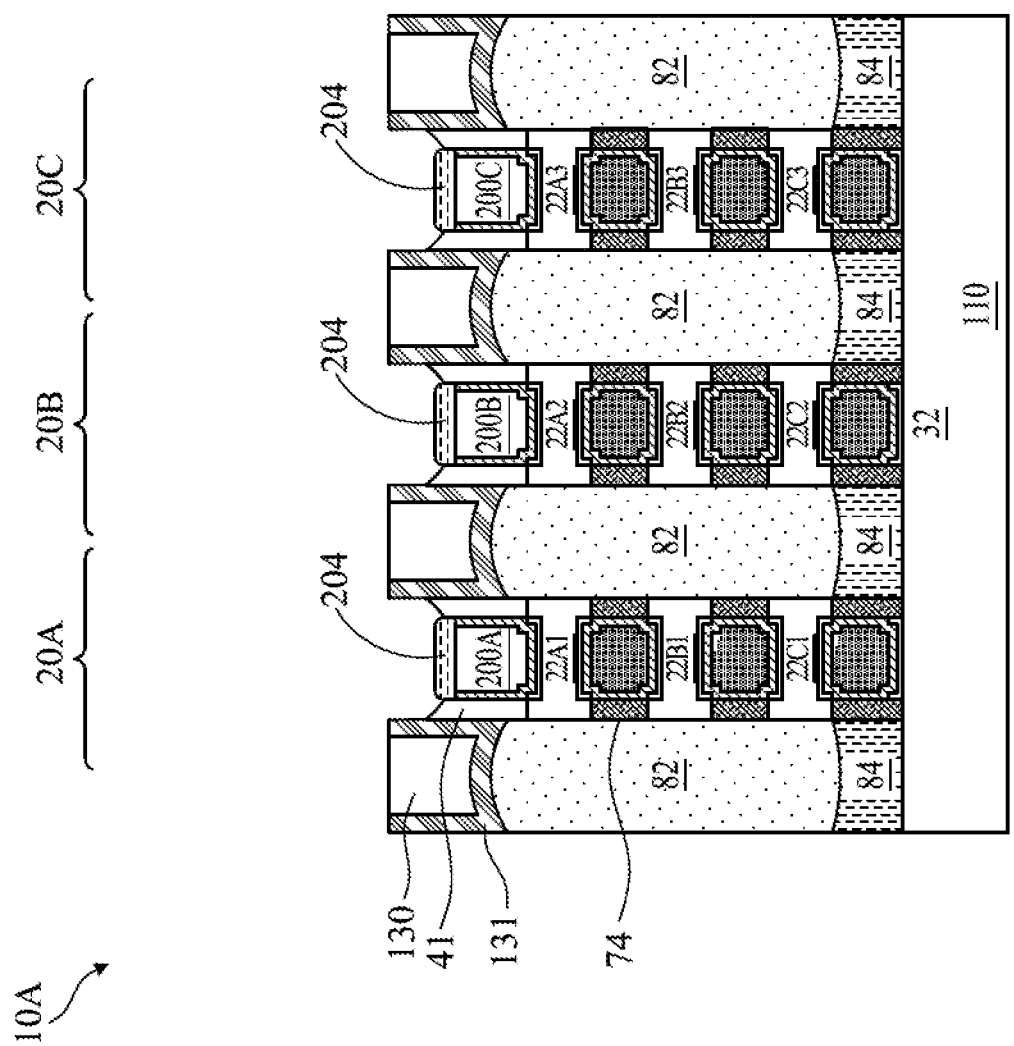
Figure 14C:
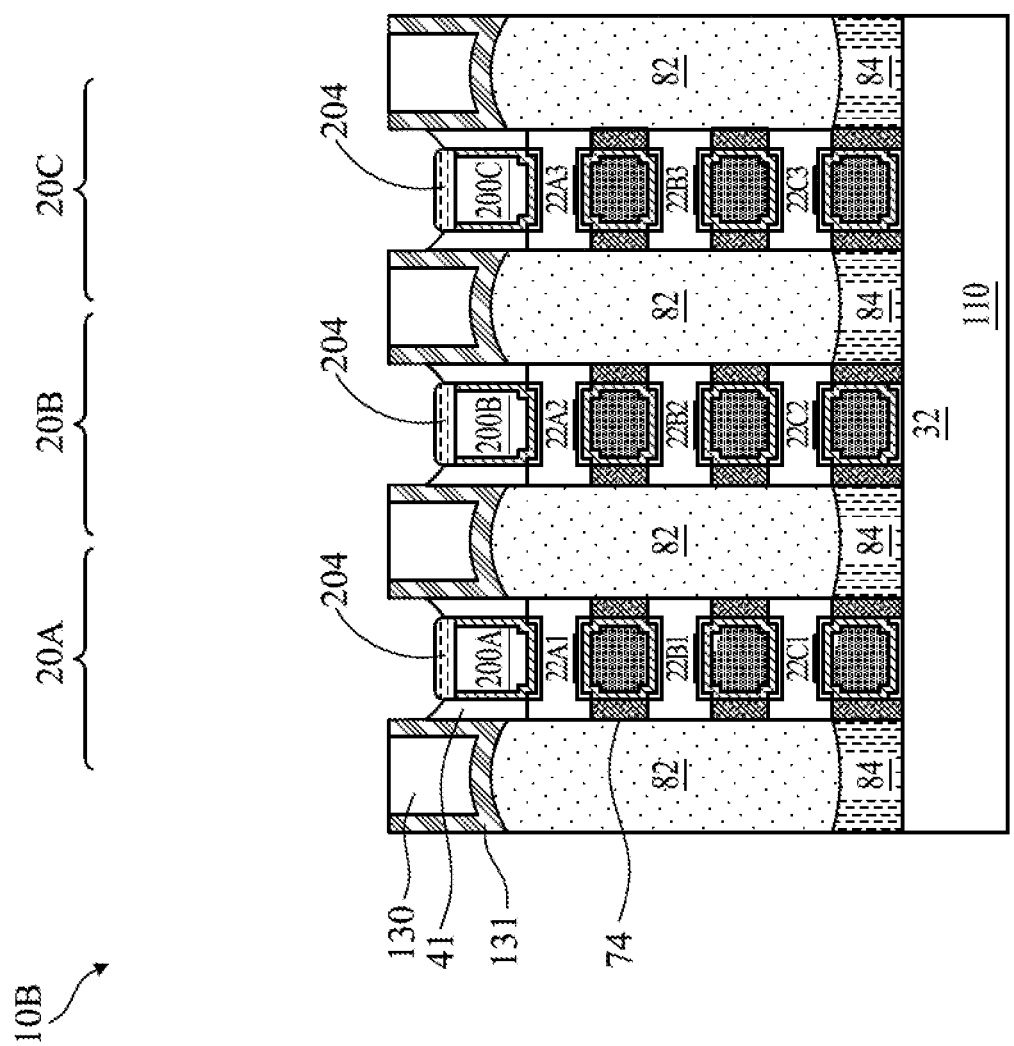

In FIGS. 14A-14C, the conductive layer 204 is formed over the gate structures 200A-200C. The conductive layer 204 reduces contact resistance between the gate via 184 to be formed and the core layer 290. The conductive layer 204 may be formed by depositing any of the materials listed by a suitable deposition process, such as PVD, CVD, ALD or the like. For example, a suitable selective deposition process, such as an ALD process, may be performed to flow $WCl_5$ and $H_2$ at a temperature of about 200° C. to about 500° C. and a pressure of about 5 Torr to about 30 Torr. The ALD process may be performed to flow $MoCl_5$ and $H_2$ (instead of $WCl_5$ and $H_2$) at a temperature of about 200° C. to about 500° C. and a pressure of about 5 Torr to about 30 Torr.

Figure 15A:
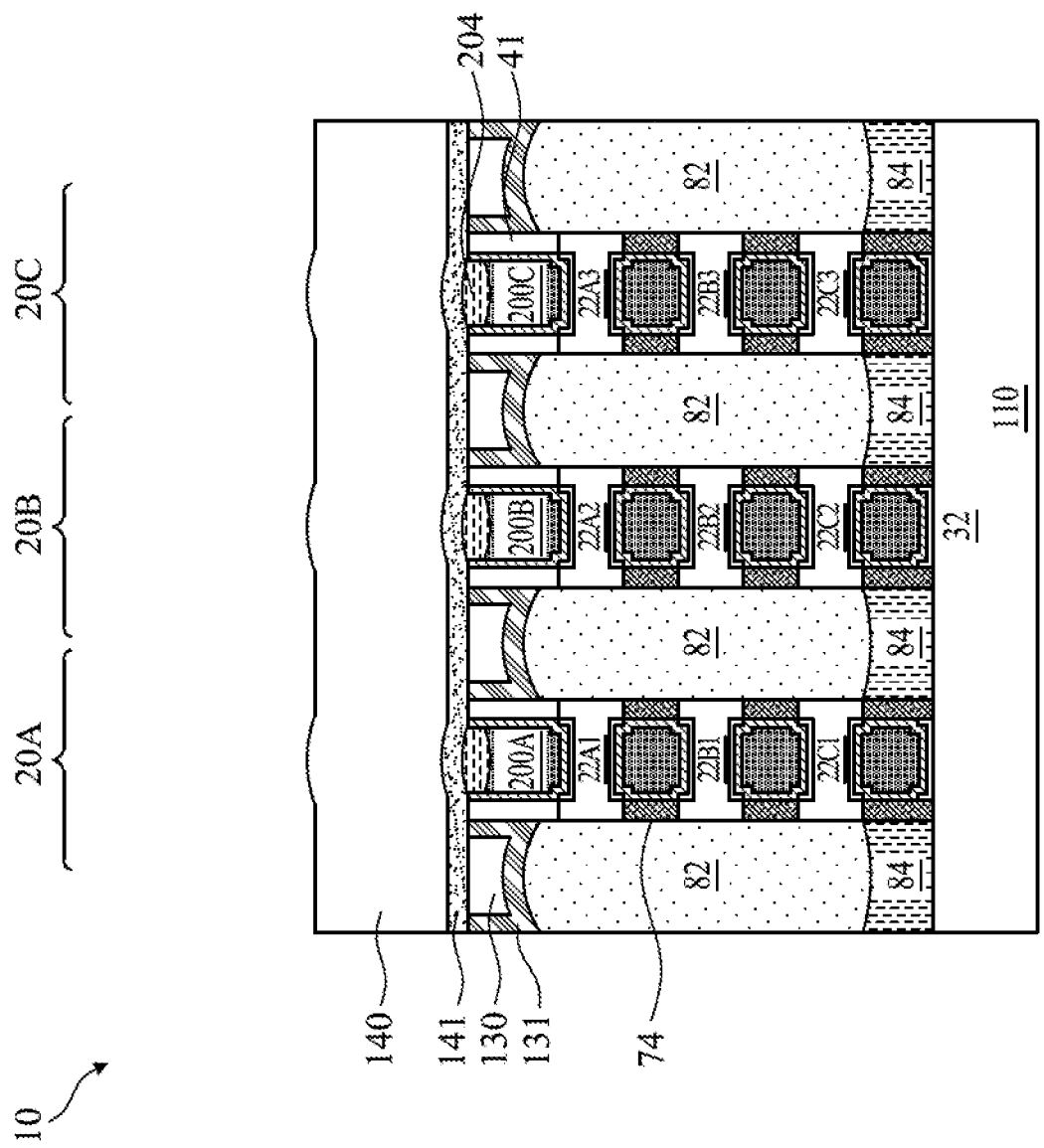
Figure 15B:
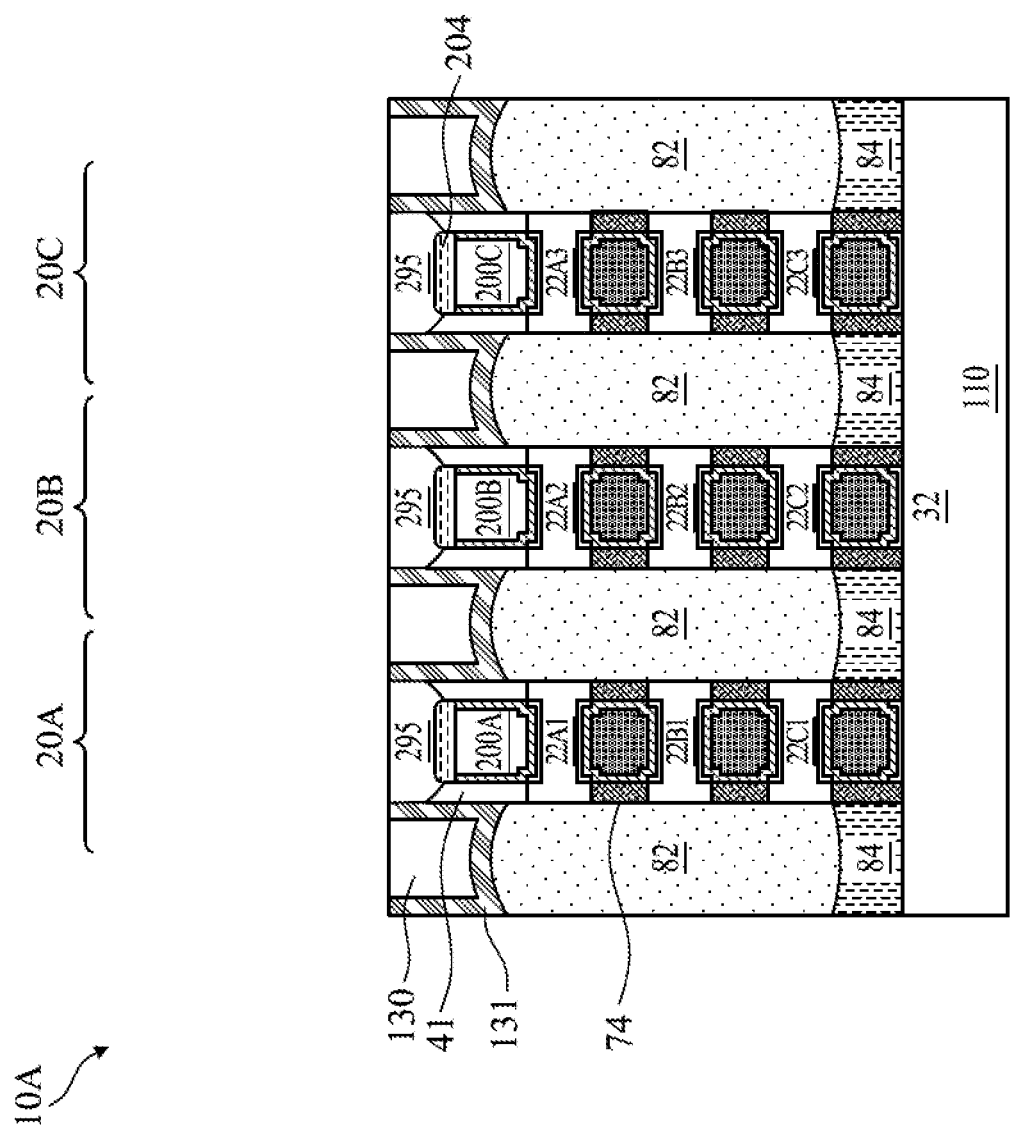
Figure 15C:
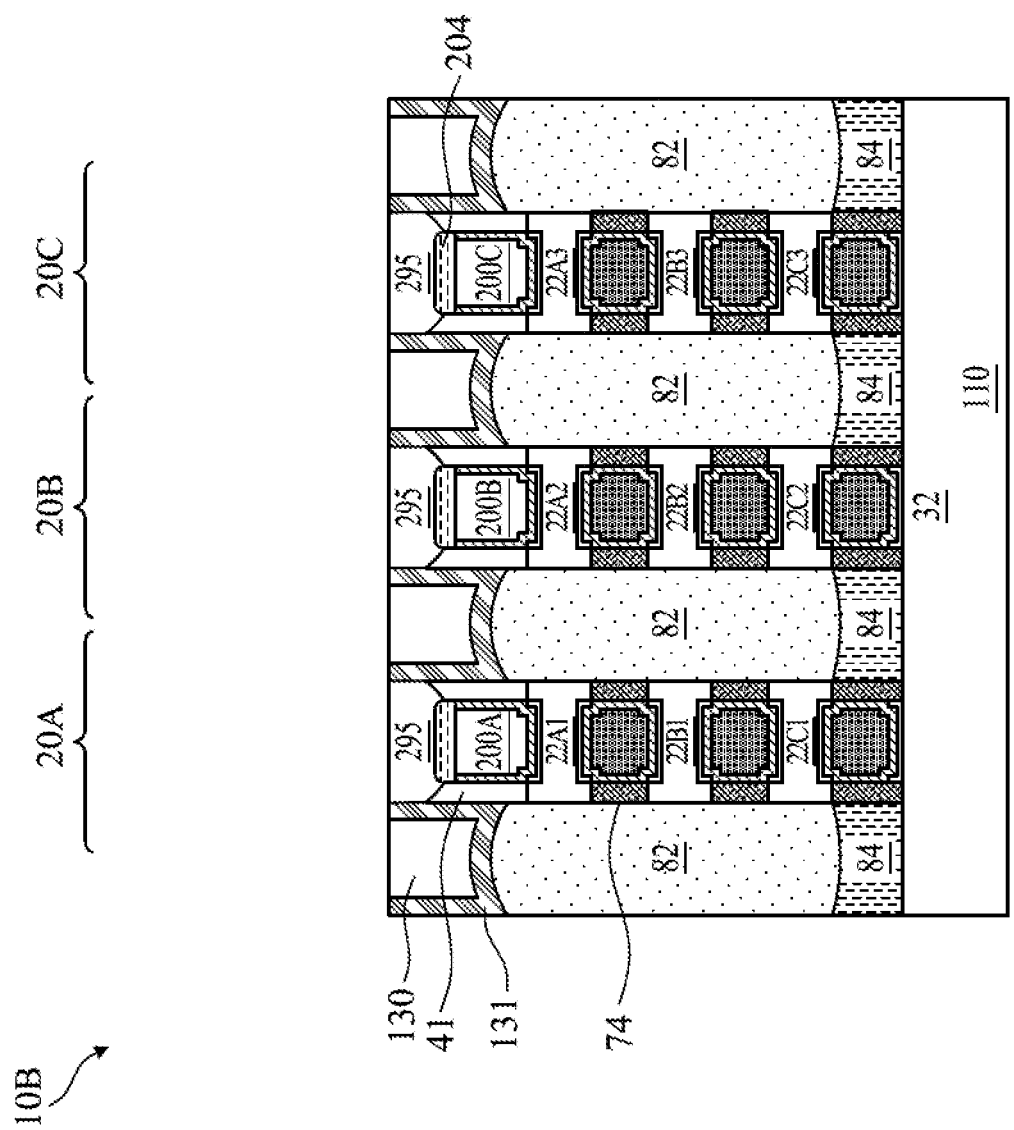

In FIGS. 15A-15C, the second ILD and second ESL 140, 141 (FIG. 15A) or the gate capping layers 295 (FIGS. 15B, 15C) are formed.

In FIG. 15A, the second ILD and second ESL 140, 141 are formed over the conductive layers 204, the gate spacers 41 and the ILD and ESL 130, 131. The second ESL 141 may be formed as a conformal thin layer of dielectric material (e.g., SiN) by a suitable deposition process, such as an ALD, CVD, PVD or the like. Following formation of the second ESL 141, the second ILD 140 may be formed on the second ESL 141. The second ILD 140 may be formed to a thickness greater than that of the second ESL 141 and the ILD 130. The second ESL 141 may be formed of silicon oxide, silicon nitride, silicon carbo-nitride, or the like, and may be formed using CVD, ALD, or the like. The second ILD 140 may include a dielectric material formed using, for example, FCVD, spin-on coating, CVD, or another deposition method. The second ILD 140 may be formed of an oxygen-containing dielectric material, which may be a silicon-oxide based oxide such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. In some embodiments, a planarization process such as a CMP process or a mechanical grinding process may be performed to level the top surface of the second ILD 140.

In FIGS. 15B and 15C, the gate capping layers 295 are formed. In some embodiments, the gate capping layers 295 are formed over respective gate structures 200A-200C using, for example, a deposition process to deposit a dielectric material over the substrate 110, followed by a CMP process to remove excess dielectric material outside the openings 31 (see FIGS. 13B, 13C). In some embodiments, the gate capping layers 295 include silicon nitride or other suitable dielectric material. The gate capping layers 295 have different etch selectivity than one or more of the gate spacers 41, the etch stop layer 131, and the ILD 130. By way of example, if the gate capping layers 295 are SiN, the gate spacers 41, the etch stop layer 131, and the ILD 130 may be dielectric materials different from SiN. The gate capping layers 295 can be used to form self-aligned contact or capping (SAC) regions, and thus may be referred to as SAC structures or a SAC layer.

Figure 16A:
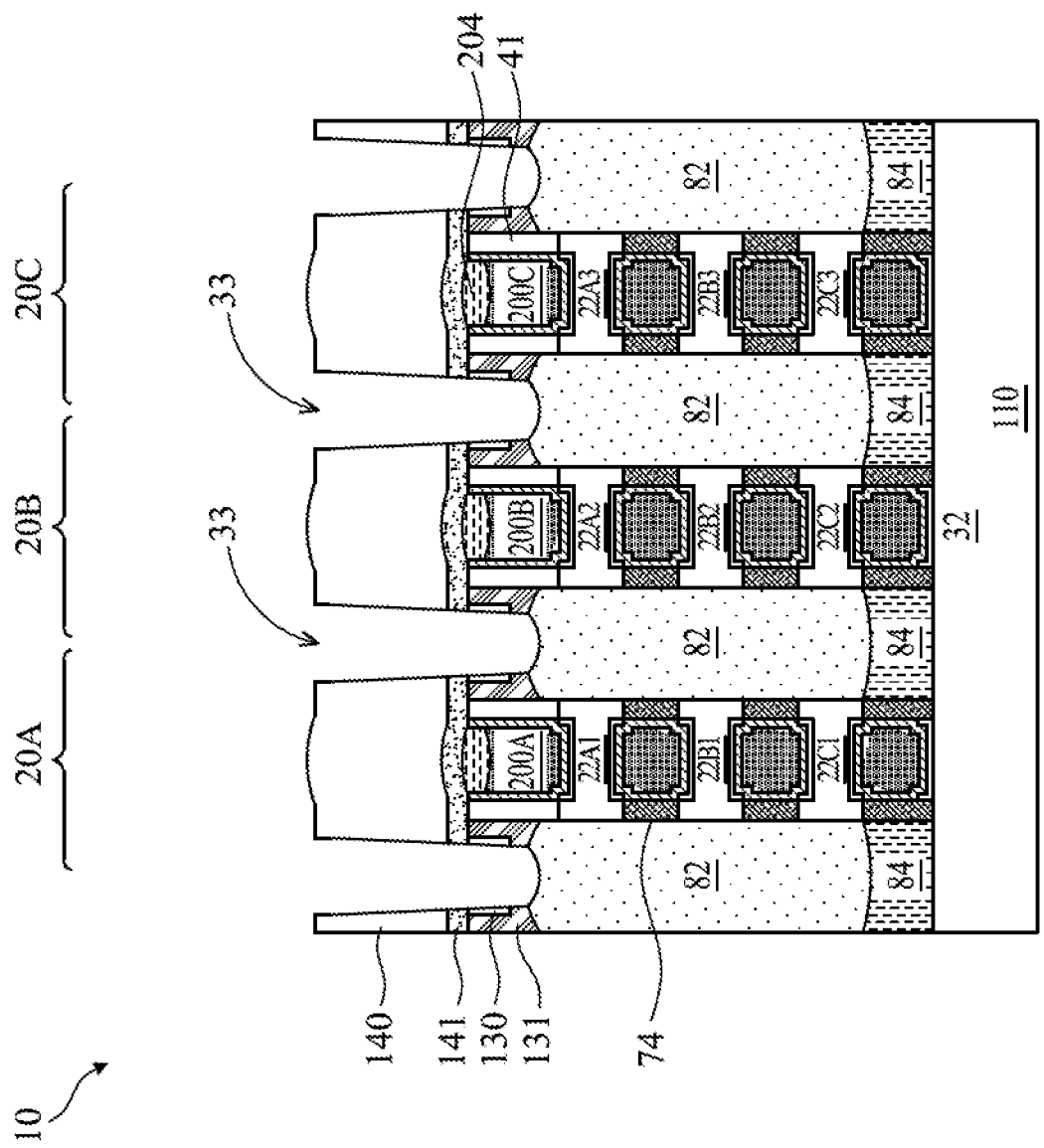
Figure 16B:
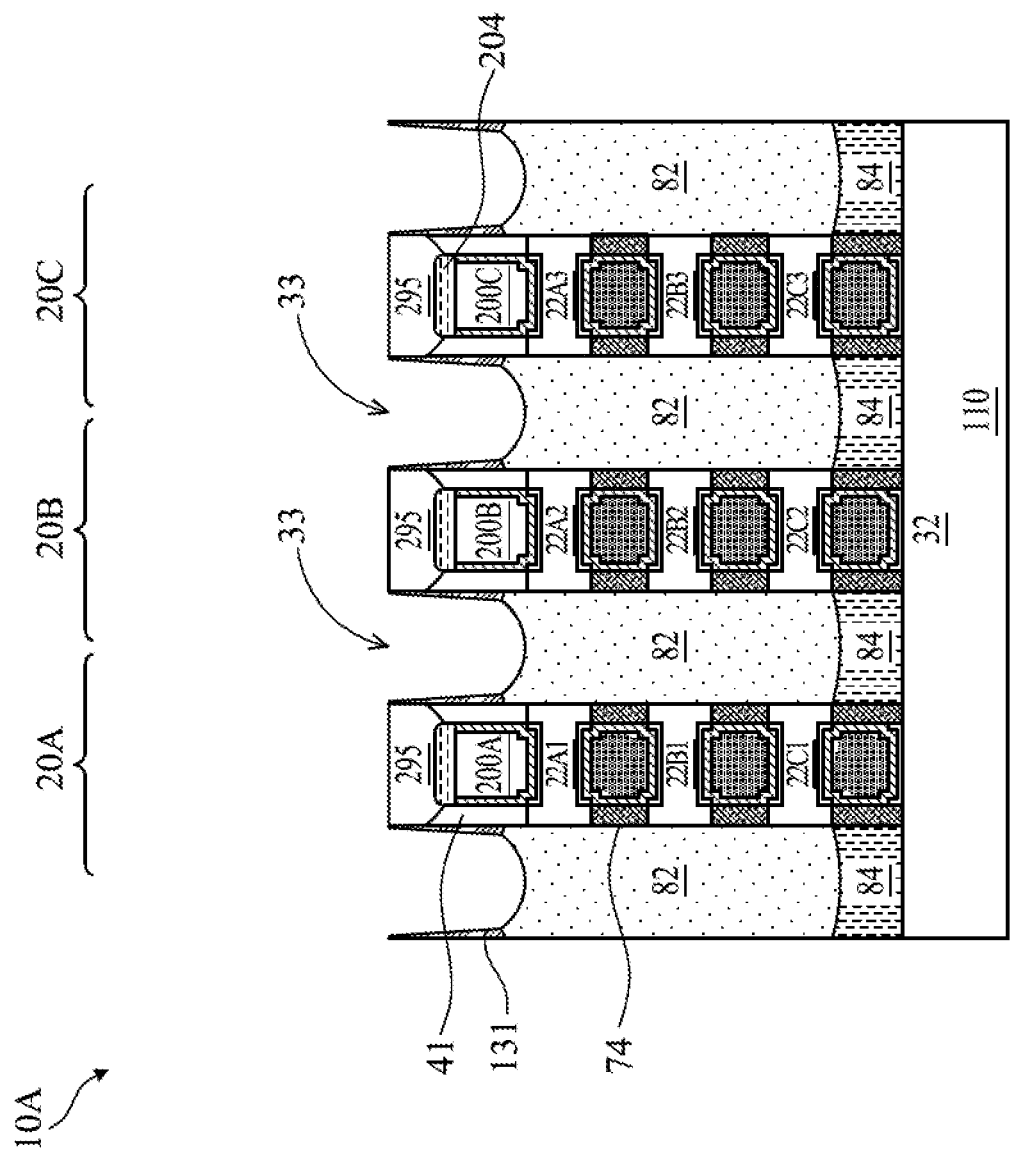
Figure 16C:
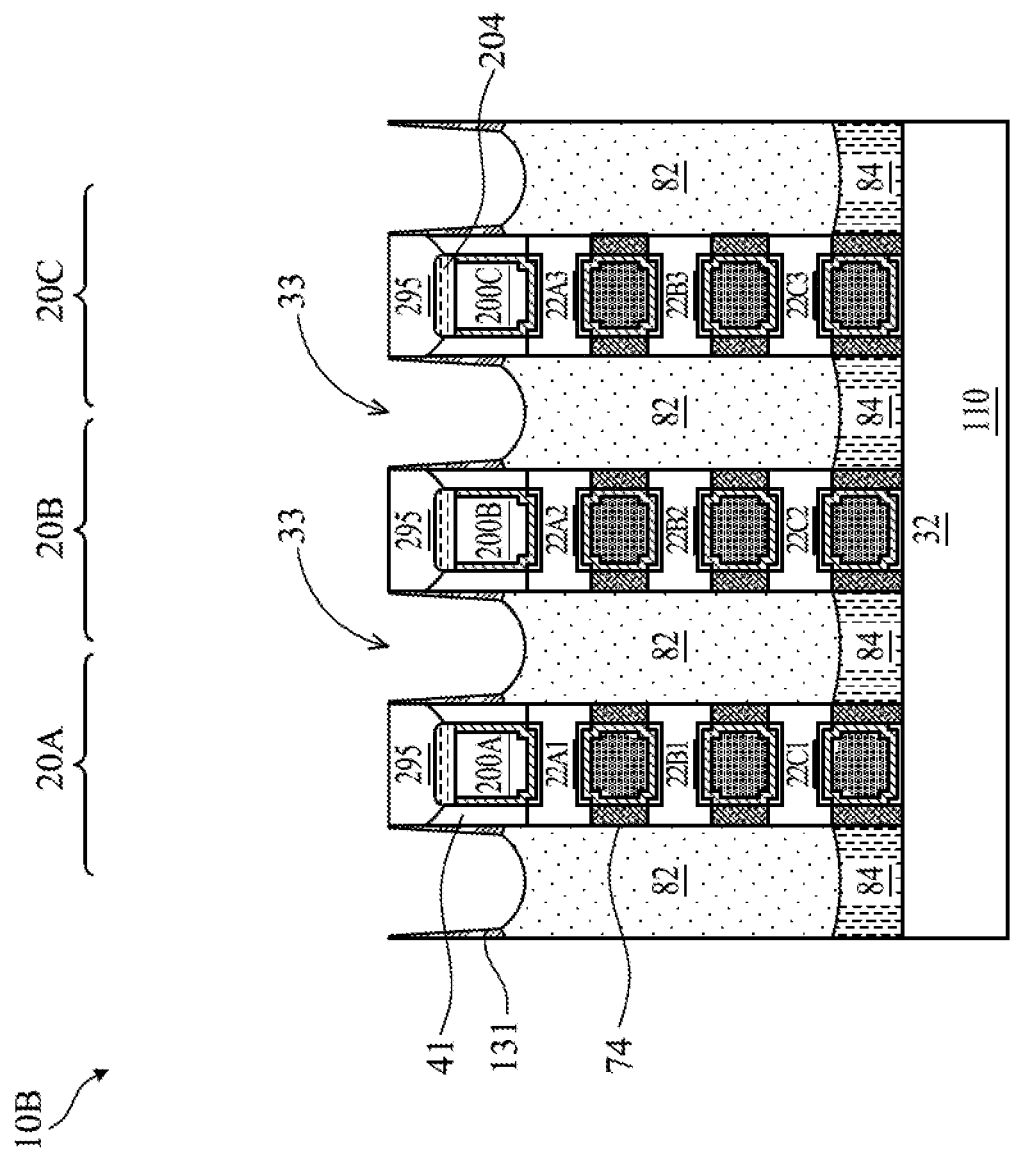

In FIGS. 16A-16C, openings 33 are formed that expose the upper surfaces of the respective source/drain regions 82. In some embodiments, the openings 33 are formed in a manner that recesses the source/drain regions 82 slightly, as shown, such that the upper surface of the source/drain regions 82 is concave following formation of the openings 33. The openings 33 may be formed by a suitable etching process. In FIG. 16A, the openings 33 may extend through the second ILD 140, the second ESL 141, the ILD 130 and the ESL 131. In FIGS. 16B, 16C, the openings 33 may be formed by removing the ILD 130, and removing a portion of the ESL 131. In some embodiments, in FIGS. 16B, 16C, portions of the ESL 131 may remain on sidewalls of one or both of the gate capping layers 295 and the gate spacers 41. Presence of the gate capping layers 295 that protect the underlying gate structures 200A-200C in FIGS. 16B, 16C allows for the openings 33 to be wider than those in FIG. 16A in which the gate capping layers 295 are not present.

Figure 17A:
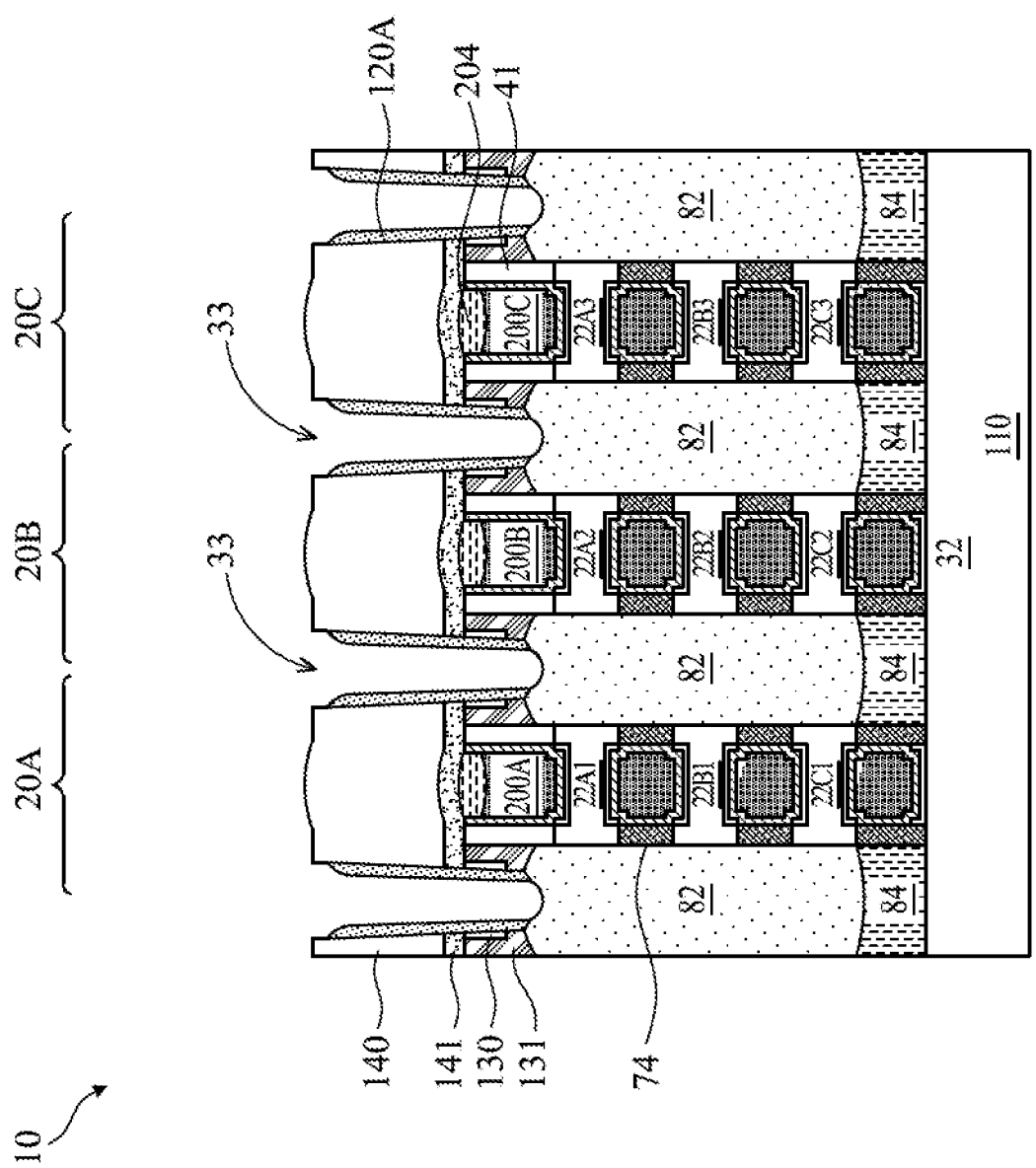
Figure 17B:
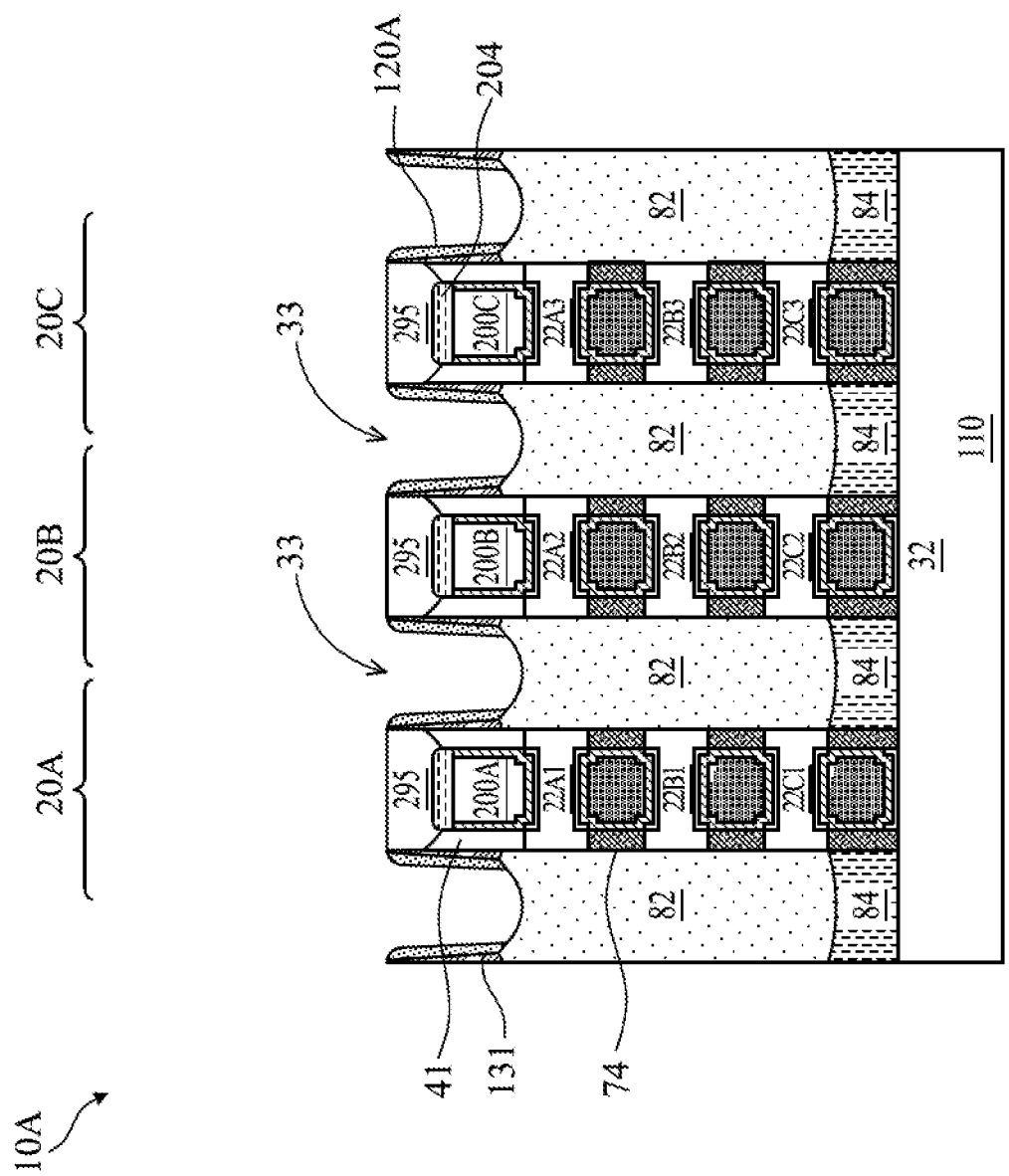
Figure 17C:
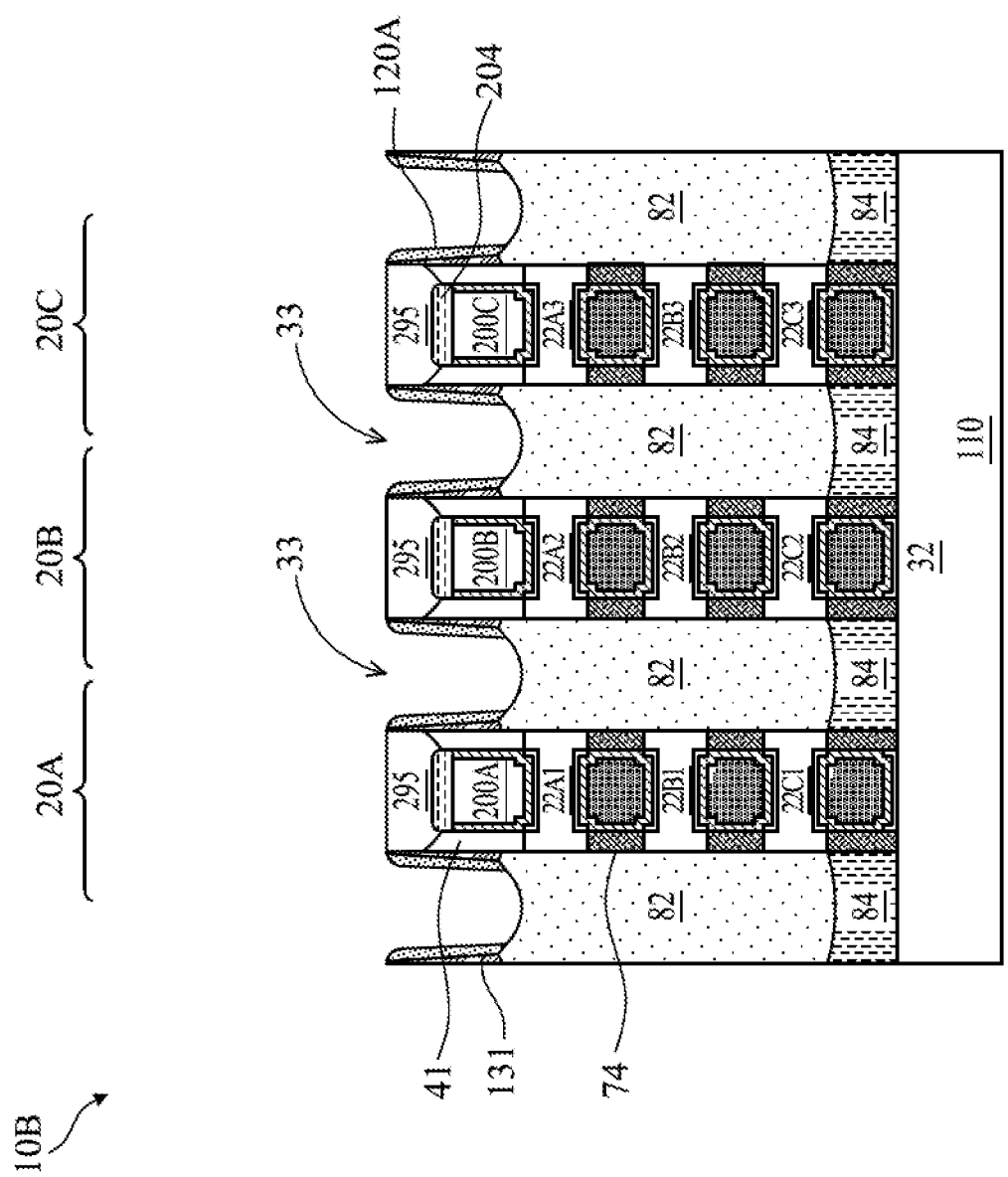

In FIGS. 17A-17C, the first liner layer 120A is formed. The first liner layer 120A isolates the source/drain contacts 120 from neighboring structures, such as gate vias 184 and source/drain vias 183 formed in subsequent processes. Formation of the first liner layer 120A may include conformal deposition of material of the first liner layer 120A, followed by etching the material to form the first liner layer 120A as spacers at sidewalls (e.g., exposed surfaces) of one or more of the second ILD 140, the second ESL 141, the ILD 130 and the ESL 131. For example, in FIG. 17A, the first liner layer 120A is in contact with the second ILD 140, the second ESL 141, the ILD 130 and the ESL 131. In FIG. 17A, the first liner layer 120A has a lower surface in contact with the upper surface of the source/drain region 82. In FIGS. 17B, 17C, the first liner layer 120A is in contact with the ESL 131. In FIGS. 17B, 17C, the first liner layer 120A has a lower surface in contact with the upper surface of the source/drain region 82. In some embodiments, in FIGS. 17B, 17C, when the ESL 131 is fully removed in FIGS. 16B, 16C, the first liner layer 120A may be in contact with sidewalls of the gate capping layer 295 and the gate spacers 41.

Figure 18A:
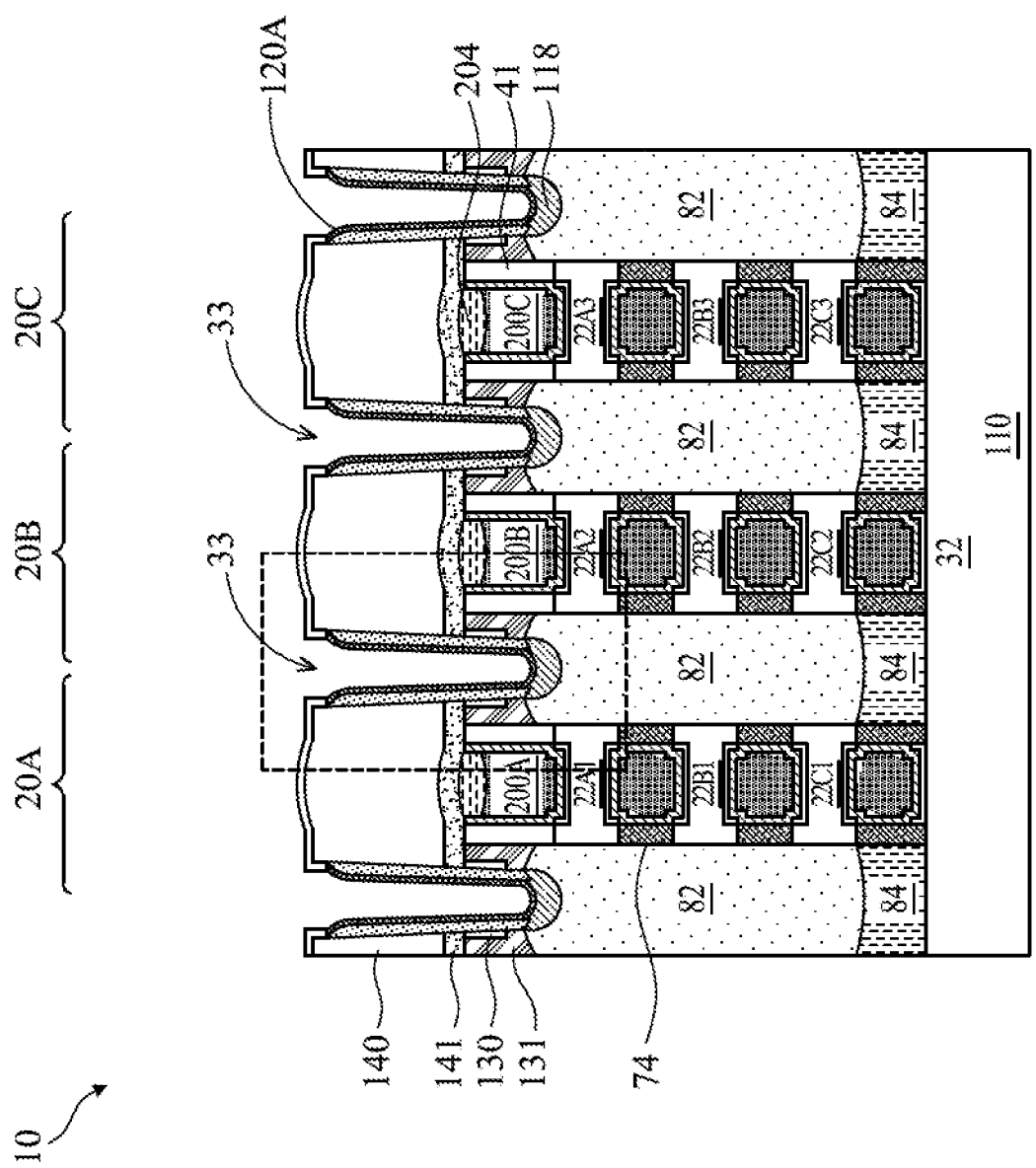
Figure 18B:
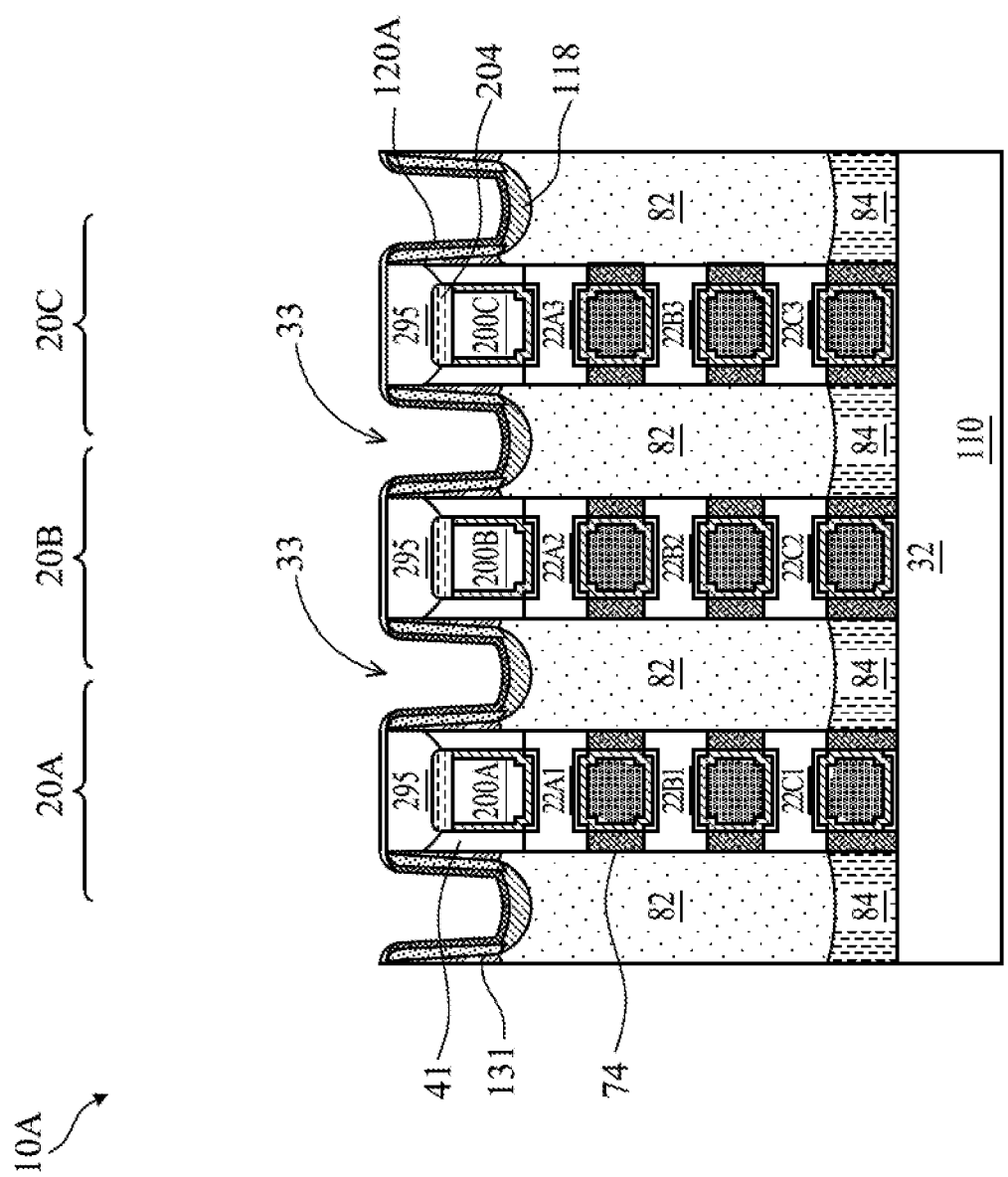
Figure 18C:
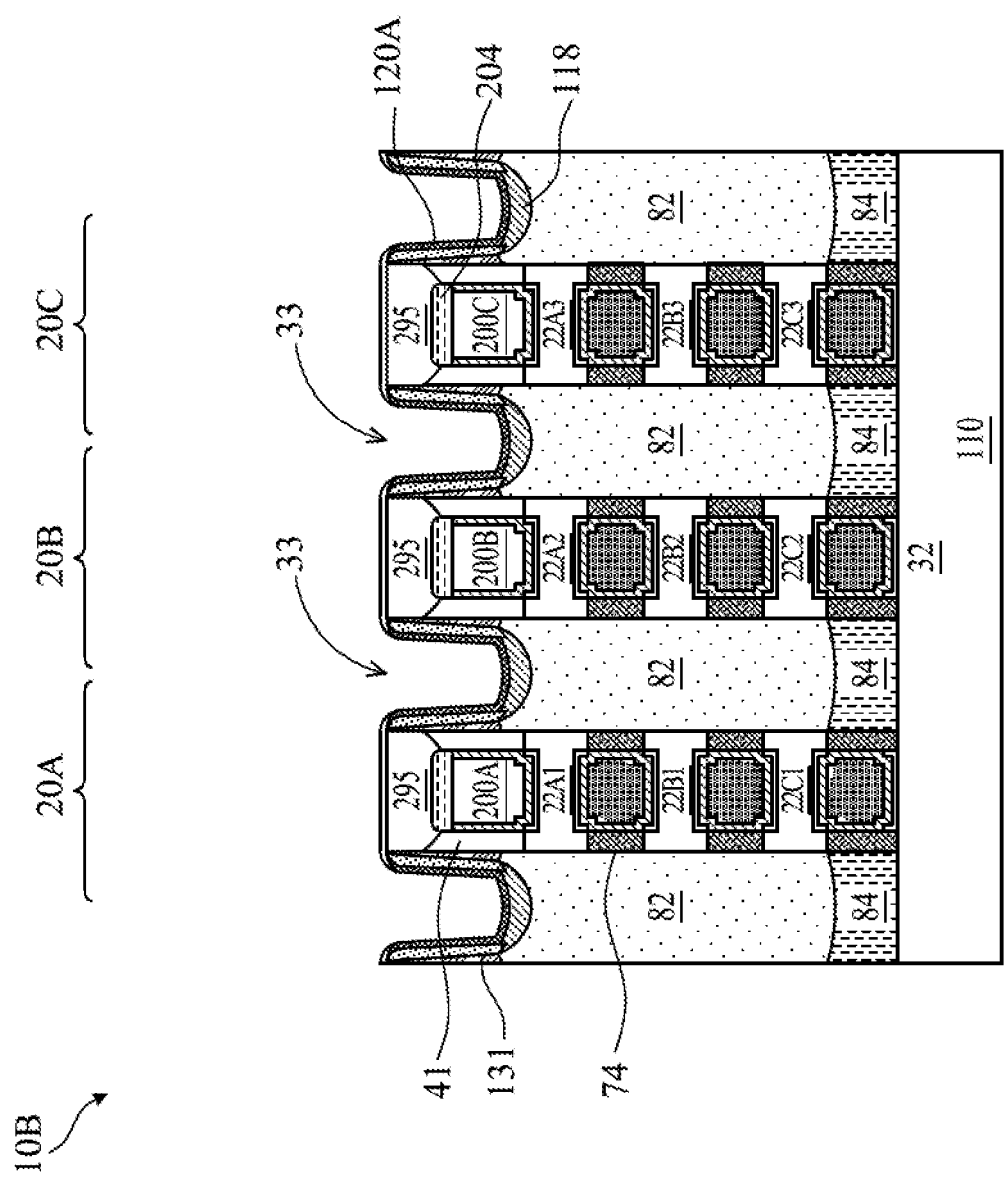
Figure 18D:
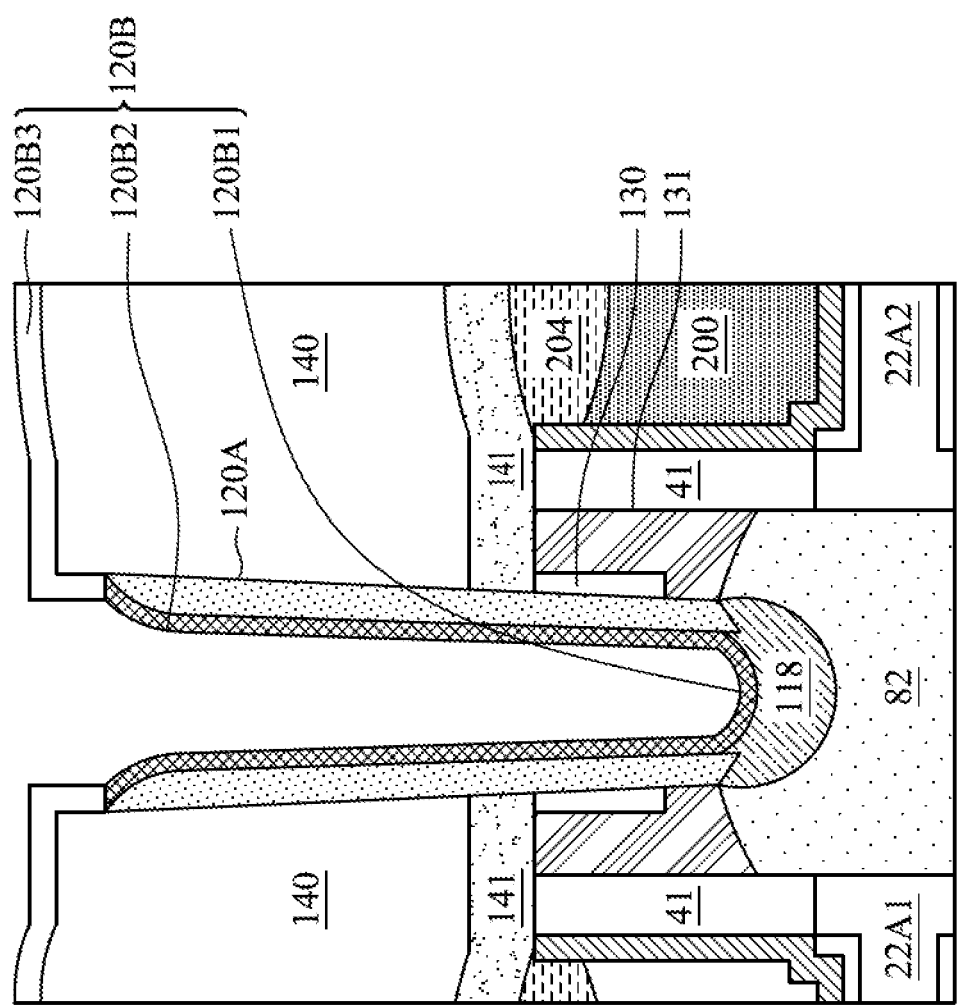

In FIGS. 18A-18C, the second liner layer 120B and silicide layer 118 are formed. FIG. 18D is a detailed view of an area (dashed box region in FIG. 18A) showing the resulting structure of the second liner layer 120B following deposition and annealing thereof. It should be understood that the description of FIG. 18D is applicable to the structures shown in FIGS. 18B, 18C.

Referring to FIG. 18D, forming the second liner layer 120B and the silicide layer 118 may include forming a metal material layer in the openings 33, followed by annealing the metal material layer to react with materials underneath to form a first portion 118/120B1 (e.g., silicide) over the source/drain region 82, a second portion 120B2 (e.g., a nitride of the metal material layer) over the first liner layer 120A, and a third portion 120B3 (e.g., an oxide of the metal material layer) over the second ILD 140. For example, the metal material layer may be or include titanium. In such embodiments, the first portion 120B1 and the silicide 118 may be or include TiSi, the second portion 120B2 may be or include TiN, and the third portion 120B3 may be or include $TiO_x$. In some embodiments, the metal material layer and a core layer 120C formed thereover in a subsequent operation may be the same material or different materials. It should be understood that the third portion 120B3 in FIGS. 18B, 18C may be a material different than that described with respect to FIGS. 18A and 18D, for example, when the gate capping layer 295 includes a material different than that of the second ILD 140. As described above with reference to FIGS. 1A-1Q, the gate capping layer 295 may be or include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO. As such, the third portion 120B3 may include an oxide, nitride, carbide, oxynitride, or the like of the metal material layer.

Figure 19A:
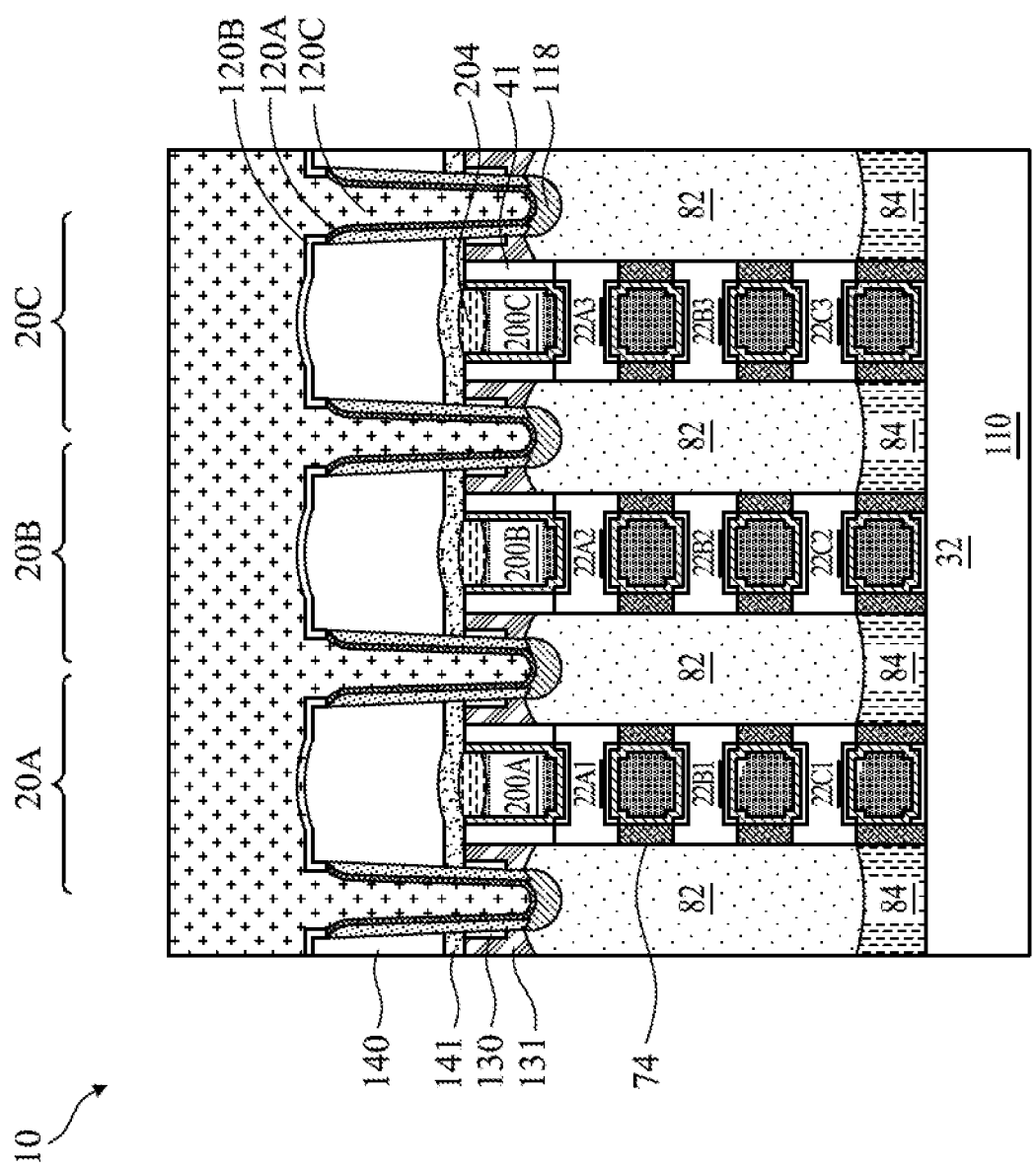
Figure 19B:
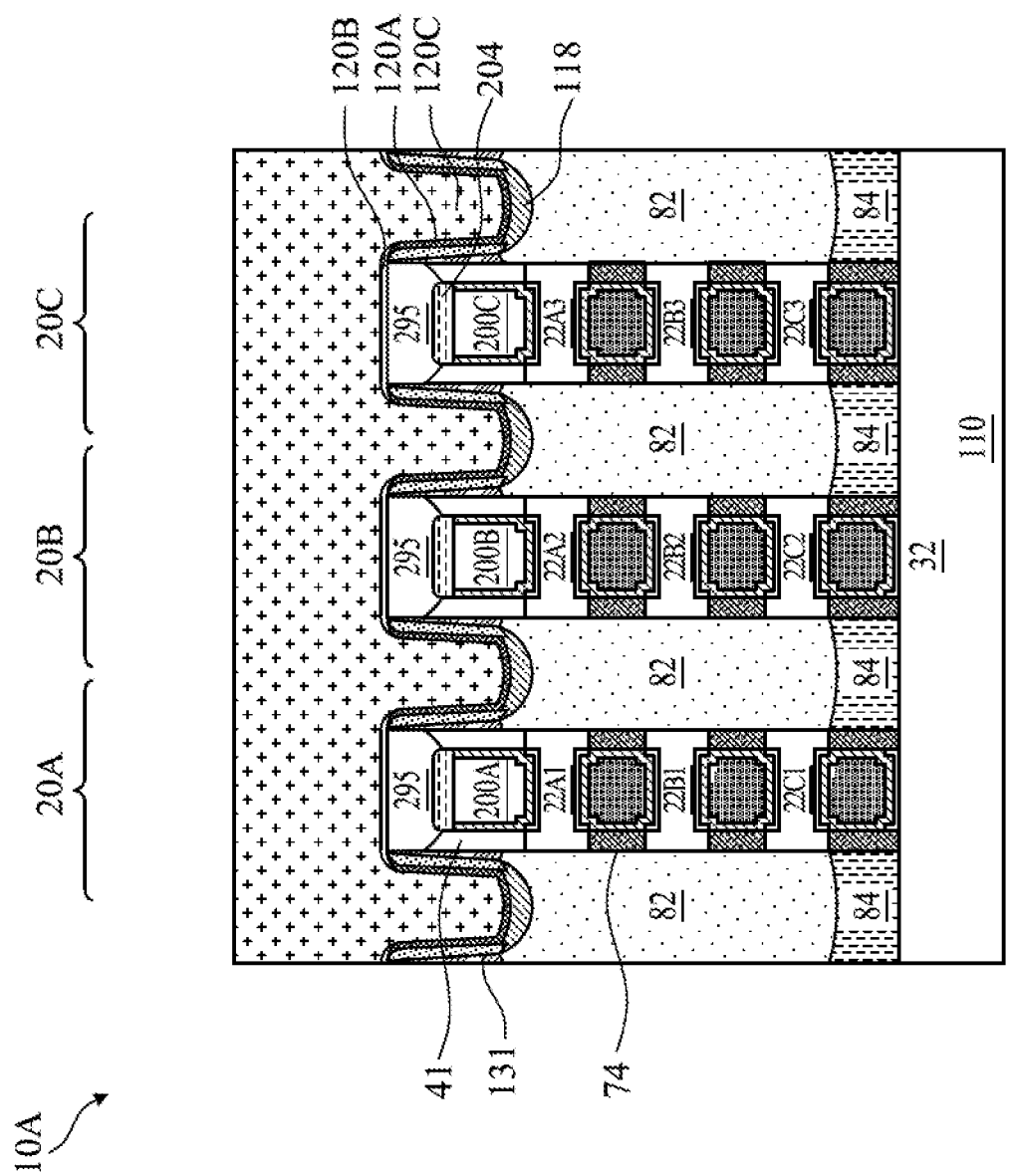
Figure 19C:
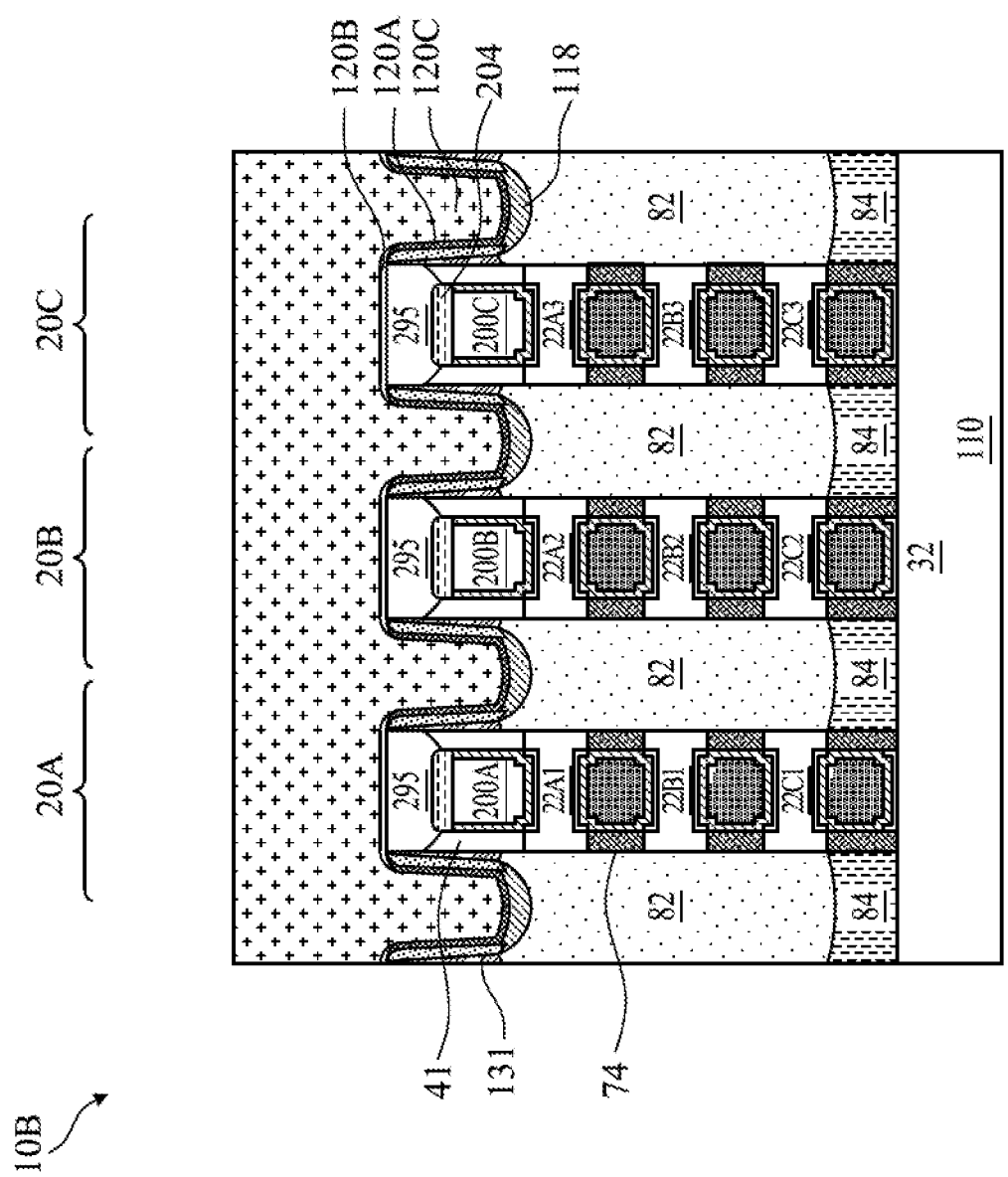

In FIGS. 19A-19C, a metal layer of the core layer 120C is formed. The metal layer may include ruthenium, cobalt, tungsten, molybdenum, or another suitable metal. In some embodiments, forming the metal layer includes use of a metal precursor and hydrogen ($H_2$) plasma in a CVD process or a plasma-enhanced CVD (PECVD) process. The CVD process may be a non-directional process and thus will form material on sidewalls of the openings 33 as thick as on the bottom of the openings 33. The CVD process may be applied at a temperature within a range. The CVD deposition process may have a pressure within a range of about 1 millitorr to about 15 torr. In some embodiments, the CVD process uses $Ru_x(CO)_y$, $Ru_x(CO)_yCl_z$ or $Ru_x(CO)_yBr_z$ with or without $NH_3$, and is applied at a temperature in a range of about 50° C. to about 250° C. In some embodiments, the CVD process uses $CwH_xCo_yO_z$ with or without $NH_3$, and is applied at a temperature in a range of about 100° C. to about 200° C. In some embodiments, the CVD process uses $W_xF_y$ with or without $NH_3$, and is applied at a temperature in a range of about 250° C. to about 400° C. In some embodiments, the CVD process uses $CwH_xCo_yO_z$ with or without $NH_3$, and is applied at a temperature in a range of about 100° C. to about 200° C. In some embodiments, the CVD process uses $Cl_xMoO_y$ or $Mo_xCl_y$ with or without $NH_3$, and is applied at a temperature in a range of about 50° C. to about 250° C.

The metal layers formed on the sidewalls of the openings 33 in FIGS. 18A-18D and FIGS. 19A-19C may not be removed due to the core layer 120C being formed by CVD. As such, complicated removal processes are omitted. Adhesion between the second liner layer 120B and the core layer 120C on the sidewalls of the openings 33 may be better than that that would exist between the core layer 120C and the first liner layer 120A. As such, fewer adhesion layers may be used and resistance may be improved (e.g., reduced), as formation of adhesion layers generally degrades (e.g., increases) resistance.

Following deposition of the metal layer of the core layer 120C, a post-deposition anneal process may be performed, for example, which drives out voids in the metal layer. In some embodiments, the post-deposition anneal process is performed using $N_2$, He, Ar or $H_2$ gas at a temperature of about 200° C. to about 450° C., at a pressure of about 0.5 T to about 10 T, for about 1 minute to about 10 minutes. Temperature above about 450° C. may damage the silicide layer 118/120B1, and temperature below about 200° C. may be insufficient to remove all voids from the core layer 120C.

Figure 20A:
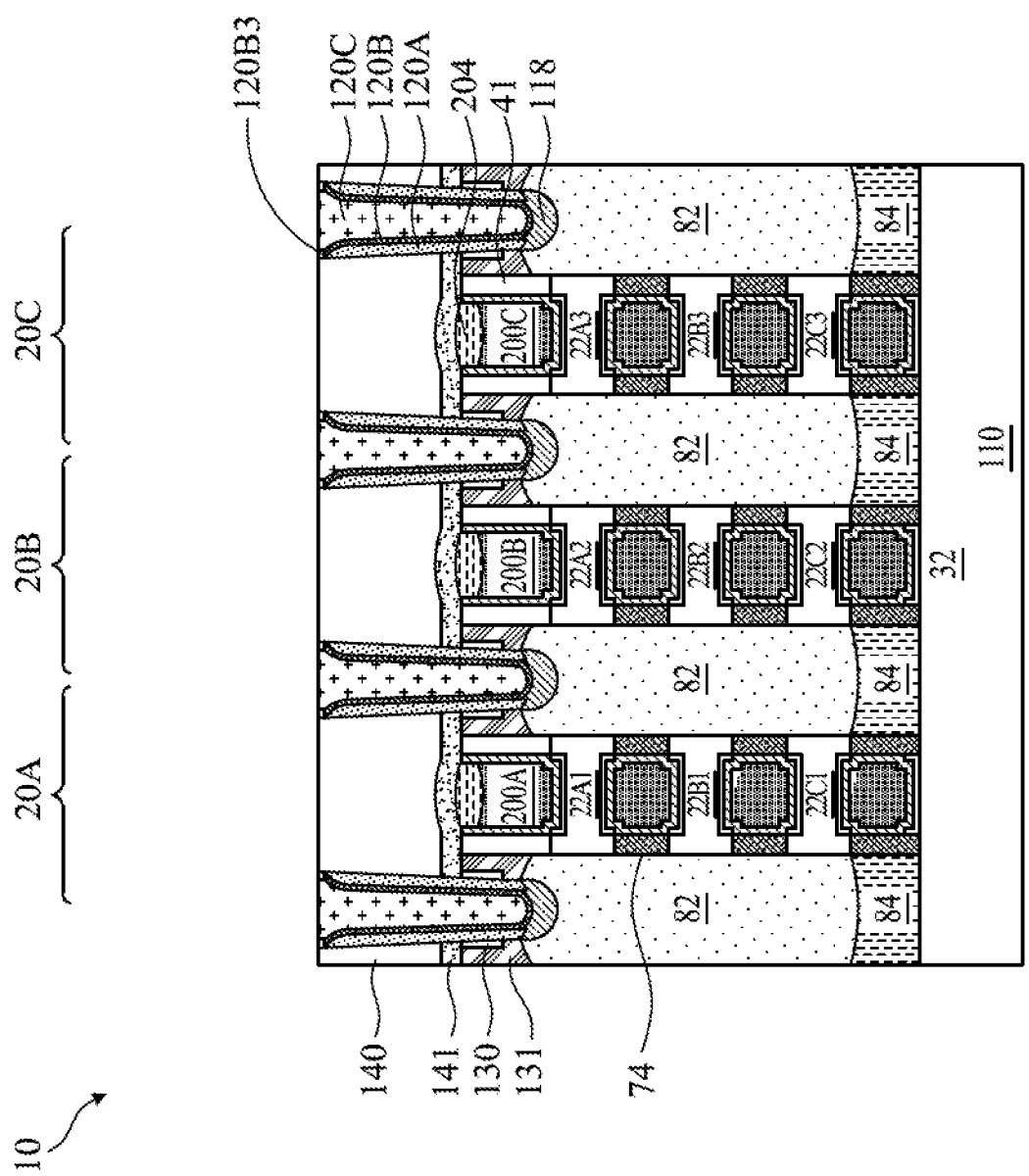
Figure 20B:
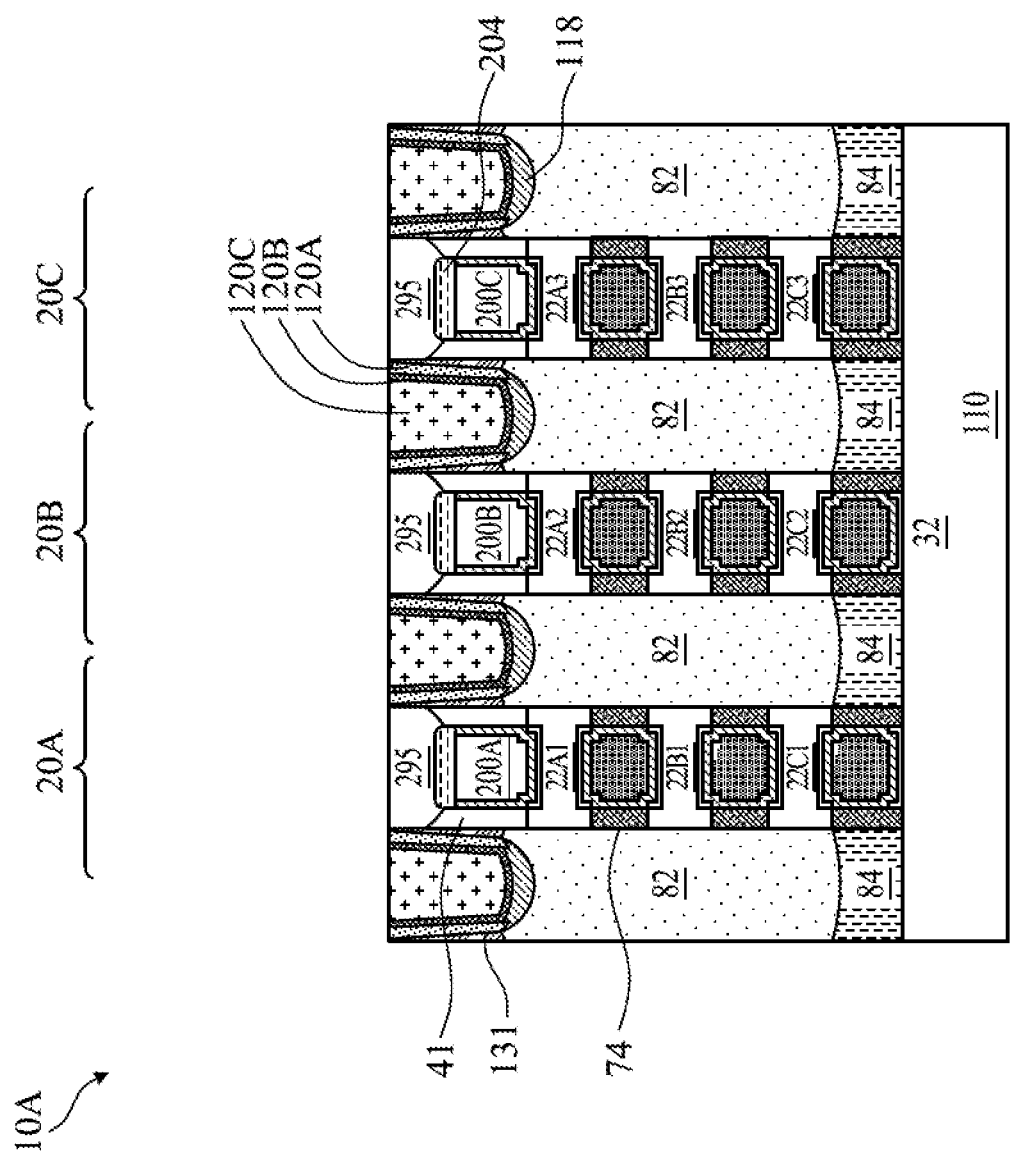
Figure 20C:
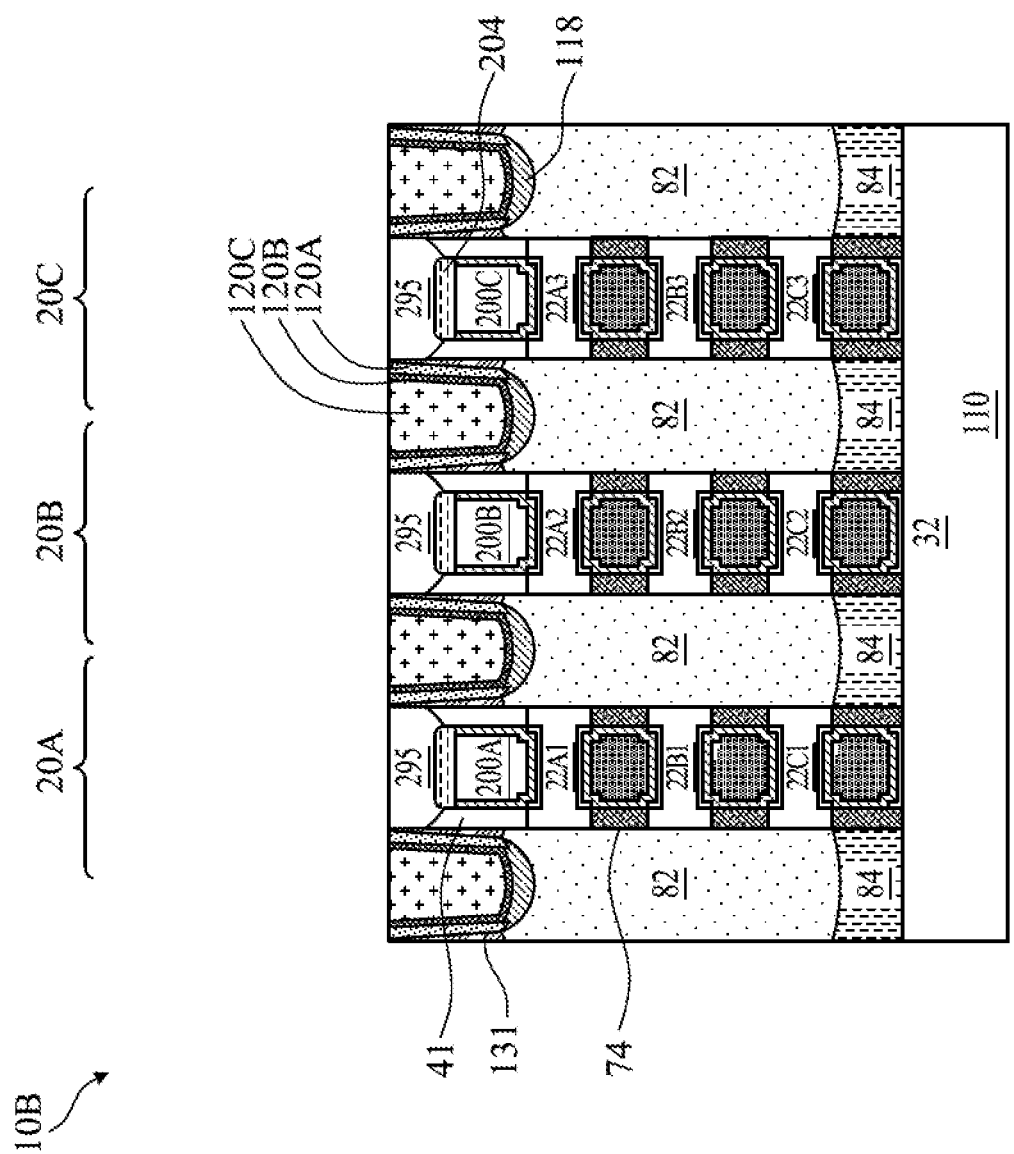
Figure 20D:
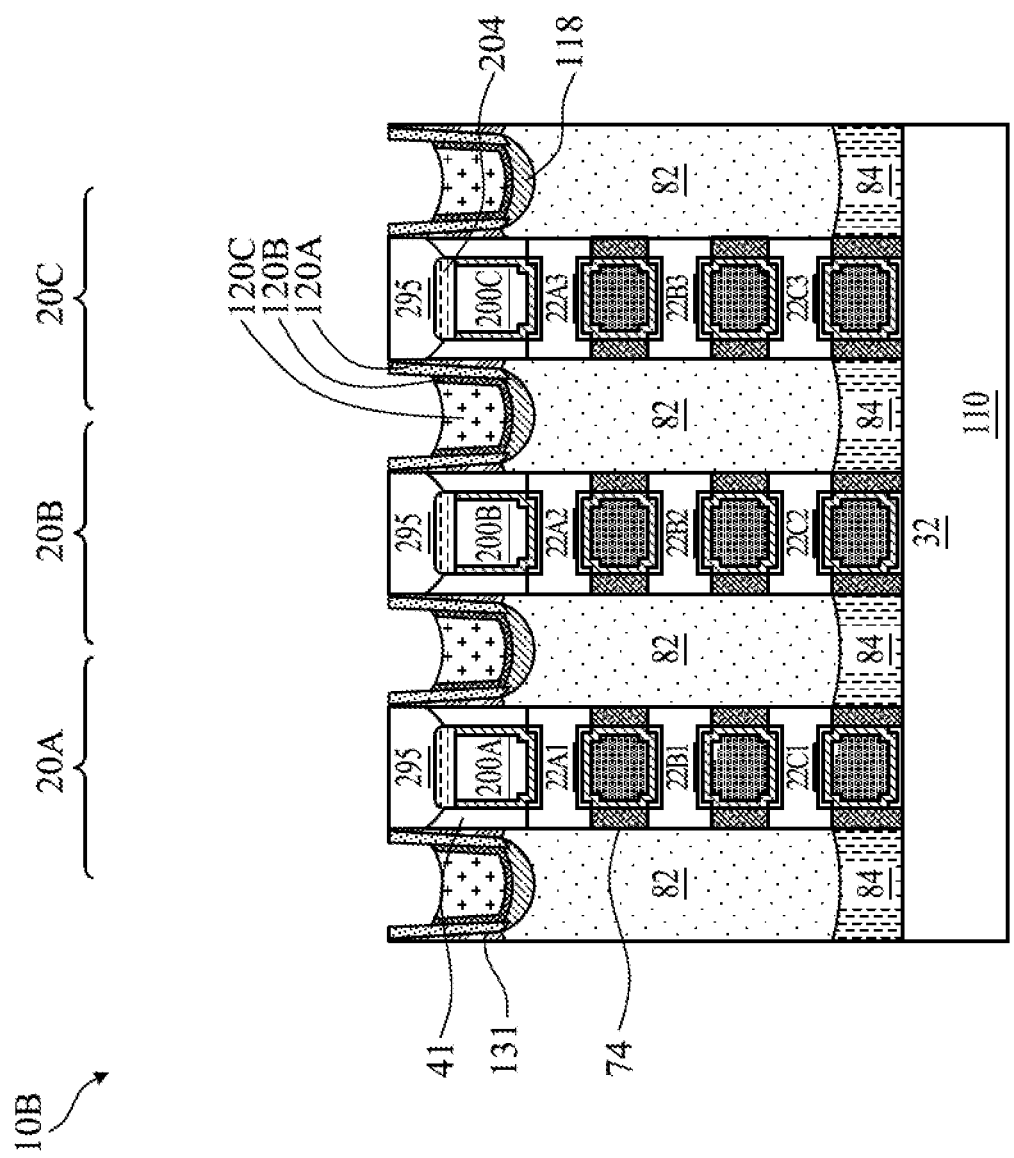
Figure 20E:
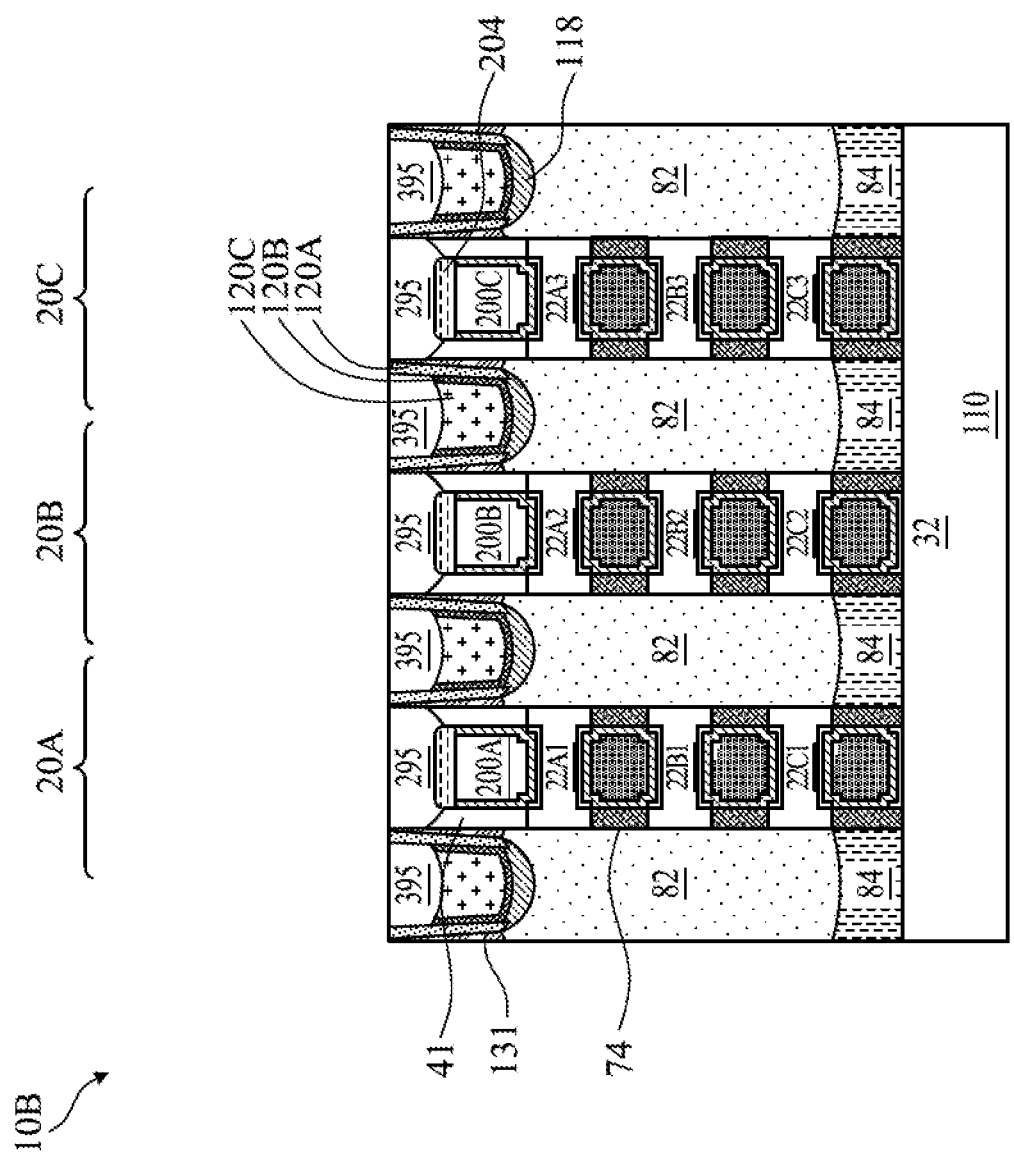

In FIGS. 20A-20C, following formation of the metal layer of the core layer 120C, excess material of the metal layer over the second ILD 140 or the gate capping layers 295 is removed by a suitable removal process, such as a CMP, mechanical grinding or the like. The resulting structures are shown in FIGS. 20A-20C.

FIGS. 20D and 20E illustrate formation of the source/drain capping layers 395 in accordance with various embodiments. The source/drain capping layers 395 protect the source/drain contacts 120, which allows for a larger landing contact area when forming the gate via 184.

In FIG. 20D, the source/drain contacts 120 are recessed. In some embodiments, the core layer 120C is recessed without substantially removing the first liner layer 120A. The recessing may be by a suitable removal process, such as one or more anisotropic etch operations that remove material of the second liner layer 120B and the core layer 120C without substantially attacking material of the first liner layer 120A and the gate capping layers 295.

In FIG. 20E, following recessing of the source/drain contacts 120, the source/drain capping layers 395 are formed over the source/drain contacts 120, as shown. The source/drain capping layers 395 may be formed by depositing a material layer on the source/drain contacts 120, then removing excess material of the material layer over the gate capping layers 295 by a suitable removal process, such as a CMP, mechanical grinding or the like.

Figure 21A:
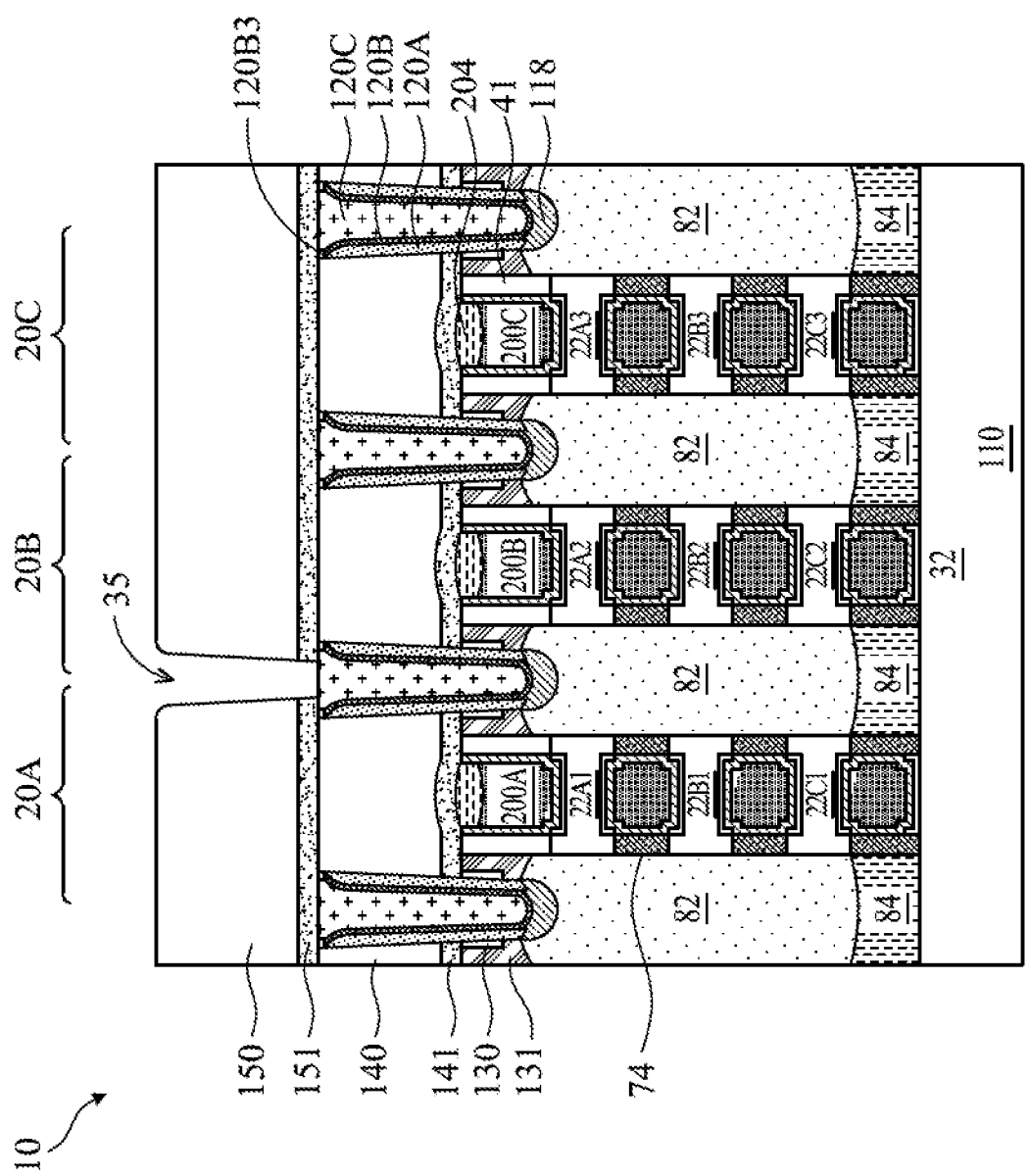
Figure 21B:
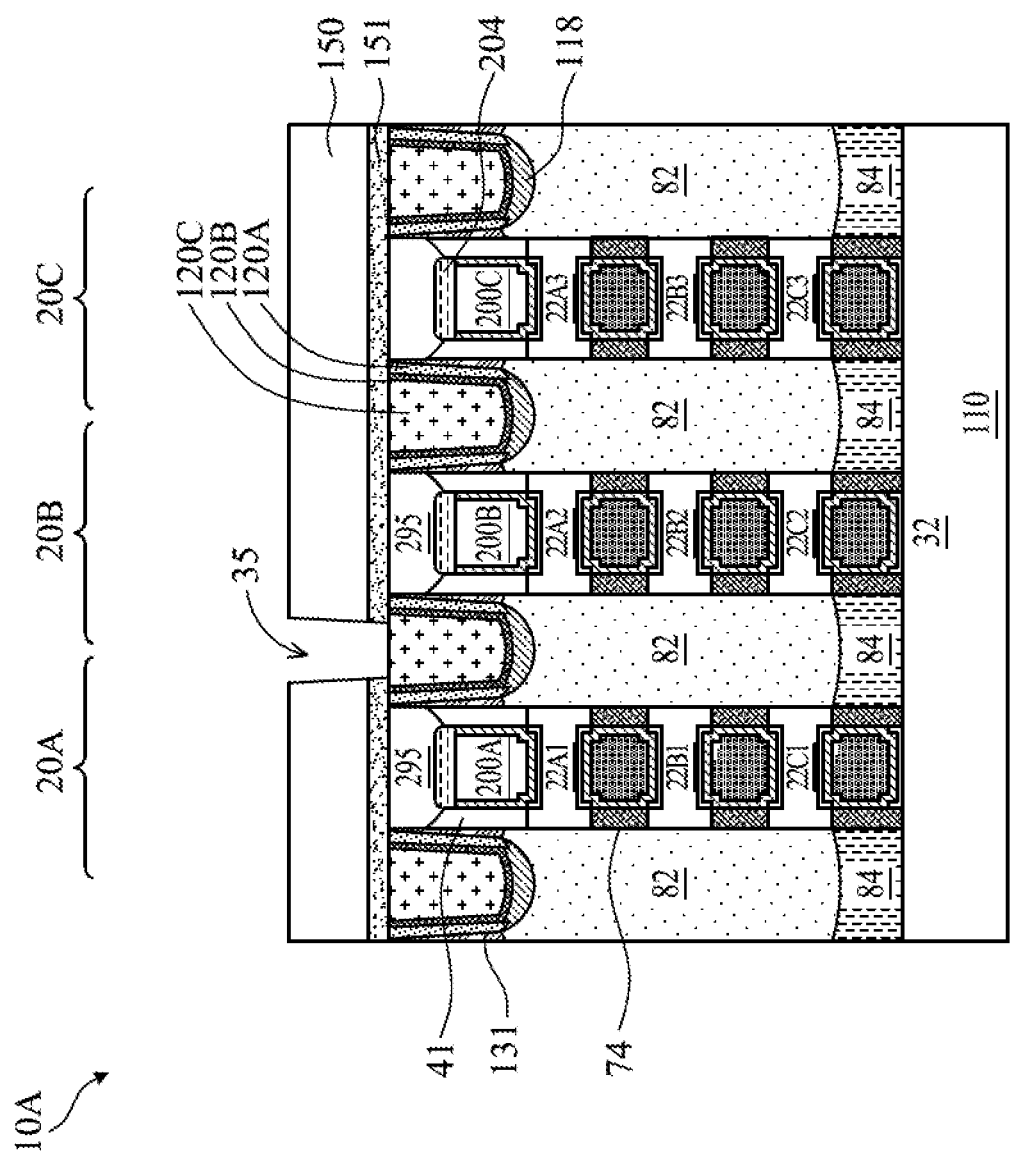
Figure 21C:
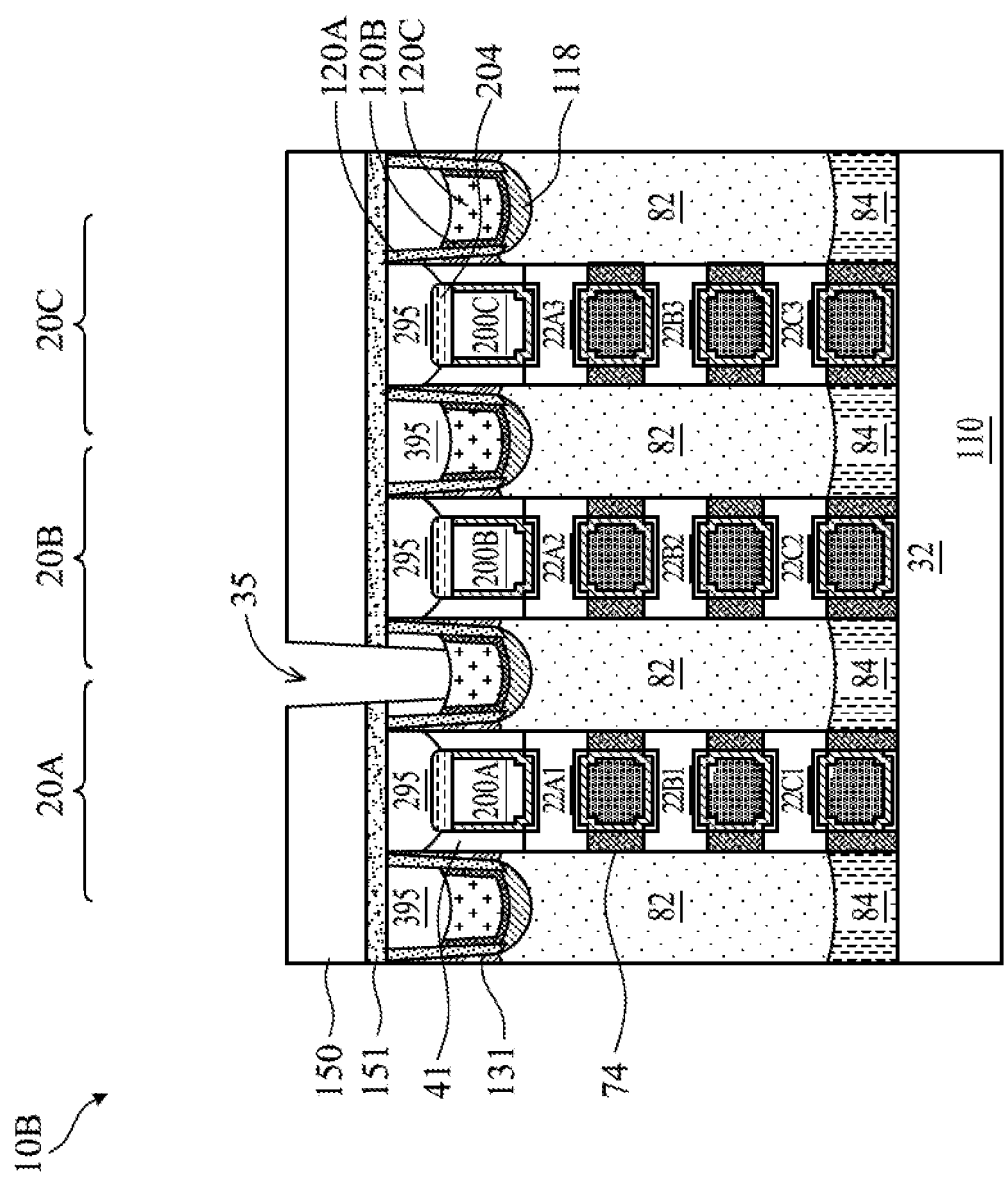

In FIGS. 21A-21C, source/drain via openings 35 are formed over one or more of the source/drain contacts 120 in the third ILD 150 and the third ESL 151, as shown. The third ILD 150 and the third ESL 151 may be formed by processes similar to those described for the second ILD 140 and the second ESL 141, respectively. The source/drain via openings 35 may be formed by one or more suitable etching processes. In some embodiments, one or more patterned masking layers including mask openings are formed over the second ILD 150. The source/drain via openings 35 are formed by etching through portions of the third ILD 150 and the third ESL 151 exposed by the mask openings. Following formation of the source/drain via openings 35, the patterned masking layers may be removed. In the IC device 10B including the source/drain capping layers 395, the etching through the mask openings may include etching through portions of the source/drain capping layers 395 exposed by the mask openings.

Figure 22A:
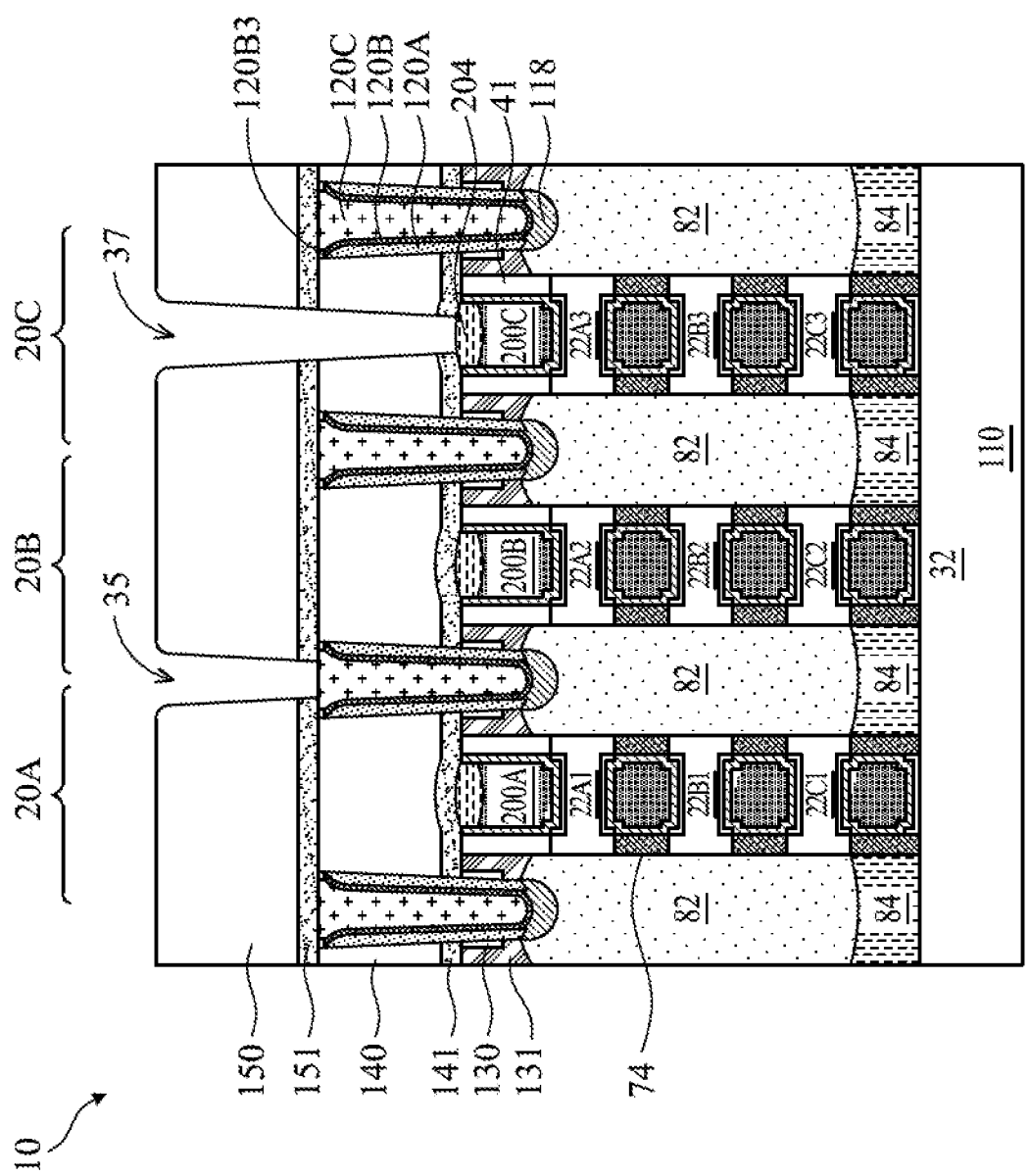
Figure 22B:
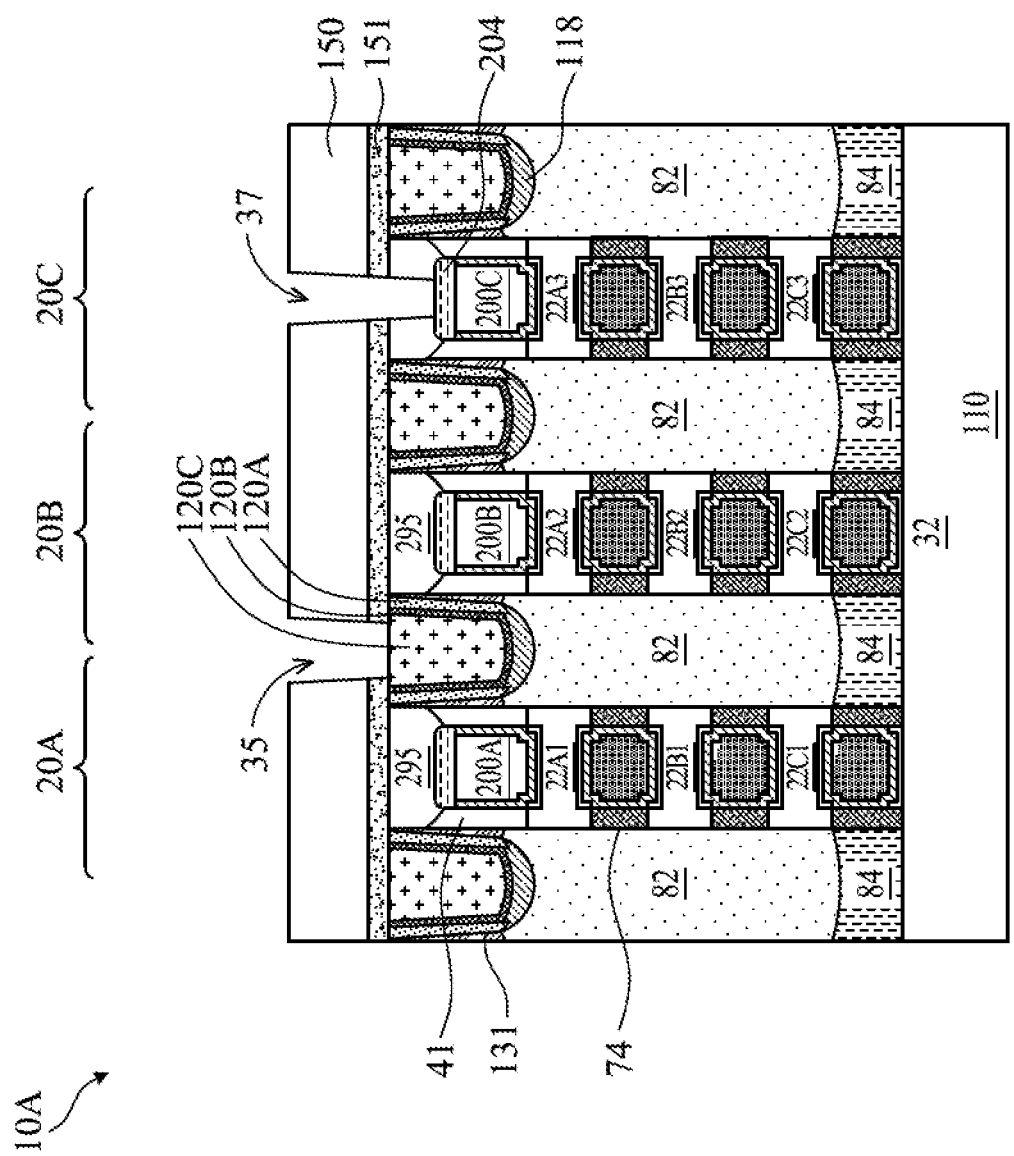
Figure 22C:
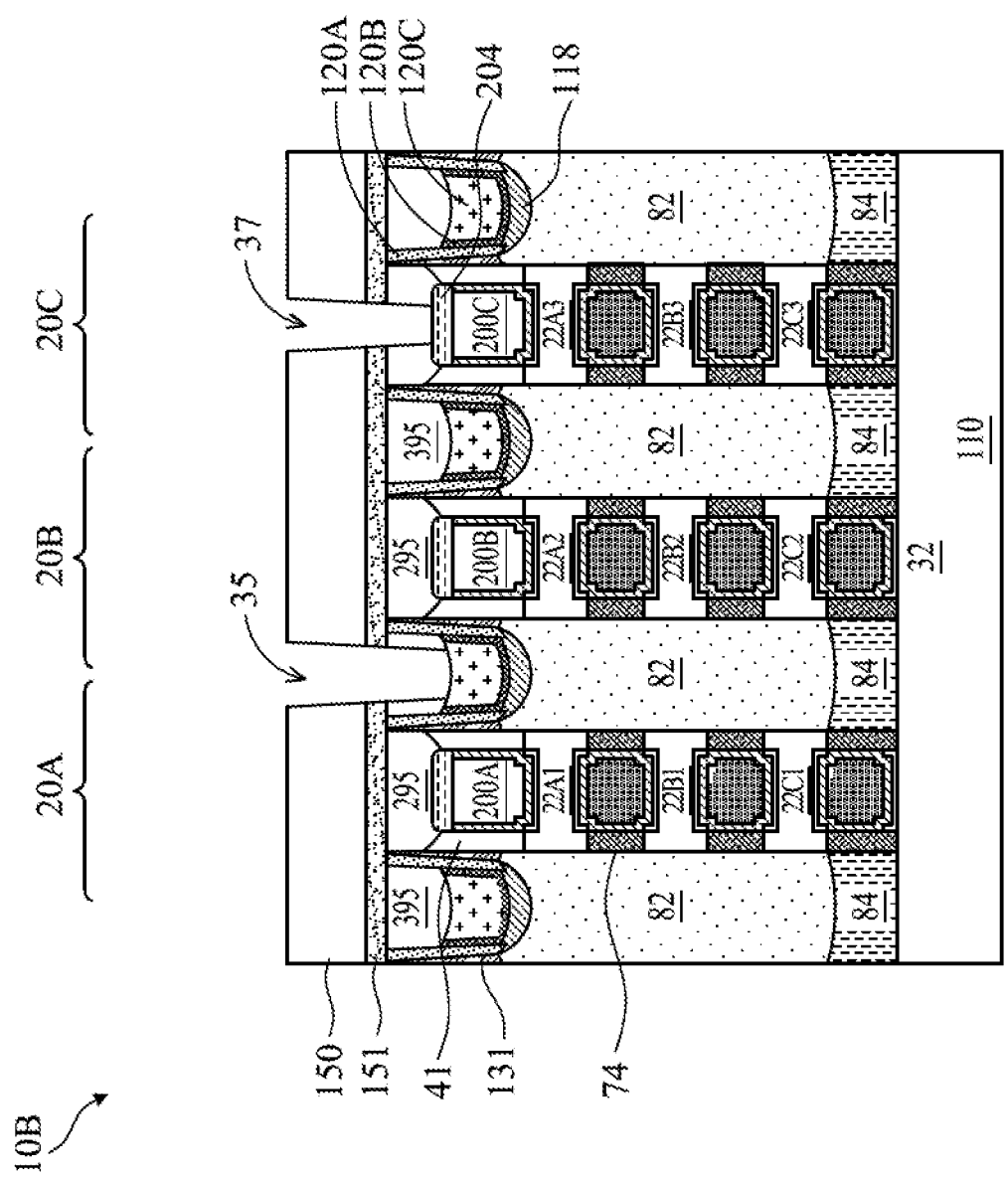

In FIGS. 22A-22C, gate via openings 37 are formed over one or more of the gate structures 200A-200C. The gate via openings 37 extend through the third ILD 150, the third ESL 151, and through the gate capping layer 295 when present, and expose the conductive layer 204. The gate via openings 37 may be formed in a manner similar to the formation of the source/drain via openings 35, and an etchant used for removing material of the gate capping layer 295 may be different than an etchant used for removing material of the source/drain capping layer 395, due to the material of the gate capping layer 295 being different and having different etch selectivity than the material of the source/drain capping layer 395.

In FIGS. 23A-23C and FIGS. 24A-24C, following formation of the source/drain via openings 35 and the gate via openings 37, the gate via 184 and the source/drain via 183 are formed.

Figure 23A:
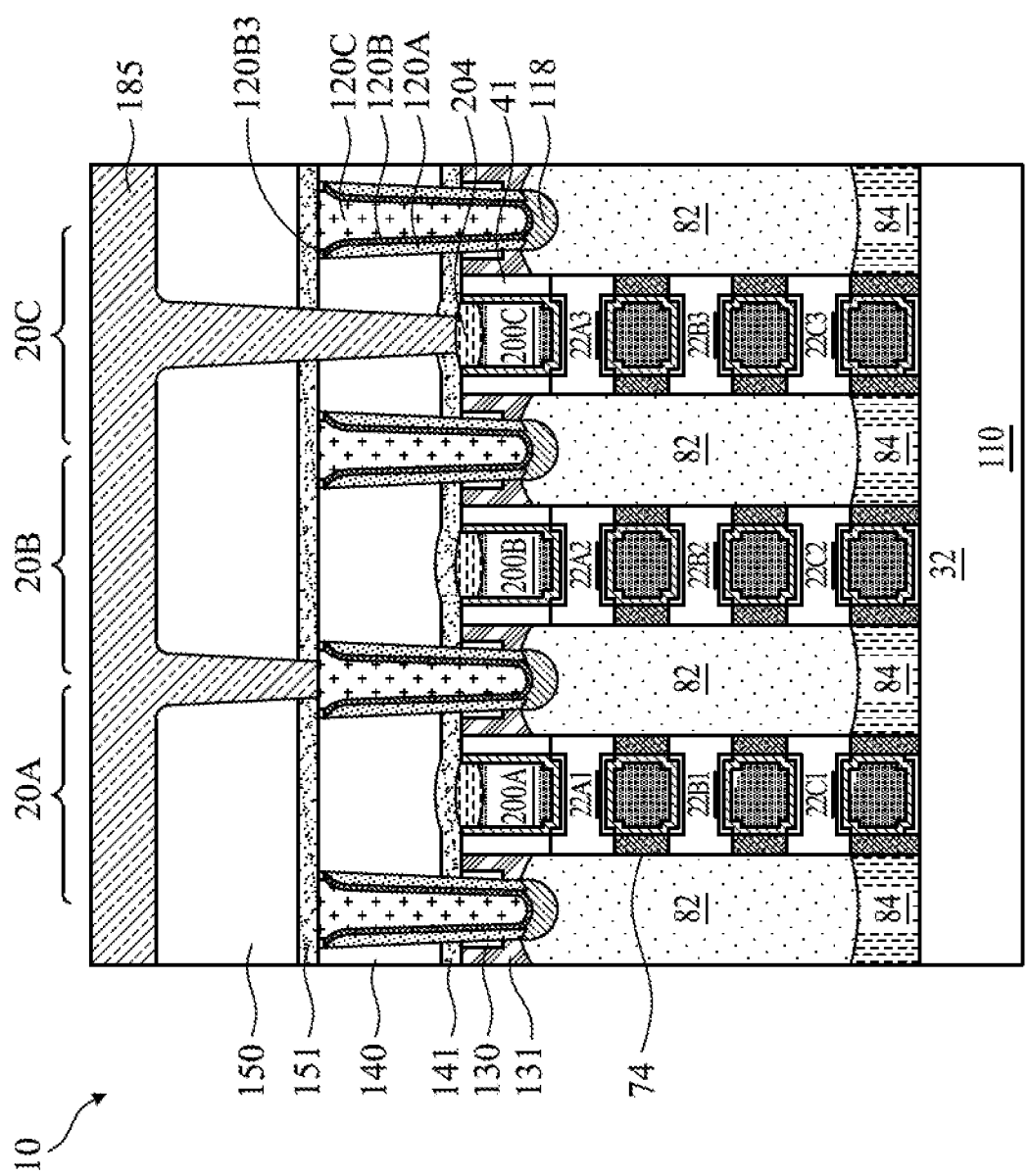
Figure 23B:
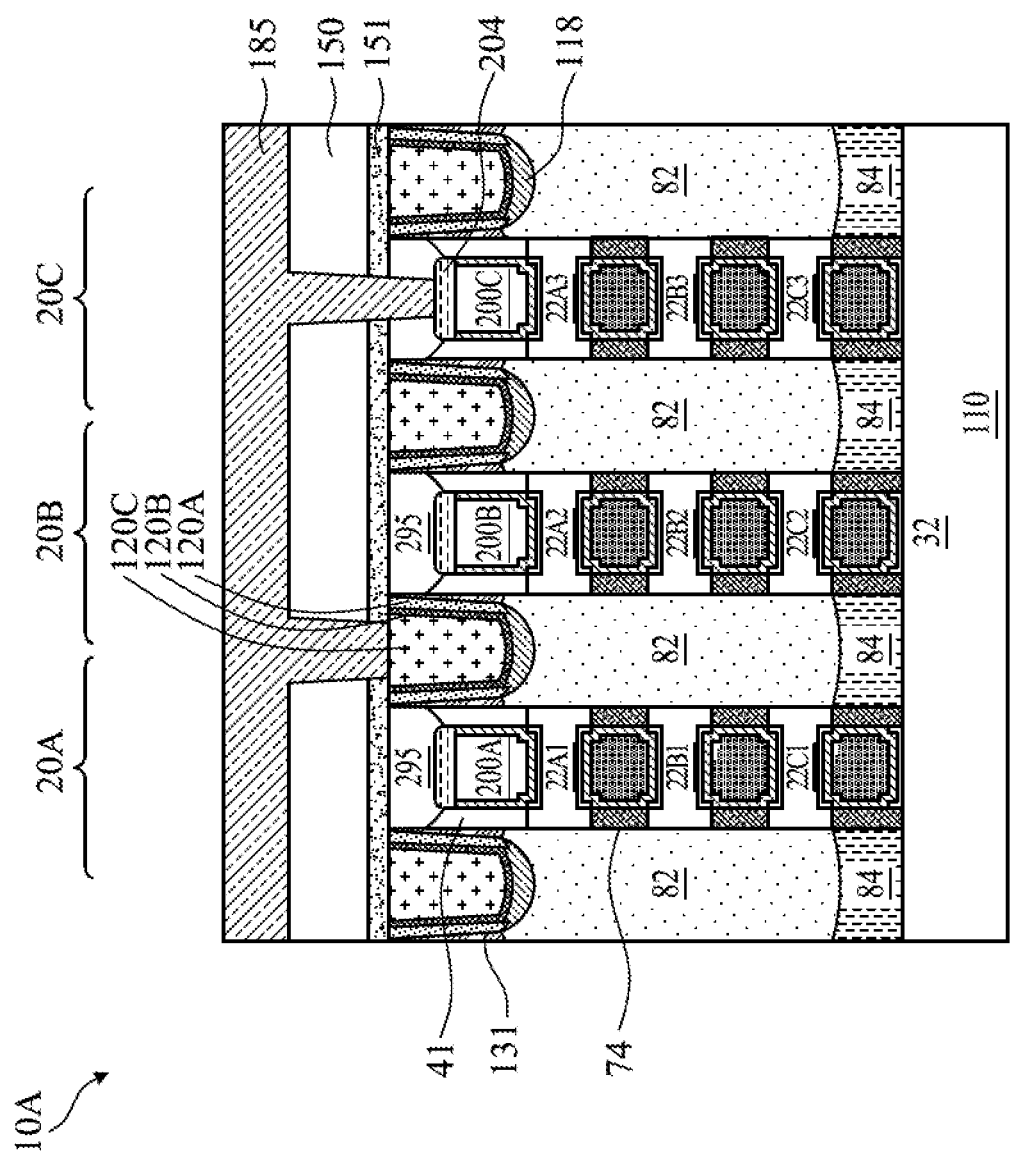
Figure 23C:
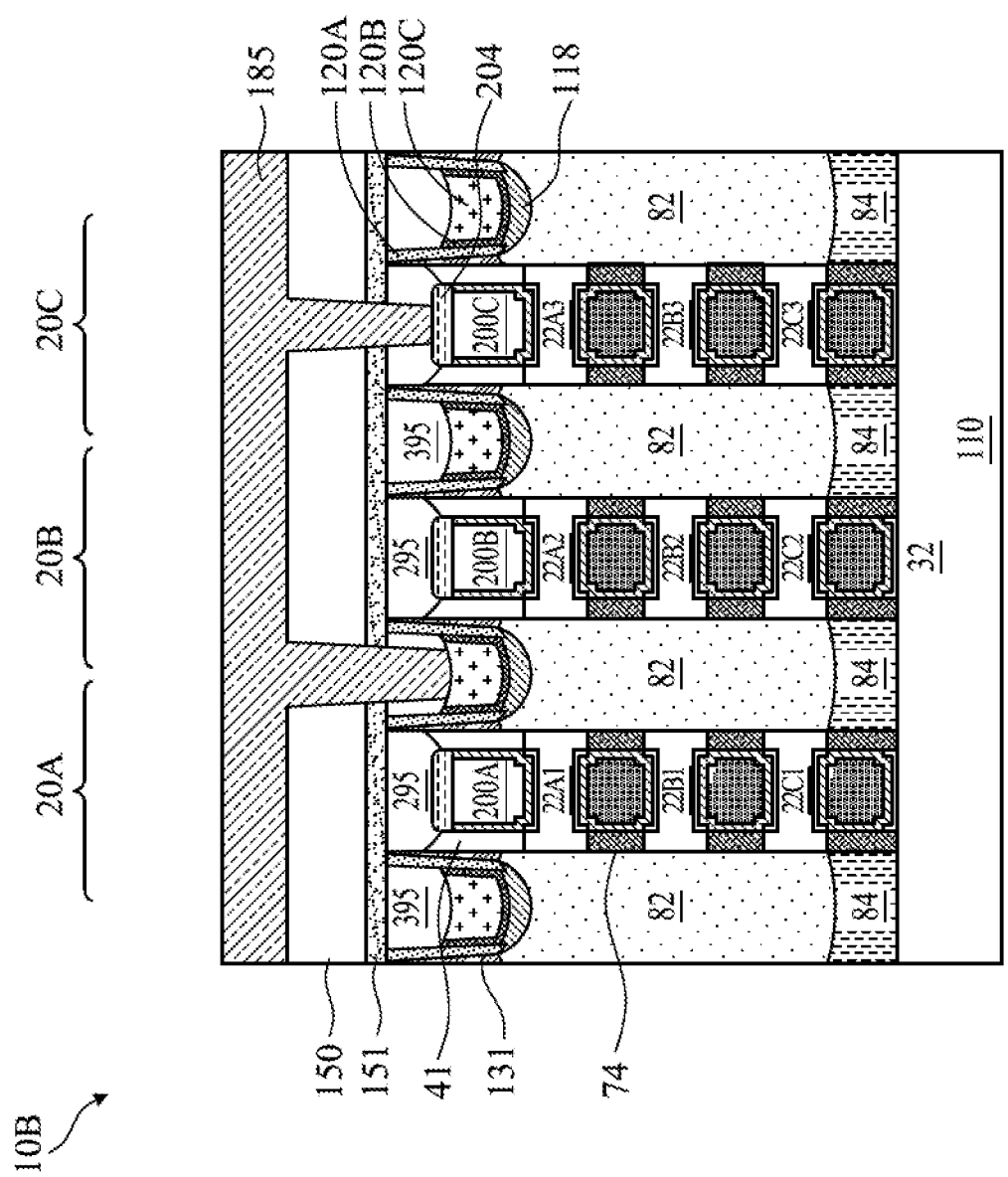

In FIGS. 23A-23C a material layer of the source/drain and gate vias 183, 184 is deposited in the source/drain via openings 35 and the gate via openings 37, respectively. The material layer may be the same material as that of the source/drain contacts 120. Applying the same material may increase performance due to reduced contact resistance between the source/drain vias 183 formed and the source/drain contacts 120. The material layer may be formed by a CVD operation similar to that used to form the core layer 120B of the source/drain contacts 120. The material layer may be subjected to a post-deposition anneal process, which may be similar to that described with reference to FIGS. 19A-19C. The post-deposition anneal process may remove voids from the source/drain and gate vias 183, 184. Using such a single metal approach to form the conductive layer 204, the source/drain contacts 120, the source/drain vias 183 and the gate vias 184, including the post-deposition anneal processes, creates seam-free interfaces between metal features in contact with each other (e.g., between the source/drain via 183 and the core layer 120C of the source/drain contact 120). Center voids can be removed by grain growth after the post-deposition anneal processes.

Figure 24A:
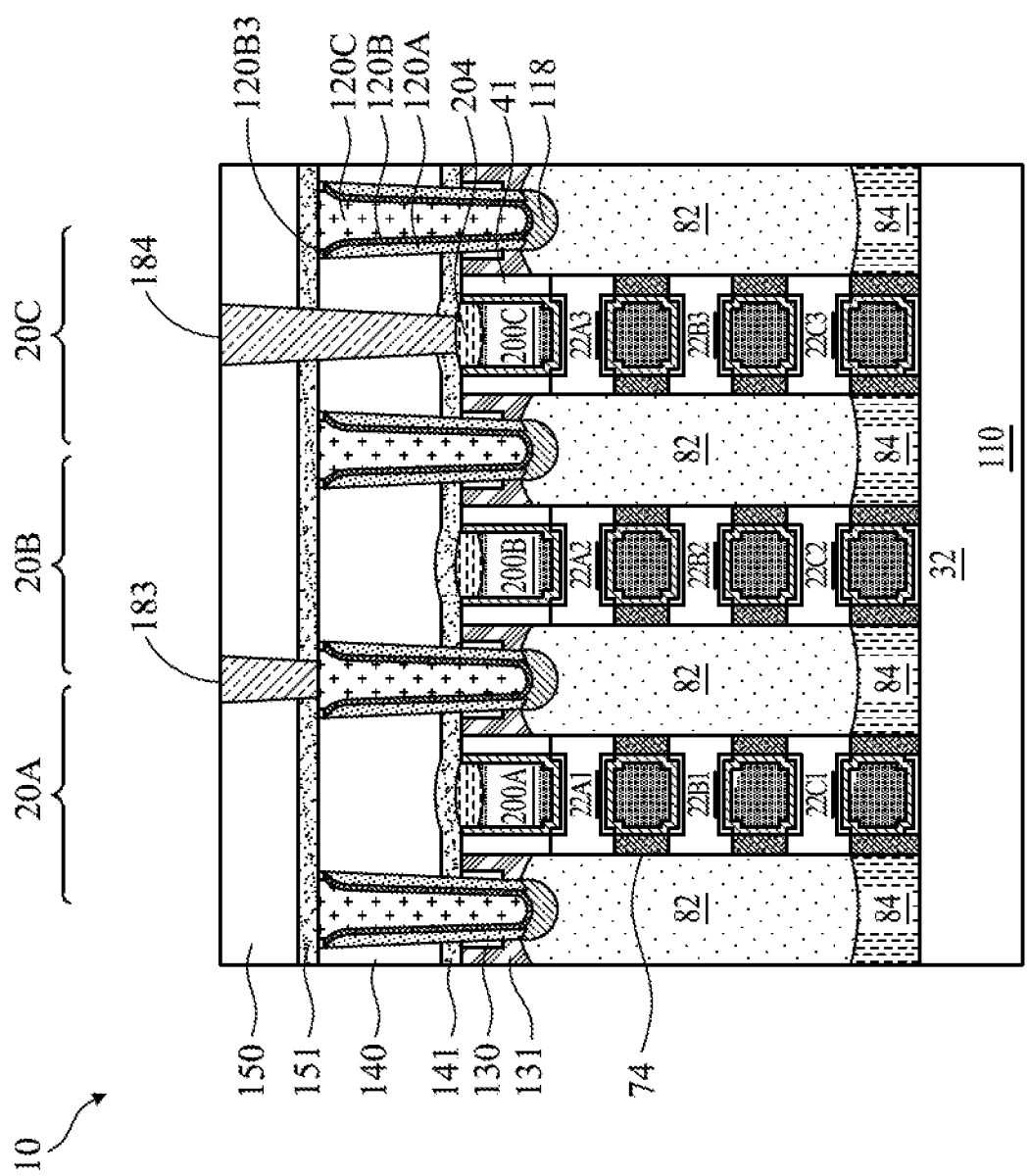
Figure 24B:
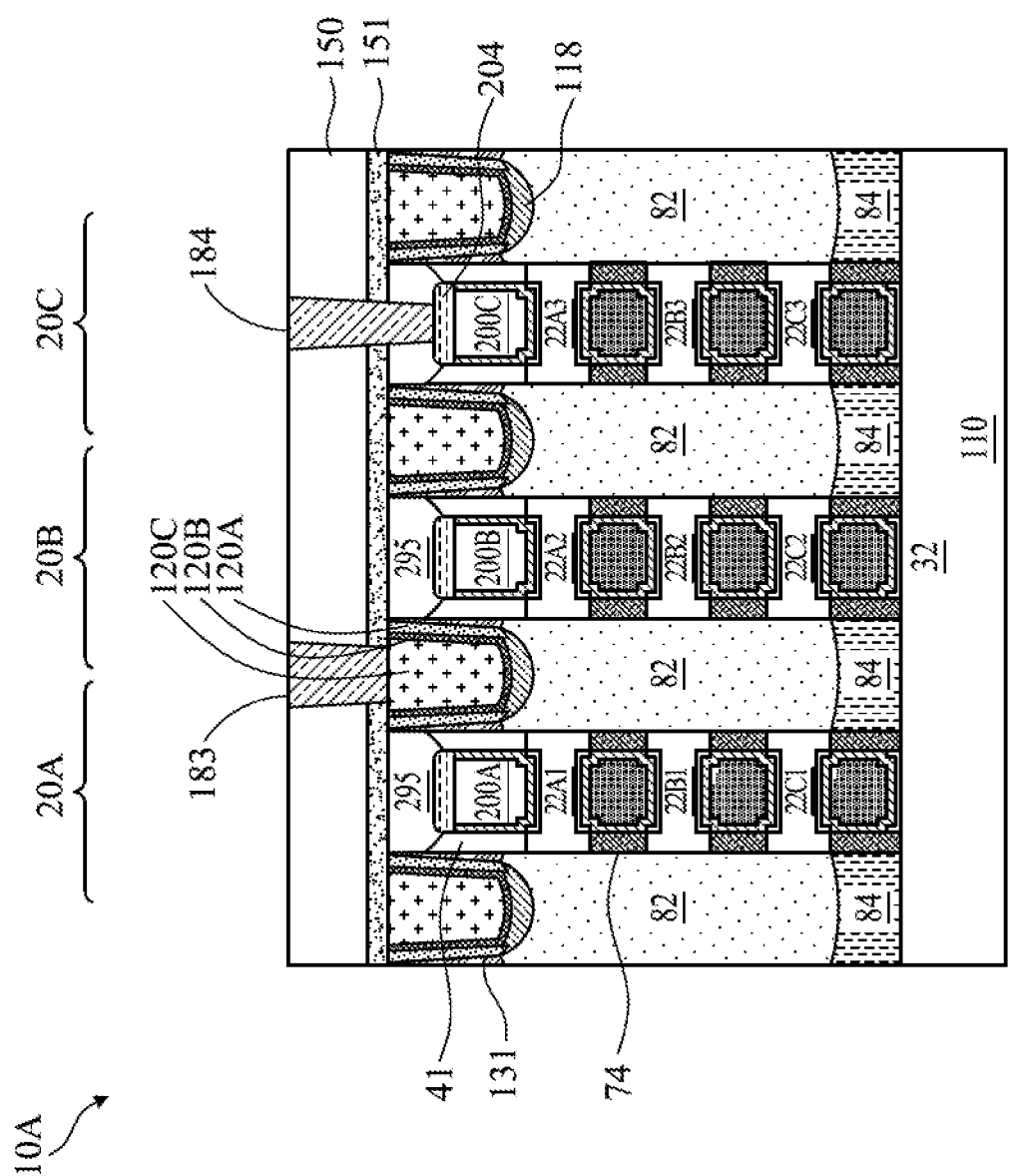
Figure 24C:
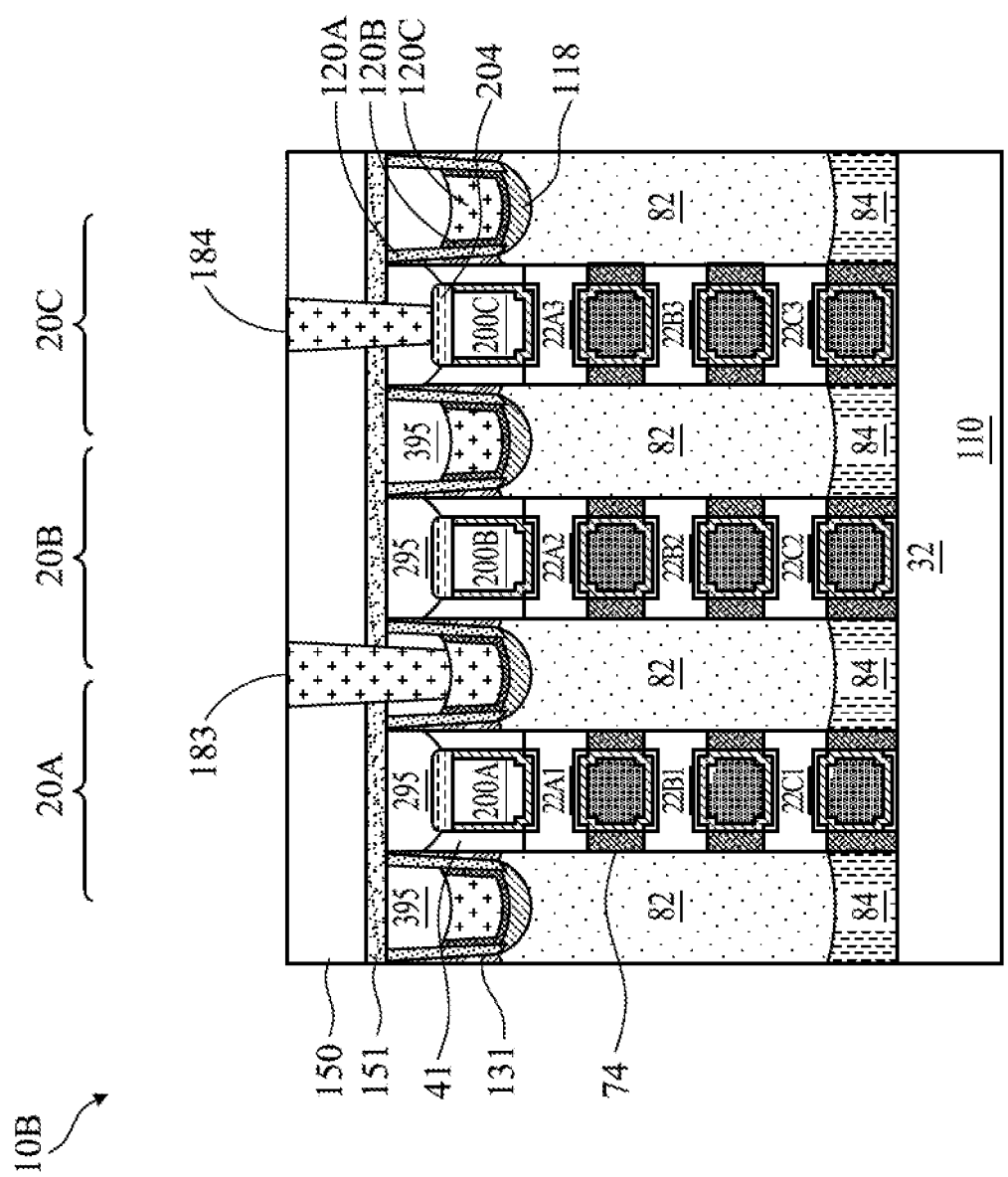

In FIGS. 24A-24C, excess material of the material layer deposited in FIGS. 23A-23C is removed by a suitable removal process, such as a CMP, mechanical grinding or the like. The removal process may recess the third ILD 150, as shown.

Figure 25A:
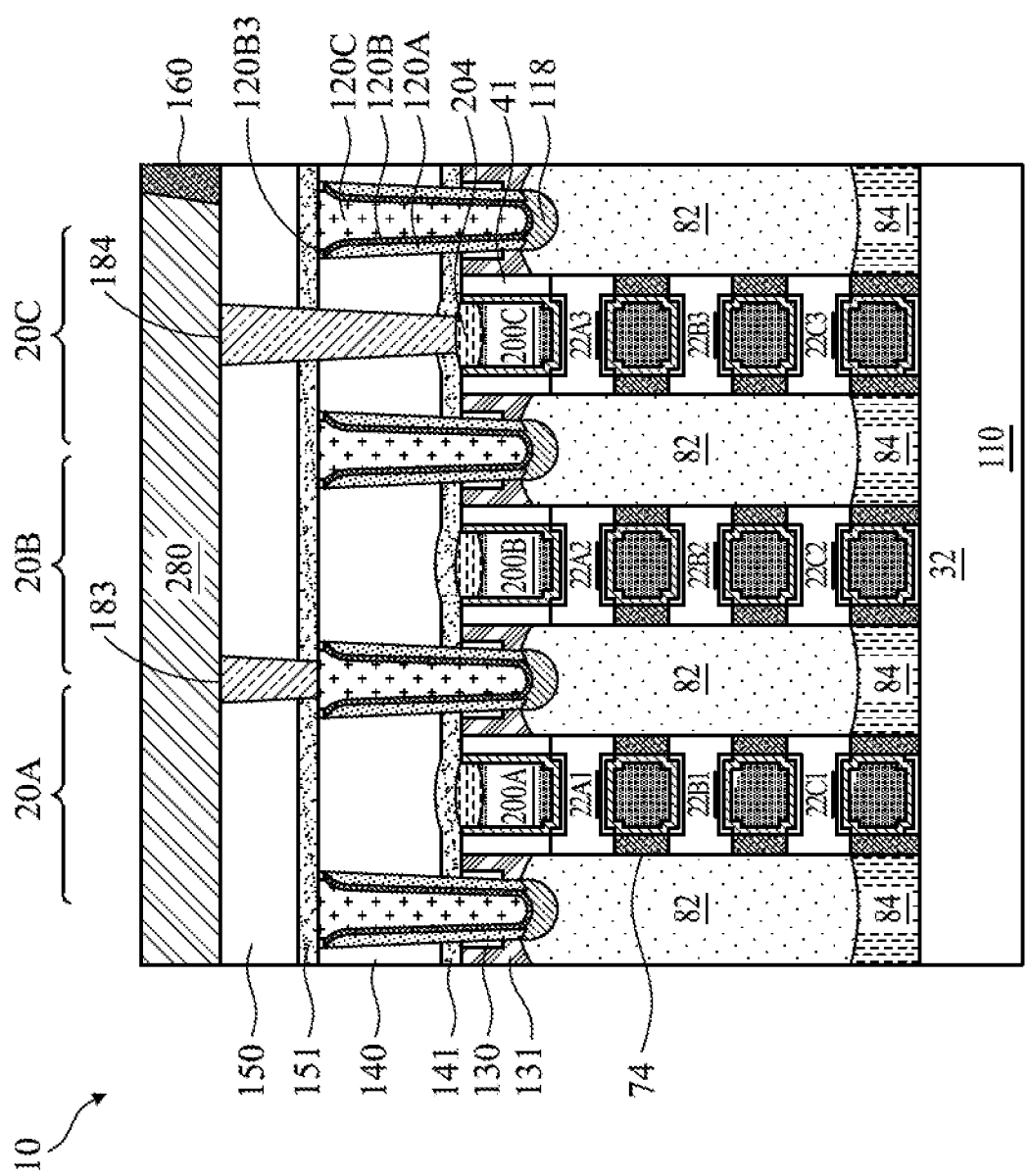
Figure 25B:
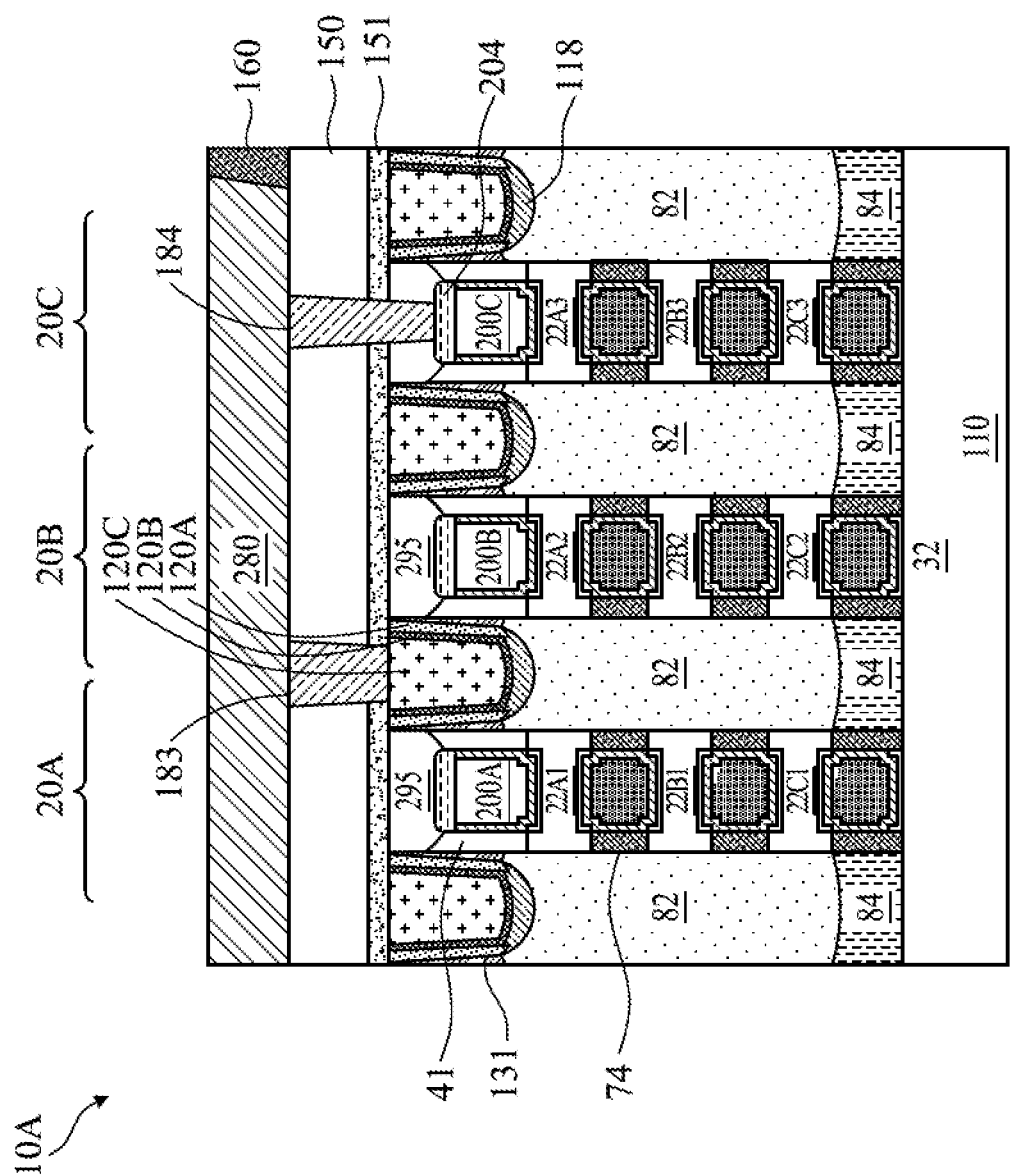
Figure 25C:
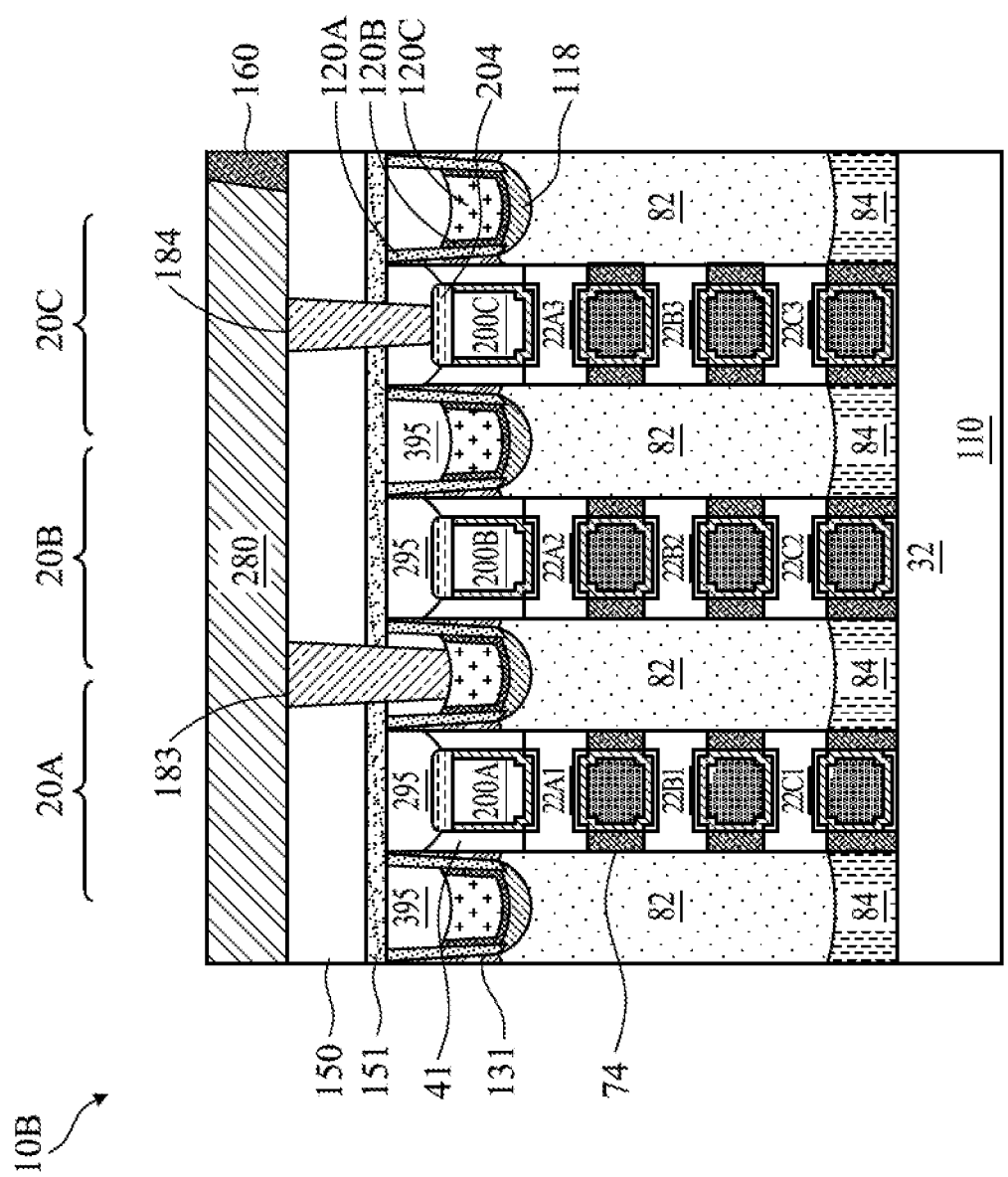

In FIGS. 25A-25C, an inter-metallization dielectric (IMD) layer 160 and metallization feature 280 are formed on the third ILD 150 and the source/drain and gate vias 183, 184. The IMD layer 160 may be formed by a suitable deposition operation, such as a CVD, ALD, PVD, or the like that deposits SiCN, SiO, SiCON, SiN, SiC, or other low-k dielectric material (e.g., k<3.9). The IMD layer 160 may be patterned to form openings, then the metallization feature 280 may be formed by depositing a material of the metallization feature 280 in one of the openings in the IMD layer 160. The metallization feature may be the same material as that of the source/drain and gate vias 183, 184. Using the single metal approach to form the source/drain vias 183, the gate vias 184 and the metallization feature 280, including a post-deposition anneal process, may create seam-free interfaces between the metallization feature 280 and the source/drain and gate vias 183, 184. Center voids can be removed by grain growth after the post-deposition anneal process.

Following formation of the IMD layer 160 and the metallization feature 280, further IMD layers and metallization features may be formed in a stack over the IMD layer 160 and the metallization feature 280 to form an interconnect structure.

FIGS. 26A-28C illustrate formation of a gate via 184 that connects to both the conductive layer 204 and an adjacent source/drain contact 120. In FIGS. 26A-28C, the source/drain via openings 35 are not shown. In some embodiments, one or more source/drain via openings 35 are formed prior to forming the gate via openings 37 of FIGS. 26A-26C.

Figure 26A:
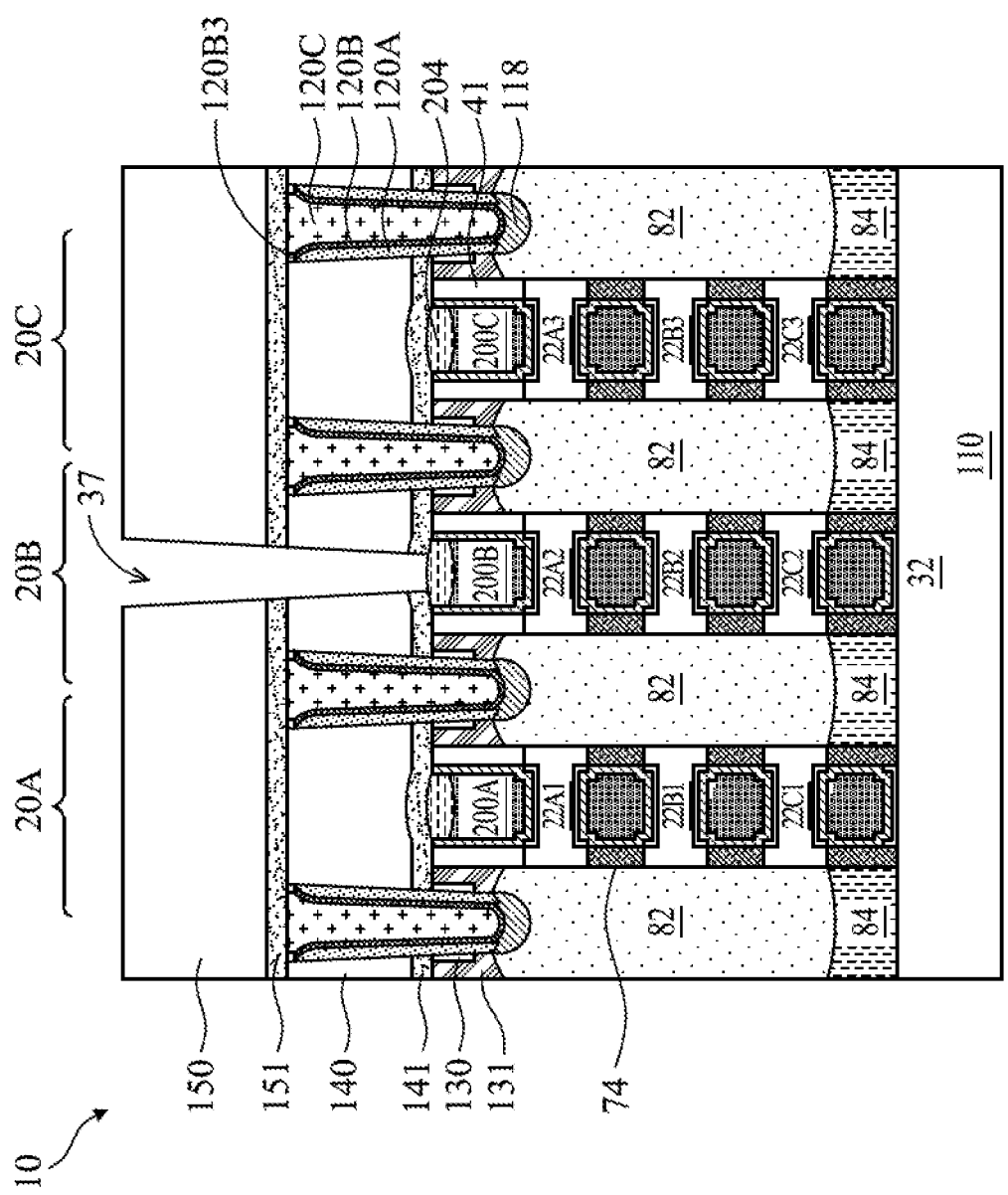
FIGS. 26A-28C are views of various embodiments of an IC device of at various stages of fabrication according to various aspects of the present disclosure.
Figure 26B:
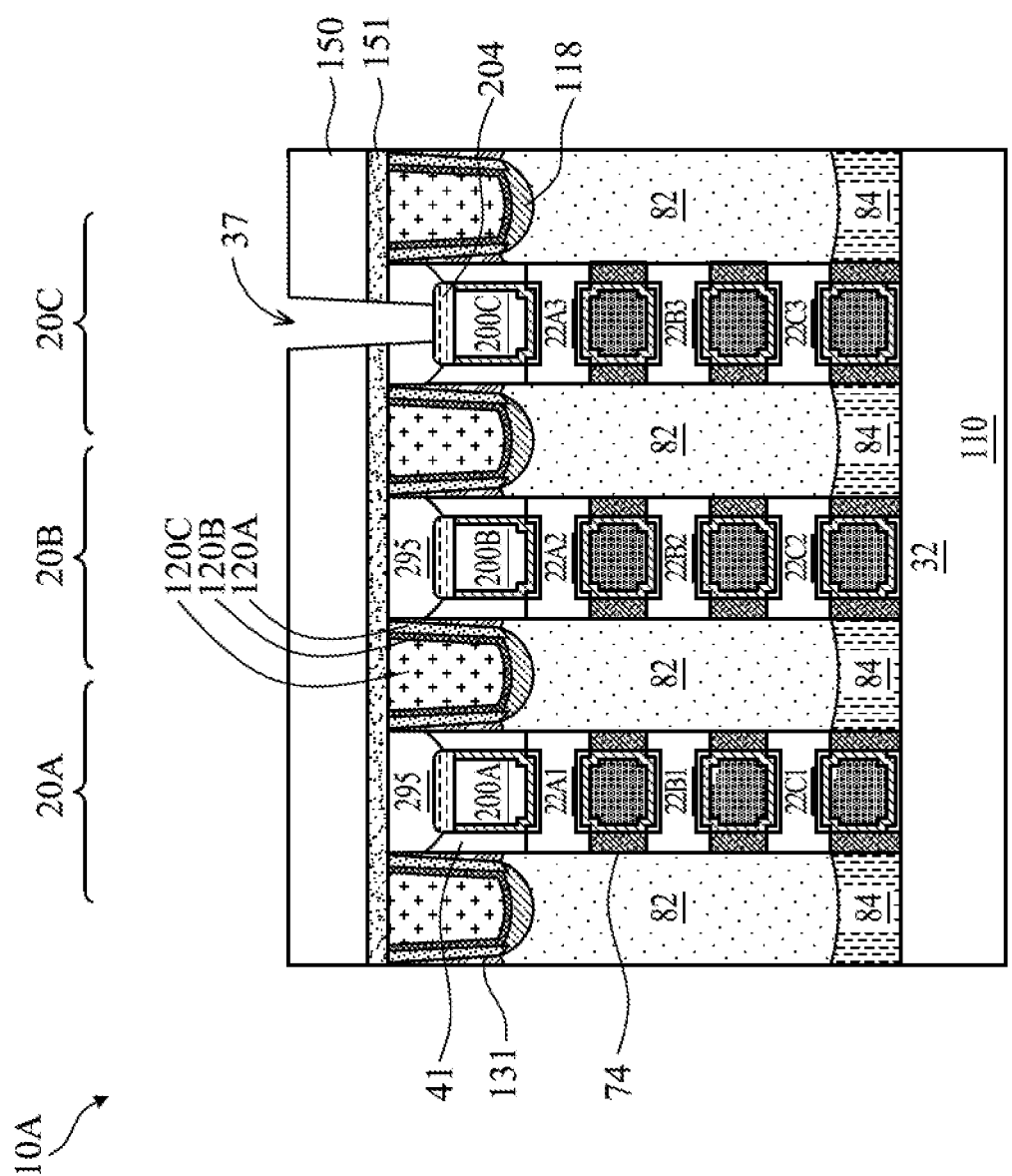
Figure 26C:
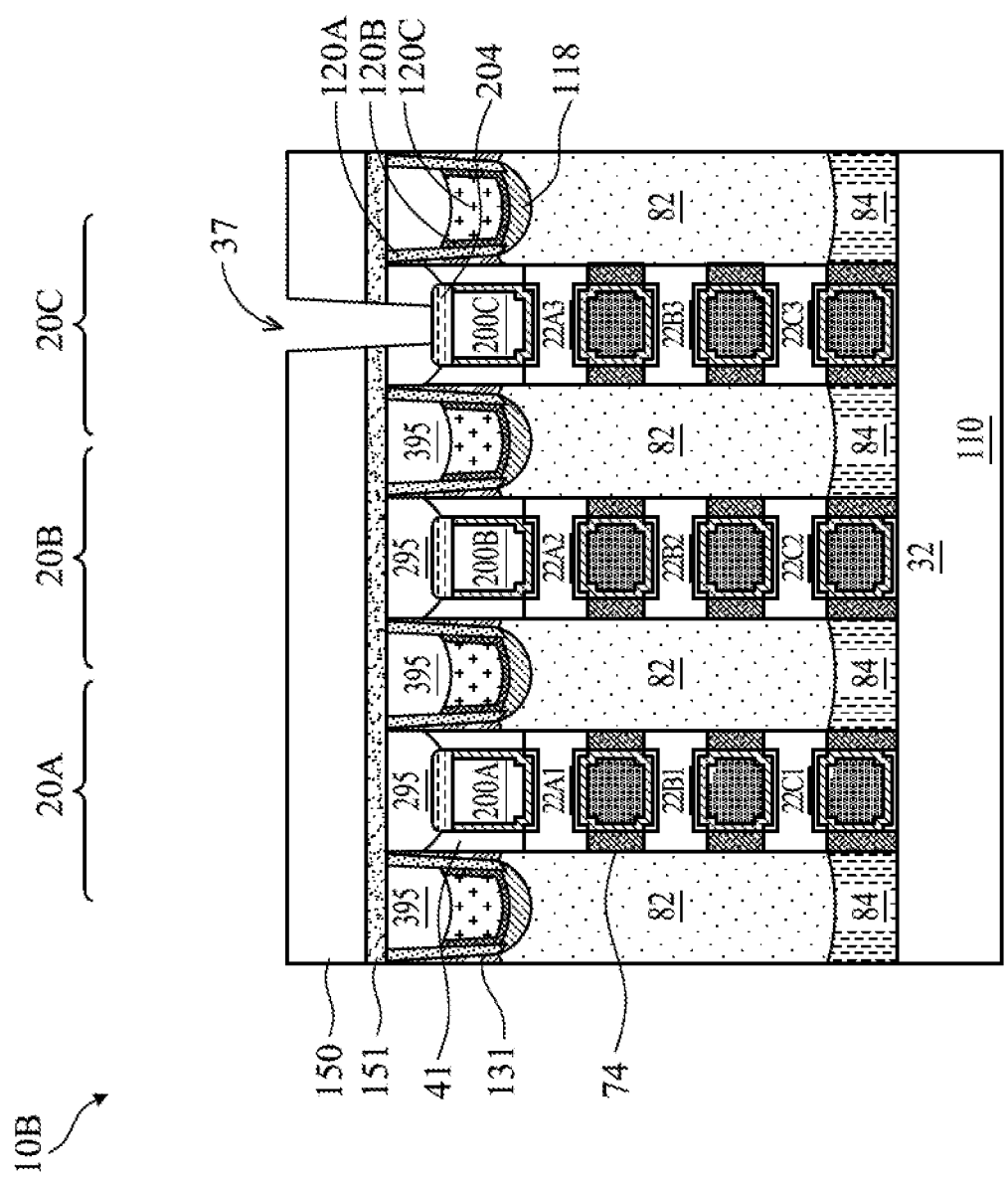

In FIGS. 26A-26C, gate via openings 37 are formed through the third ILD 150, the third ESL 151, the second ILD 140 and the second ESL 141 to expose the conductive layer 204 over one or more of the gate structures 200A-200C (e.g., the gate structure 200B, as shown in FIGS. 26A-26C). The gate via openings 37 may be formed in a manner similar to that described with reference to FIGS. 21A-22C.

Figure 27A:
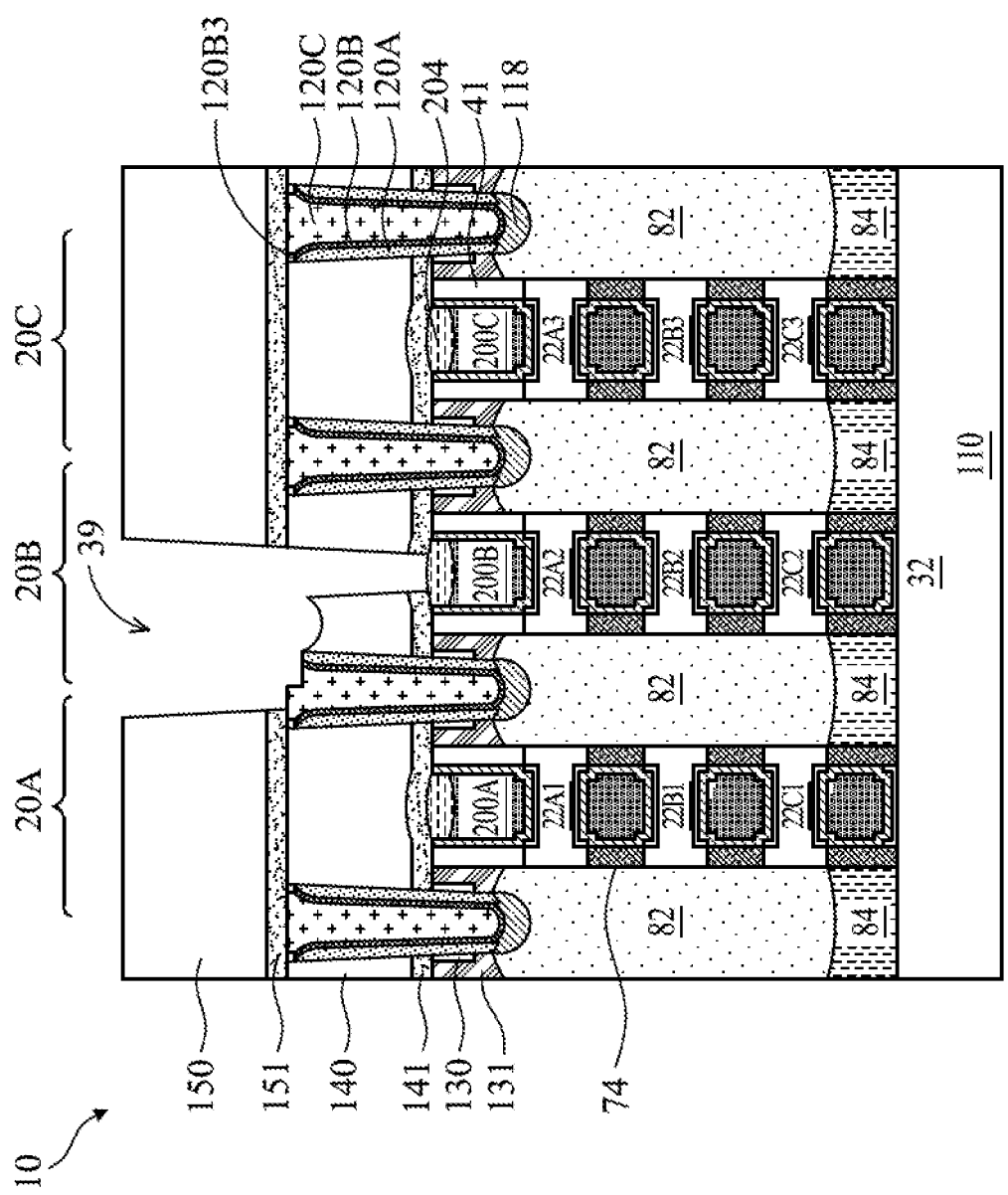
Figure 27B:
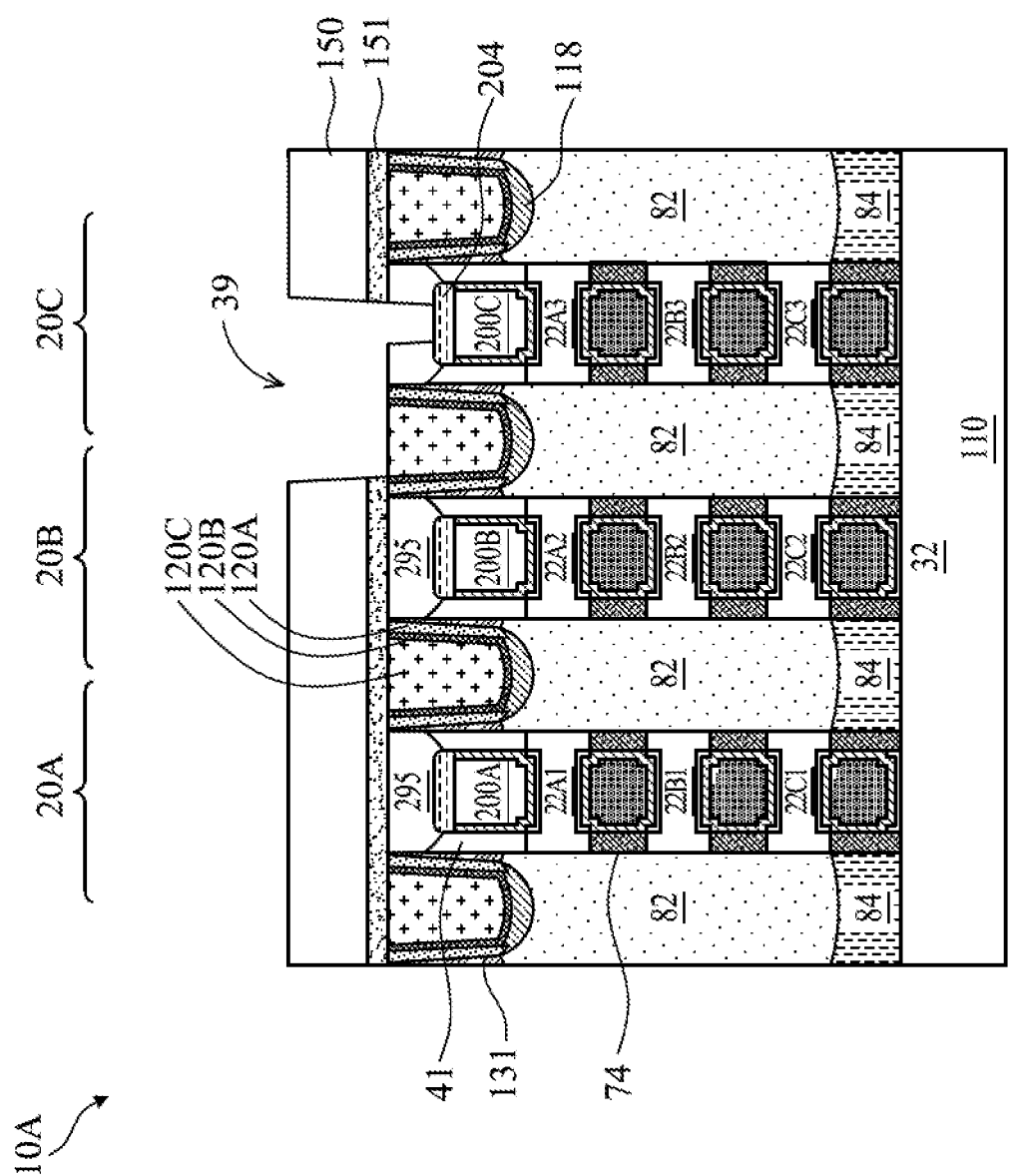
Figure 27C:
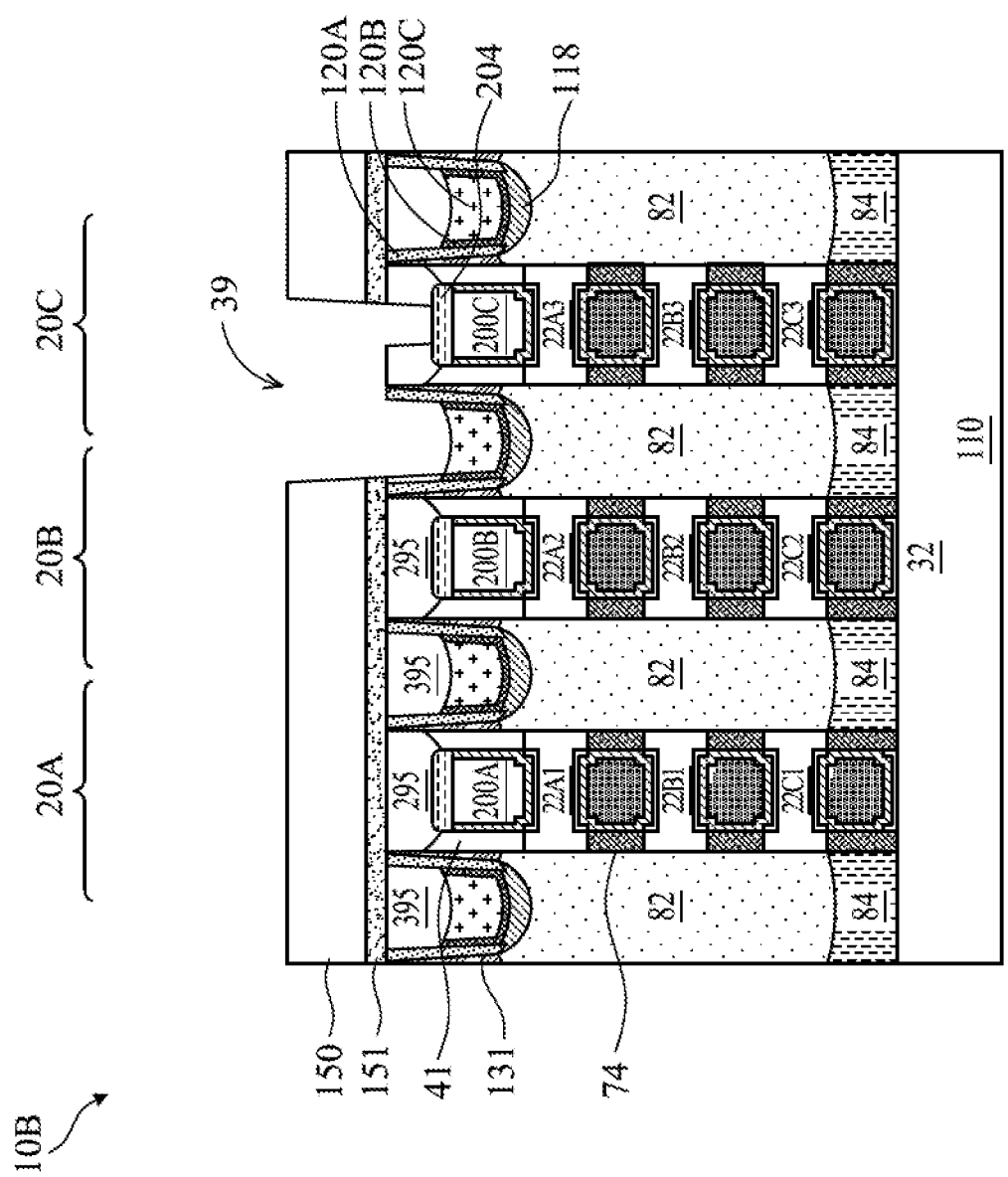

In FIGS. 27A-27C, the gate via openings 37 are expanded to form expanded gate via openings 39, as shown. In FIG. 27A, in the IC device 10 not including the gate capping layers 295 and the source/drain capping layers 395, the expanded gate via opening 39 is formed by removing portions of the third ILD and ESL 150, 151 over the source/drain contact 120. In some embodiments, the upper surface of the source/drain contact 120 is partially exposed by the expanded gate via opening 39, such that a portion of the upper surface is in contact with the third ESL 131 following formation of the expanded gate via opening 39. In some embodiments, the third ILD 150 is a different material than the second ILD 140, such that the second ILD 140 is not substantially removed during expanding of the gate via opening 37 to form the expanded gate via opening 39. Similarly, the third ESL 151 may be a different material than the second ESL 141 to prevent removal of the second ESL 141 during formation of the expanded gate via opening 39.

In FIG. 27B, portions of the third ILD and ESL 150, 151 may be removed to form the expanded gate via opening 39 exposing the source/drain contact 120. As shown, the gate capping layer 295 may not be removed during expanding of the gate via opening 37, for example, due to the gate capping layer 295 being a different material than that of the third ILD 150, the third ESL 151, or both.

In FIG. 27C, portions of the third ILD and ESL 150, 151 and a portion of the source/drain capping layer 395 may be removed to form the expanded gate via opening 39 exposing the source/drain contact 120. In some embodiments, the source/drain capping layer 395 is partially removed or fully removed. As shown in FIG. 27C, the expanded gate via opening 39 may include a first extension that extends through the gate capping layer 295, and a second extension that extends through the source/drain capping layer 395. The first and second extensions may be separated by a portion of the gate capping layer 295, the ESL 131, and the first liner layer 120A.

Figure 28A:
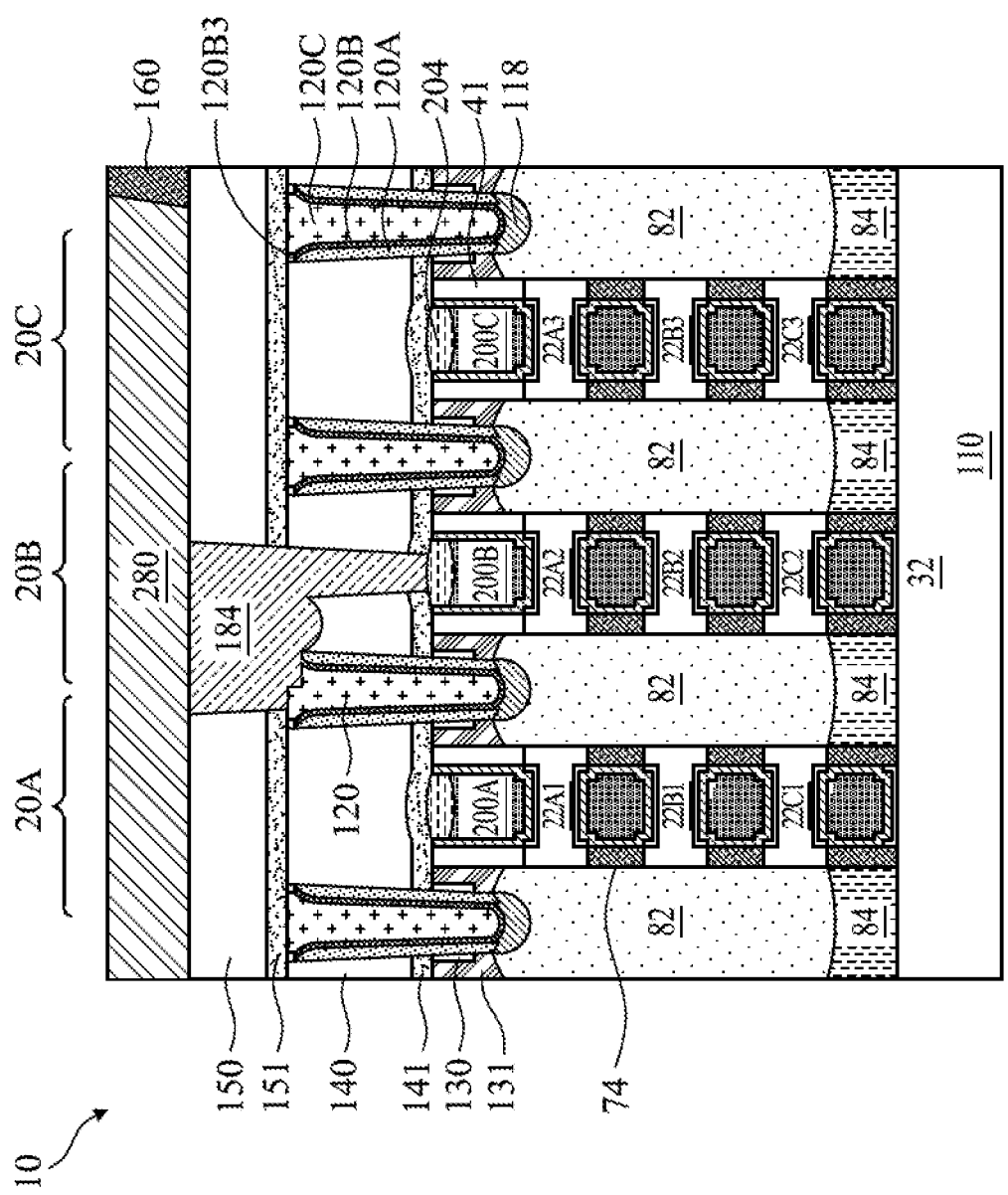
Figure 28B:
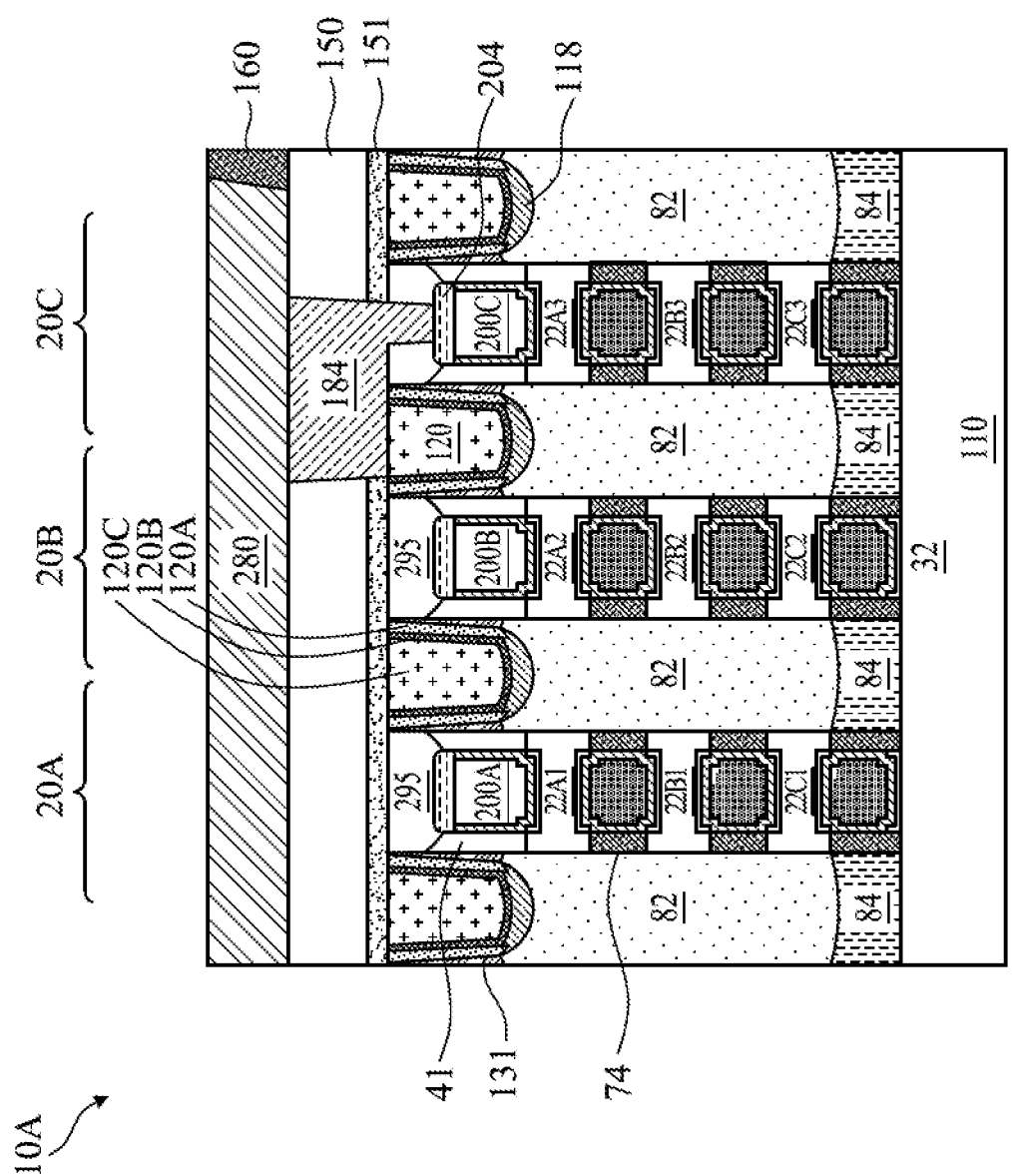
Figure 28C:
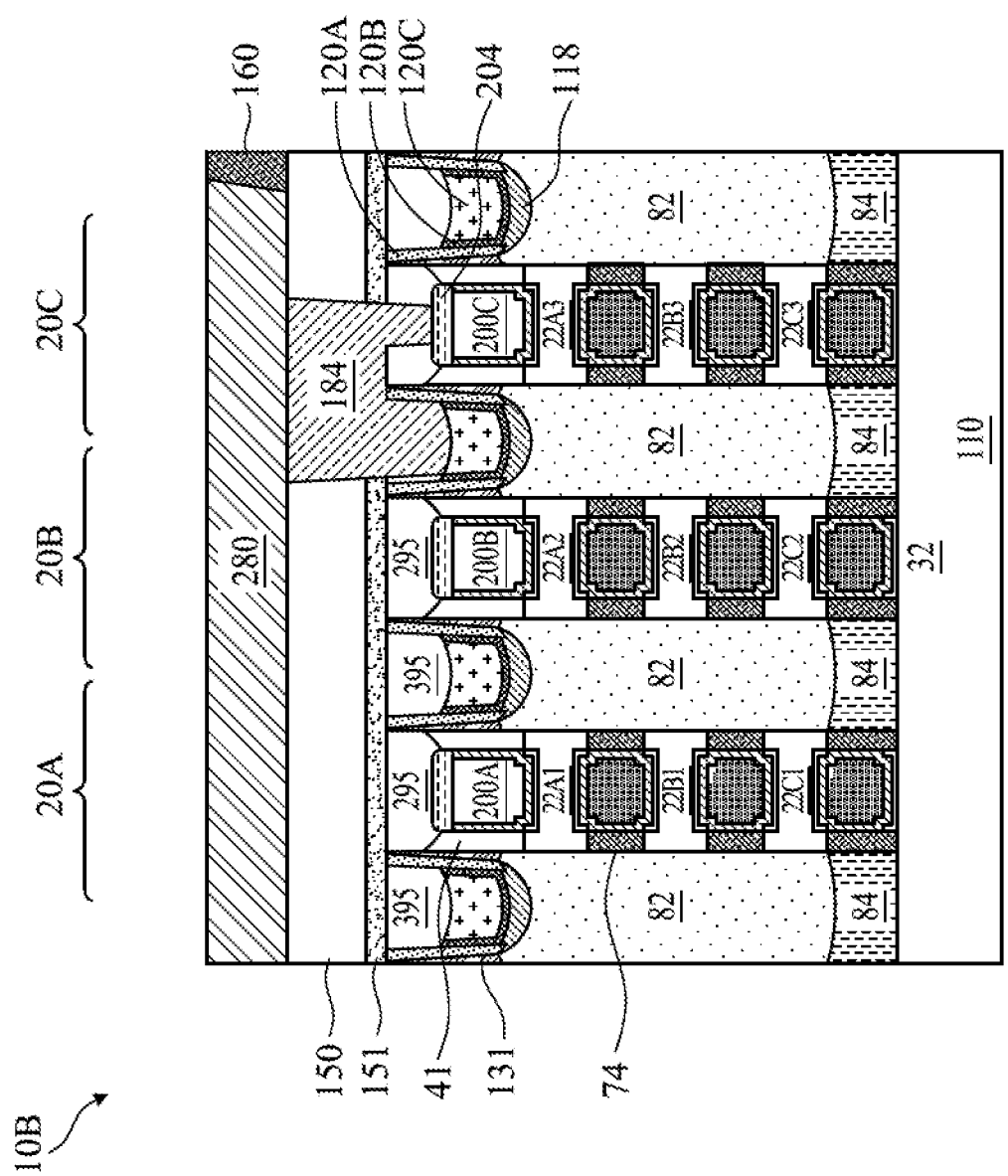

In FIGS. 28A-28C, expanded gate vias 184 and the metallization feature 280 are formed. Formation of the metallization feature 280 may be similar to that described with reference to FIGS. 25A-25C. The expanded gate vias 184 may be formed by depositing a metal layer in the expanded gate via openings 39 as described with reference to FIGS. 23A-24C. The expanded gate vias 184 may substantially adopt the shape of the expanded gate via openings 39.

Figure 29A:
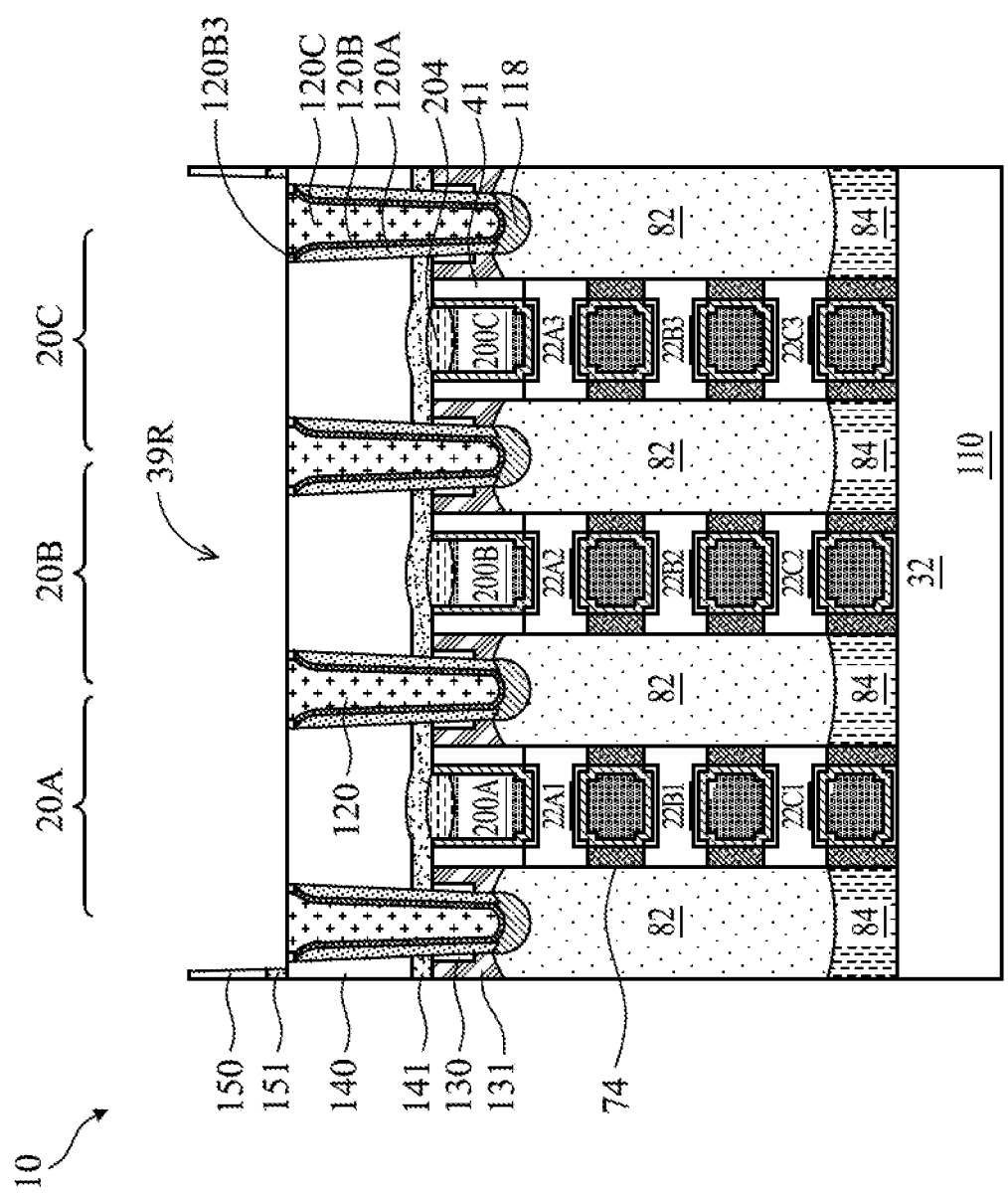
FIGS. 29A-30C are views of various embodiments of an IC device of at various stages of fabrication according to various aspects of the present disclosure.
Figure 29B:
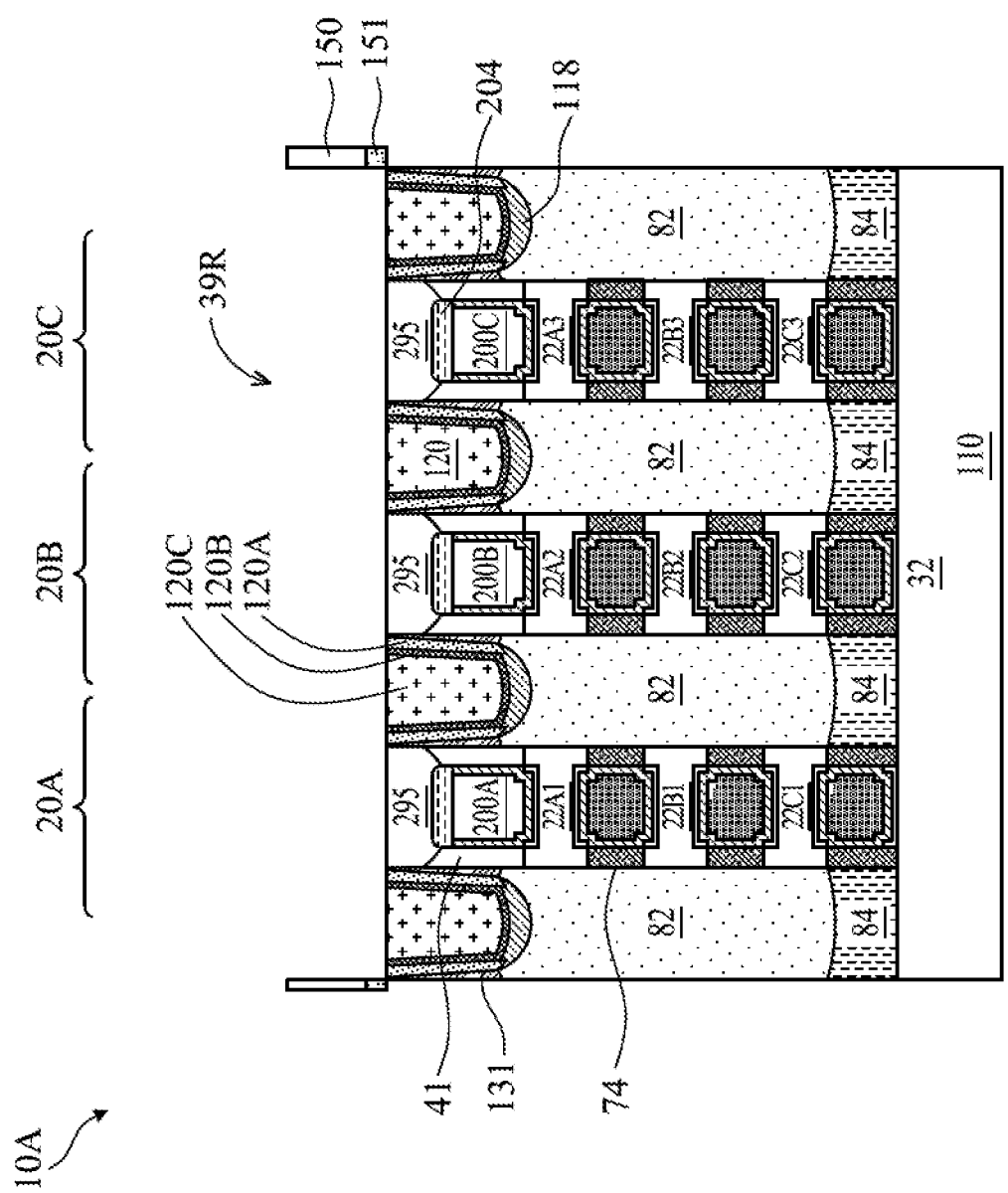
Figure 29C:
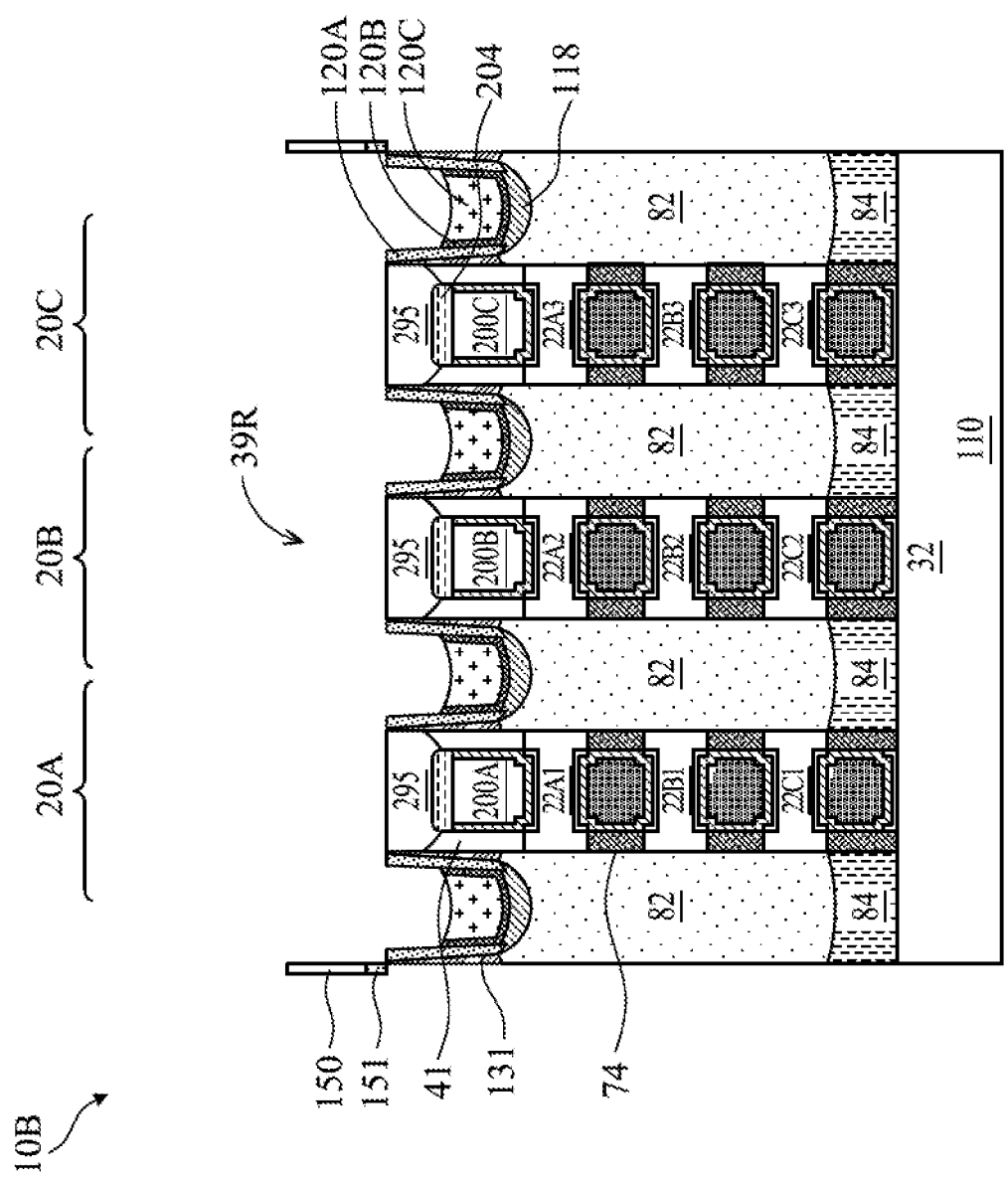

FIGS. 29A-30C illustrate formation of a source/drain common via 183R. The source/drain common via 183R couples two or more of the source/drain contacts 120 to each other. Following formation of the third ILD and ESL 150, 151, a common opening 39R may be formed in the third ILD and ESL 150, 151 that exposes upper surfaces of the source/drain contacts 120. As shown in FIGS. 29A and 29B, the upper surfaces of the source/drain contacts 120 and the second ILD 140 or the gate capping layers 295 may be substantially coplanar after forming the common opening 39R. In FIG. 29C, the following removal of the portions of the third ILD and ESL 150, 151, the source/drain capping layers 395 are removed either partially or fully to expose the upper surfaces of the source/drain contacts 120. In some embodiments, in FIG. 29C, following removal of the source/drain capping layers 395, upper portions of sidewalls of the first liner layer 120A are exposed in the common opening 39R.

In FIGS. 30A-30C, the source/drain common via 183R and the metallization feature 280 are formed. The metallization feature 280 may be deposited in the common opening 39R by a deposition process (e.g., a CVD) similar to that described with reference to FIGS. 19A-20C. The source/drain common via 183R may adopt the shape of the common opening 39R. In FIG. 30C, the source/drain common via 183R may include extension portions that extend into regions previously occupied by the source/drain capping layers 395, as shown.

Embodiments may provide advantages. By forming the source/drain contacts 120, the gate via 184, the source/drain via 183, and optionally the metallization feature 280 of the same material, and applying post-deposition anneals, the source/drain contacts 120, the gate via 184, the source/drain via 183, and optionally the metallization feature 280 may be formed substantially free of seams, and contact resistance may be reduced. Voids are effectively removed by grain growth after the post-deposition anneal. Using the same material reduces process complexity due to reducing number of different tools and chambers used to deposit the material, and also allows for omission of a process step in which the second liner layer 120B used to form the silicide regions 118 is removed to expand the opening 33 to improve fill window of the core layer 120C.

In accordance with at least one embodiment, a method includes: forming a stack of nanostructure channels over a substrate; forming a gate structure wrapping around the stack; forming a source/drain region on the substrate; forming an opening exposing the source/drain region; forming a silicide region in the source/drain region by a first annealing operation; forming a core layer in the opening on the silicide region by depositing a metal in the opening, and annealing the metal by a second annealing operation; and forming a source/drain via over and contacting the core layer, a material of the source/drain via being the same as that of the core layer.

In accordance with at least one embodiment, a method includes: forming a stack of nanostructure channels over a substrate; forming a gate structure wrapping around the stack; forming a source/drain region in contact with the nanostructure channels; and forming a source/drain contact in contact with the source/drain region, which includes: forming a first liner layer; forming a second liner layer on the first liner layer and the source/drain region; forming a silicide region by annealing the second liner layer; depositing a metal on the second liner layer by a chemical vapor deposition; and forming a core layer by annealing the metal. The method further includes forming a via contacting the source/drain contact, the via including the metal.

In accordance with at least one embodiment, a device includes a substrate, a vertical stack of nanostructure channels over the substrate, a gate structure wrapping around the nanostructure channels, and a source/drain region on the substrate. The device further includes a source/drain contact in contact with the source/drain region. The source/drain contact includes a core layer of a first material. A source/drain via is over and in contact with the source/drain contact. The source/drain via is the first material. A gate via is over and in electrical connection with the gate structure. The gate via is the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method comprising:
forming a stack of nanostructure channels over a substrate;
forming a gate structure wrapping around the stack;
forming a source/drain region on the substrate;
forming an opening exposing the source/drain region;
forming a silicide region in the source/drain region by a first annealing operation;
forming a core layer in the opening on the silicide region by depositing a metal in the opening, and annealing the metal by a second annealing operation; and
forming a source/drain via over and contacting the core layer, a material of the source/drain via being the same as that of the core layer.

2. The method of claim 1, wherein the forming a silicide region includes:
forming a first metal layer in the opening and contacting the source/drain region; and
annealing the first metal layer by the first annealing operation.

3. The method of claim 2, further comprising:
forming a first liner layer in the opening;

exposing the source/drain region by removing material of the first liner layer at a bottom of the opening;
wherein the first metal layer is formed on sidewalls of the first liner layer.

4. The method of claim 3, wherein:
the first liner layer is formed on sidewalls of a second interlayer dielectric overlying the gate structure and the source/drain region; and
the first metal layer is formed on the first liner layer and on the sidewalls and a top of the second interlayer dielectric.

5. The method of claim 4, further comprising:
planarizing an upper surface of the core layer; and
forming a second etch stop layer on the core layer, the second interlayer dielectric, and a portion of the first metal layer on the sidewall of the second interlayer dielectric.

6. The method of claim 1, further comprising:
forming a conductive layer on the gate structure;
forming a gate capping structure on the conductive layer; and
forming a gate via that extends through the gate capping structure and is in contact with the conductive layer, the gate via and the source/drain via being formed by a same deposition operation.

7. A method comprising:
forming, over a substrate, a vertical stack of nanostructure channels, a gate structure wrapping around the stack, and a conductive layer on an upper surface of the gate structure;
forming a source/drain region laterally adjacent the gate structure;
etching a contact opening that exposes the source/drain region;
conformally depositing a first liner on sidewalls of the contact opening;
depositing a second liner of a metal precursor on the first liner and on the exposed source/drain region;
annealing to convert the second liner to a silicide region;
continuing deposition of the same metal until the contact opening is filled with a core layer of the metal;
planarizing the core layer;
depositing a second etch-stop layer;
depositing a second ILD over the second etch-stop layer;
etching a source/drain-via opening terminating on the core layer and a gate-via opening terminating on the conductive layer; and
filling the source/drain via opening and the gate via opening with the same metal; and
annealing so that the core layer and both vias form a continuous, seam-free metal structure.

8. The method of claim 7, wherein the silicide region comprises TiSi, TiNiSi, WSi, or CoSi.

9. The method of claim 7, wherein the first liner is SiN, SiCN, SiOCN, or SiOC.

10. The method of claim 7, wherein the first liner is deposited on sidewalls of dielectric layers defining the contact opening.

11. The method of claim 7, further comprising depositing a gate-capping dielectric over the conductive layer before depositing the second ILD.

12. The method of claim 7, wherein the source/drain contact has an aspect ratio between 1 and 8.

13. The method of claim 7, wherein the annealing is performed at 200-450° C. for one to ten minutes.

14. A method comprising:
forming a stack of nanostructure channels over a substrate;
forming a gate structure wrapping around the stack;
forming a source/drain region on the substrate;
forming a contact opening exposing the source/drain region;
forming a silicide region in the source/drain region by a first annealing operation;
forming a core layer in the opening on the silicide region by depositing a metal in the opening, and annealing the metal by a second annealing operation;
forming a source/drain via over and contacting the core layer, a material of the source/drain via being the same as that of the core layer; and
annealing so that the core layer and the source/drain via form a continuous, seam-free metal structure.

15. The method of claim 14, wherein the contact opening has an aspect ratio between 1 and 8.

16. The method of claim 14, wherein the first annealing operation is performed at 200° C. to 450° C. for one to ten minutes.

17. The method of claim 14, further comprising conformally depositing a first liner on sidewalls of the contact opening before depositing the metal.

18. The method of claim 17, wherein the first liner comprises SiN, SiCN, SiOCN, or SiOC.

19. The method of claim 14, wherein the silicide region comprises TiSi, TiNiSi, WSi, or CoSi.

20. The method of claim 14, further comprising:
forming a conductive layer on the gate structure;
forming a gate capping structure on the conductive layer; and
forming a gate via that extends through the gate capping structure and is in contact with the conductive layer, the gate via and the source/drain via being formed by a same deposition operation.

* * * * *